US00RE42670E

(19) United States
(12) Reissued Patent
Park et al.

(10) Patent Number: US RE42,670 E
(45) Date of Reissued Patent: Sep. 6, 2011

(54) THIN FILM TRANSISTOR ARRAY SUBSTRATE FOR A LIQUID CRYSTAL DISPLAY

(75) Inventors: Woon-Yong Park, Kyungki-do (KR); Jong-Soo Yoon, Choongcheongnam-do (KR); Chang-Oh Jeong, Kyungki-do (KR)

(73) Assignee: Samsung Electronics Co., Ltd., Suwon-Si (KR)

( * ) Notice: This patent is subject to a terminal disclaimer.

(21) Appl. No.: 11/827,989

(22) Filed: Jul. 13, 2007

Related U.S. Patent Documents

Reissue of:

(64) Patent No.: 6,380,559
Issued: Apr. 30, 2002
Appl. No.: 09/585,427
Filed: Jun. 2, 2000

U.S. Applications:

(63) Continuation of application No. 10/749,153, filed on Dec. 31, 2003, now Pat. No. Re. 40,162.

(30) Foreign Application Priority Data

| | | |
|---|---|---|
| Jun. 3, 1999 | (KR) | 99-20515 |
| Jul. 6, 1999 | (KR) | 99-27140 |
| Jul. 8, 1999 | (KR) | 99-27548 |
| Jul. 22, 1999 | (KR) | 99-29796 |

(51) Int. Cl.
*H01L 29/04* (2006.01)

(52) U.S. Cl. ..... 257/59; 257/72; 257/E27.131; 349/106; 349/143; 349/158

(58) Field of Classification Search ..... 257/59, 257/72, E27.131; 349/106, 139, 143, 158
See application file for complete search history.

(56) References Cited

U.S. PATENT DOCUMENTS

| | | | | |
|---|---|---|---|---|
| 6,057,896 | A * | 5/2000 | Rho et al. | 349/42 |
| 6,087,678 | A * | 7/2000 | Kim | 257/59 |
| RE40,162 | E * | 3/2008 | Park et al. | 257/59 |

FOREIGN PATENT DOCUMENTS

| | | |
|---|---|---|
| JP | 09-127707 | 5/1997 |
| JP | 10-163174 | 6/1998 |
| JP | 2000-066240 | 3/2000 |
| JP | 2000-206571 | 7/2000 |

* cited by examiner

*Primary Examiner* — Minh-Loan T Tran
(74) *Attorney, Agent, or Firm* — F. Chau & Associates, LLC.

(57) ABSTRACT

A thin film transistor substrate for a liquid crystal display includes an insulating substrate, and a gate line assembly formed on the substrate. The gate line assembly has a double-layered structure with a lower layer exhibiting good contact characteristics with respect to indium tin oxide, and an upper layer exhibiting low resistance characteristics. A gate insulating layer, a semiconductor layer, a contact layer, and first and second data line layers are sequentially deposited onto the substrate with the gate line assembly. The first and second data line layers are patterned to form a data line assembly, and the contact layer is etched through the pattern of the data line assembly such that the contact layer has the same pattern as the data line assembly. A passivation layer is deposited onto the data line assembly, and a photoresist pattern is formed on the passivation layer by using a mask of different light transmissties mainly at a display area and a peripheral area. The passivation layer and the underlying layers are etched through the photoresist pattern to form a semiconductor pattern and contact windows. A pixel electrode, a supplemental gate pad and a supplemental data pad are then formed of indium tin oxide or indium zinc oxide. The gate and data line assemblies may be formed with a single layered structure. A black matrix and a color filter may be formed at the structured substrate before forming the pixel electrode, and an opening portion may be formed between the pixel electrode and the data line to prevent possible short circuits.

4 Claims, 74 Drawing Sheets

THIN FILM TRANSISTOR ARRAY SUBSTRATE FOR A LIQUID CRYSTAL DISPLAY

Matter enclosed in heavy brackets [ ] appears in the original patent but forms no part of this reissue specification; matter printed in italics indicates the additions made by reissue.

*CROSS-REFERENCE TO RELATED APPLICATIONS*

*This is a continuation reissue application of co-pending U.S. Reissue application Ser. No. 10/749,153 filed on Dec. 31, 2003, now U.S. Pat. No. RE40,162 based upon U.S. Pat. No. 6,380,559, issued on Apr. 30, 2002, which claims priority to Korean Patent Application Nos. 99-20515 filed on Jun. 3, 1999, 99-27140 filed on Jul. 6, 1999, 99-27548 filed on Jul. 8, 1999 and 99-29796 filed on Jul. 22, 1999, the disclosures of which are incorporated by reference herein in their entirety.*

BACKGROUND OF THE INVENTION (a) Field of the Invention

The present invention relates to a thin film transistor array (TFT) substrate for a liquid crystal display and a method for fabricating the same, and more particularly, to a method for fabricating a TFT array substrate of good performance in processing steps.

(b) Description of the Related Art

Generally, a liquid crystal display (LCD) is formed with two glass substrates, and a liquid crystal layer sandwiched between the substrates.

One of the substrates has a common electrode, a color filter and a black matrix, and the other substrate has pixel electrodes and thin film transistors (TFTs). The former substrate is usually called the "color filter substrate," and the latter substrate is usually called the "TFT array substrate."

The TFT array substrate is fabricated by forming a plurality of thin films on a glass substrate, and performing photolithography with respect to the thin films. In photolithography, many masks should be used for uniformly etching the thin films, and this involves complicated processing steps and increased production cost. Therefore, the number of masks becomes a critical factor in the fabrication efficiency of the TFT array substrate.

Furthermore, contact windows tend to be over-etched during the TFT formation, causing contact failure. Thus, it is required that stable and rigid contact between the desired electrodes should be ensured in the device fabrication.

On the other hand, the black matrix provided at the color filter substrate should be formed with a certain width considering the alignment margin for the color filter substrate joining the TFT array substrate. However, the larger black matrix reduces the aperture ratio. Therefore, the opening ratio of the black matrix should be also considered in fabricating the TFT array substrate.

SUMMARY OF THE INVENTION

It is an object of the present invention to provide a TFT array substrate for a liquid crystal display of good performance, and a method for fabricating the same with a reduced number of masks.

It is another object of the present invention to provide a method for fabricating a TFT array substrate that ensures suitable contacts between the electrode components.

It is still another object of the present invention to provide a method for fabricating a TFT array substrate with a suitable opening ratio.

These and other objects may be achieved by a TFT array substrate including a gate line assembly with gate lines proceeding in the horizontal direction, gate electrodes branched from the gate lines, and gate pads connected to end portions of the gate lines to receive scanning signals from the outside and transmit them to the gate lines. The gate line assembly may be formed with a single, double or triple layered structure. When the gate line assembly is formed with a double or triple layered structure, one layer is formed with a low resistance material while the other layer is formed with a material having good contact characteristics.

The gate line assembly is overlaid sequentially with a gate insulating layer, semiconductor patterns, and ohmic contact patterns.

A data line assembly is formed on the ohmic contact patterns with data lines proceeding in the vertical direction, data pads connected to end portions of the data lines to receive picture signals from the outside, and source electrodes branched from the data lines. The data line assembly further includes drain electrodes for the TFTs, and conductive patterns for the storage capacitors. The drain electrode is positioned opposite to the source electrode With respect to the gate electrode while being separated from the source electrode. The conductive pattern is positioned above the gate line while overlapping the same. The conductive pattern is connected to a pixel electrode to form a storage capacitor. However, in case the overlapping of the pixel electrode and the gate line can give a sufficient amount of storage capacity, the conductive pattern may be omitted. The data line assembly may have a single, double or triple layered structure.

The semiconductor patterns have a shape similar to that of the data line assembly and the underlying ohmic contact patterns. The semiconductor layer extends to the peripheral portion of the substrate while covering the latter.

A passivation layer covers the data line, the data pad, the source electrode, the drain electrode, the semiconductor pattern, and the overlapping portions between the gate line and the data line.

Contact windows are formed at the passivation layer while exposing the drain electrode and the data pad. The contact window exposing the drain electrode may be extended toward the pixel area such that it can expose the borderline of the drain electrode completely. Another contact window is formed at the passivation layer while passing through the semiconductor pattern and the gate insulating layer to expose the gate pad to the outside.

The pixel electrode is formed on the gate insulating layer at the pixel area defined by the neighboring gate and data lines. The pixel electrode is electro-physically connected to the drain electrode through the contact window such that it receives picture signals from the TFT while making the required electrical field in association with a common electrode. The pixel electrode is extended over the conductive pattern, and electro-physically connected to the latter such that it serves as a storage capacitor together with the conductive pattern and the gate line.

A subsidiary gate pad and a subsidiary data pad are formed on the gate pad and the data pad, respectively. The subsidiary gate and data pads are formed together with the pixel electrode with the same material, and contact the gate and data pads, respectively.

An opening portion may be formed between the pixel electrode and the data line to prevent a possible short circuit thereof.

According to one aspect of the present invention, the steps of fabricating the TFT array substrate may be performed as follows.

A gate line assembly is first formed on a substrate by using a first mask. Then a gate insulating layer, a semiconductor layer, a contact layer, and first and second metal data line layers are deposited onto the substrate with the gate line assembly in a sequential manner. A data line assembly with a predetermined pattern is formed through etching the first and second metal data line layers by using a second mask. The contact layer is etched through the pattern of the data line assembly such that the contact layer has the same pattern as the data line assembly.

A passivation layer is then deposited onto the structured substrate such that the passivation layer covers the semiconductor layer and the data line assembly. A photoresist film is coated onto the passivation layer, and exposed to light by using a third mask. The photoresist film is then developed to thereby form a photoresist pattern partially differentiated in thickness.

A semiconductor pattern is formed by etching the passivation layer and the underlying semiconductor layer at the pixel area through the photoresist pattern. First and second contact windows are formed by etching the passivation layer and the underlying second layers of the drain electrode and the data pad. The third contact window is formed by etching the passivation layer and the underlying semiconductor layer and gate insulating layer, and the second layer of the gate pad.

After the photoresist pattern is removed, a pixel electrode is formed by using a fourth mask such that the pixel electrode is connected to the drain electrode through the first contact window.

The second metal gate or data line layer may be formed with aluminum or aluminum alloy, and the first layer with chrome, molybdenum, or molybdenum alloy. Subsidiary gate and data pads may be formed during the step of forming the pixel electrode such that they are connected to the first layers of the gate and data pads through the second and third contact windows. The pixel electrode as well as the subsidiary gate and data pads may be formed with indium tin oxide or indium zinc oxide.

The etching with respect to the second layers of the drain electrode, the gate pad and the data pad may be performed by using a wet-etching technique or a dry-etching technique.

The step of exposing the passivation layer positioned over the drain electrode and at the pixel area may be performed by removing the photoresist film over the passivation layer through oxygen-based ashing.

The third mask for forming the photoresist pattern may be provided with a transparent substrate, a first layer formed on the transparent substrate, and a second layer formed on the transparent substrate while overlapping with the first layer. The first layer has a light transmissivity lower than the transparent substrate, and the second layer has a light transmissivity different from those of the substrate and the first layer. The transparent substrate is established to have a first portion without the first and second layers, a second portion with only the first layer, and a third portion with both the first and second layers.

The transparent substrate has a light transmissivity of 90%, the first layer has a light transmissivity of 20-40%, and the second layer has a light transmissivity of 3% or less. The first and second layers may have a light transmissivity control pattern of slits or mosaics.

According to another aspect of the present invention, a black matrix and a color filter are formed on the structured substrate before the step of forming the pixel electrode.

After the semiconductor layer is etched to form a semiconductor pattern and the remaining photoresist film is removed, an organic black matrix layer is deposited onto the substrate, and etched through a fourth mask to thereby form a black matrix pattern. Alternatively, a black photoresist film may be used to form such a black matrix pattern.

A color filter is formed at the pixel area between the neighboring data lines, and at that point the formation of the pixel electrode and subsidiary gate and data pads is complete.

According to still another aspect of the present invention, the formation of the passivation layer is deferred after the formation of the semiconductor pattern.

A gate line assembly is first formed at the substrate by using a first mask. A gate insulating layer, a semiconductor layer, an ohmic contact layer, and a metal data line layer are then sequentially deposited onto the substrate. The metal data line layer, the ohmic contact layer and the semiconductor layer are etched through a second mask to thereby form the desired patterns with similar outlines except that the semiconductor pattern is present at the channel region between the source and drain electrodes.

A passivation layer is deposited onto the substrate 10 with the data line assembly, and etched through a third mask to thereby form contact windows. An organic black matrix layer is then deposited onto the substrate, and etched through a fourth mask to thereby form a black matrix pattern. Thereafter, a color filter is formed, and the formation of a pixel electrode and subsidiary gate and data pads is complete.

In the above process, the black matrix pattern may perform the function of the passivation layer without forming the latter. Furthermore, it is also possible that the color filter is placed directly over the substrate and the gate line by removing the portion of the gate insulating layer positioned between the neighboring data lines.

DETAILED DESCRIPTION OF THE PREFERRED EMBODIMENTS

Preferred embodiments of this invention will be explained with reference to the accompanying drawings.

First Preferred Embodiment

FIGS. 1 to 5 illustrate a TFT array substrate according to a first preferred embodiment of the present invention.

Figure 1:
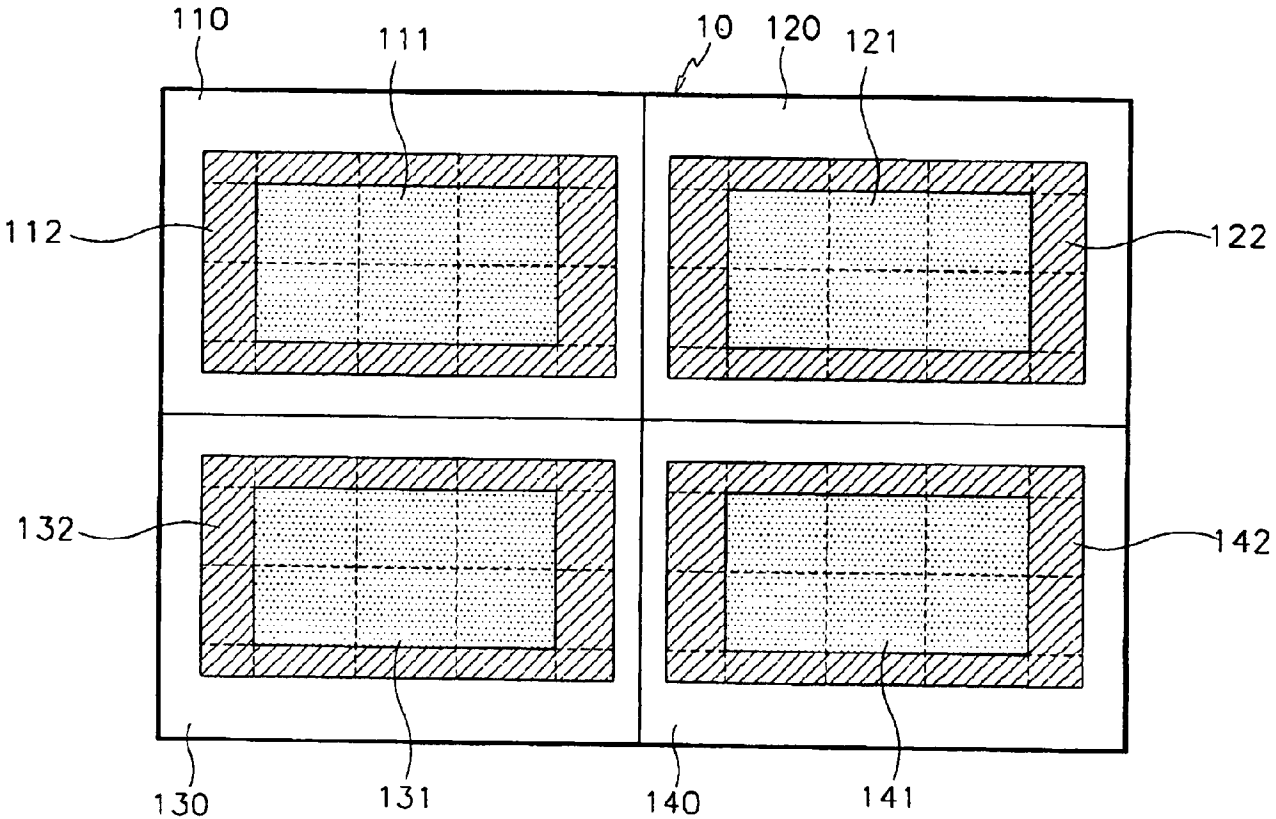
FIG. 1 is a schematic view illustrating a precursor substrate for fabricating a TFT array substrate according to a first preferred embodiment of the present invention where unit regions for the TFT array substrate are indicated.

A plurality of panel regions for LCDs may be made at one insulating substrate at the same time. For example, as shown in FIG. 1, four panel regions 110, 120, 130 and 140 are made with display areas 111, 121, 131 and 141, and peripheral areas 112, 122, 132 and 142. TFTs, lines and pixel electrodes for the main components are repeatedly arranged at the display areas 111 to 141, whereas pads and other static electricity protection circuits for the components connected to the driving circuits are provided at the peripheral areas 112 to 142.

The display areas 111 to 141 and the peripheral areas 112 to 142 are divided into several regions, and each region is light-exposed by a stepper. A photoresist film coated the substrate is exposed to light using identical or different masks per region. After the exposure, the photoresist film is wholly developed to form a photoresist pattern, and the underlying thin films are etched through the photoresist pattern to form thin film patterns. Such thin film patterns are repeated to form the TFT array substrate.

Figure 2:
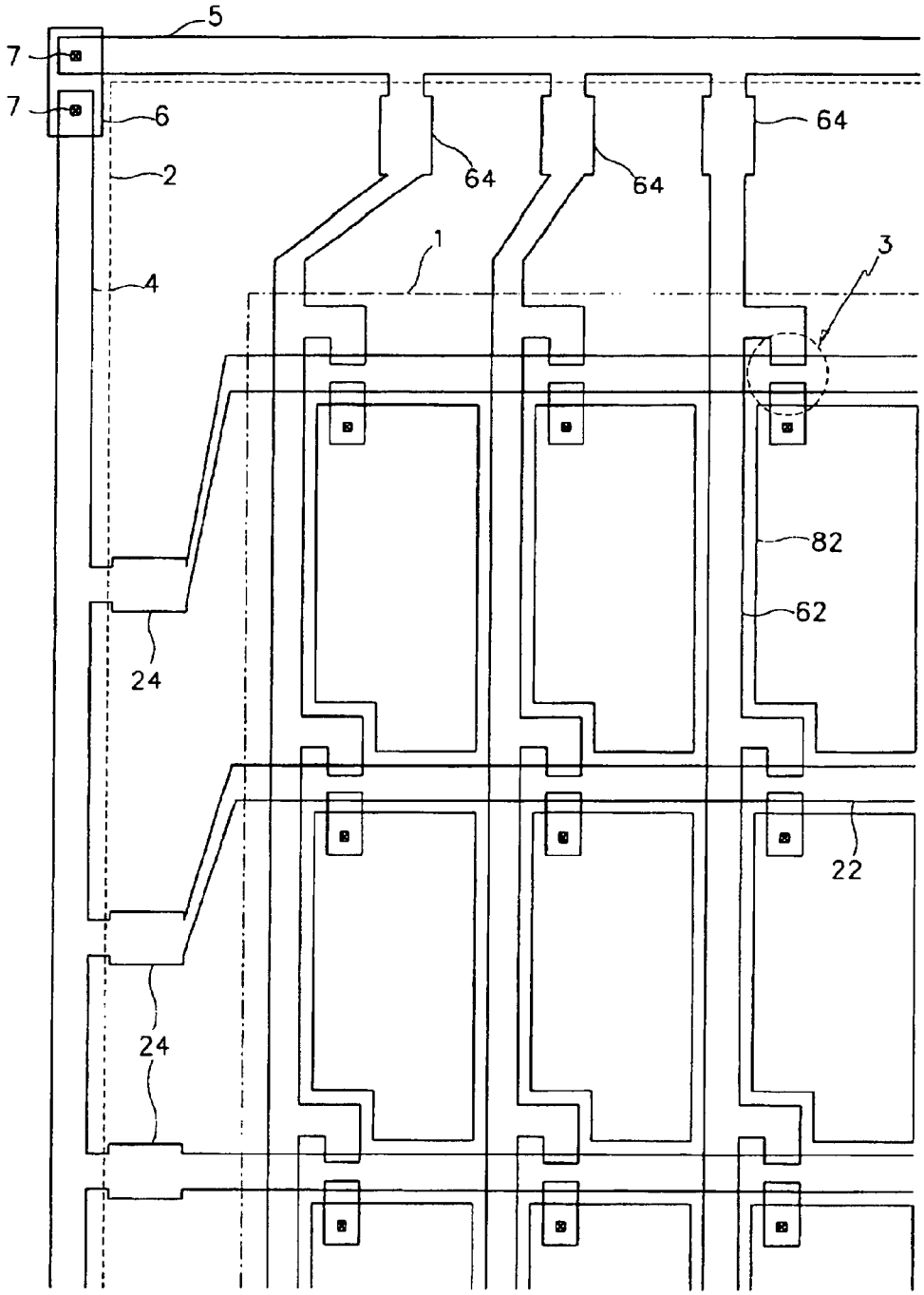
FIG. 2 is a schematic view illustrating the TFT array substrate with circuit and line components according to the first preferred embodiment of the present invention.

FIG. 2 is a schematic view outlining the TFT array substrate shown in FIG. 1 at one panel region where the display area is indicated by the long and short dashed line.

As shown in FIG. 2, a plurality of TFTs 3, pixel electrodes 82, gate lines 22 and data lines 62 electrically connected to the TFTs 3 are provided at the display area. Gate pads 24 placed at the end portions of the gate lines 22, and data pads 64 at the end portions of the data lines 62 are provided at the peripheral area. A gate line shorting bar 4 and a data line shorting bar 5 are further provided at the peripheral area to equipotentially interconnect the gate lines 22 and the data lines 62. neighboring gate and data line shorting bars 4 and 5 are electrically connected to each other via a shorting bar connection member 6. Completing the device fabrication, the shorting bars 4 and 5 are cut away along the dotted line 2. Contact windows 7 interconnect the shorting bar connection member 6 and the neighboring shorting bars 4 and 5.

Figure 3:
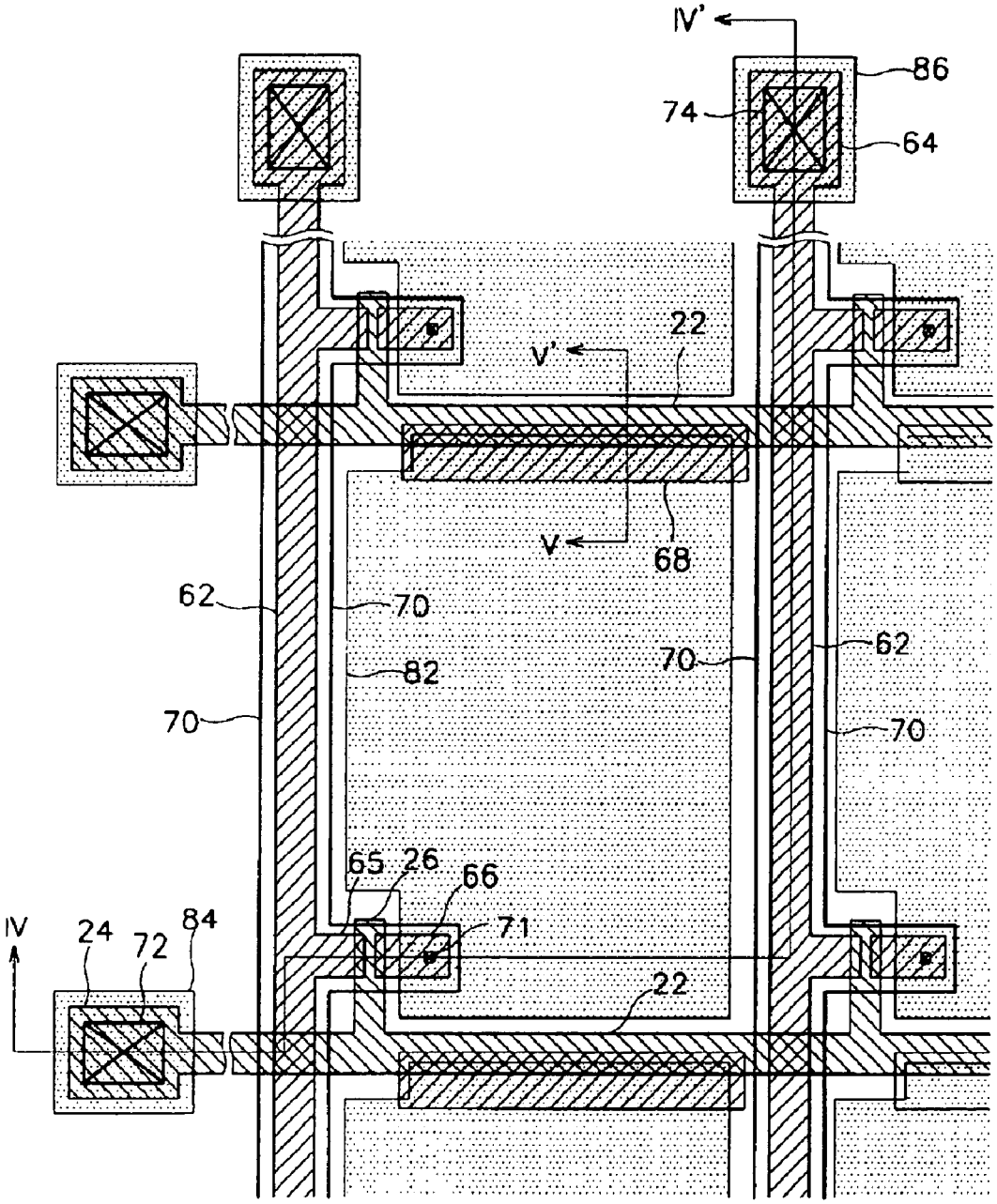
FIG. 3 is an amplified view of the TFT array substrate shown in FIG. 2 at one pixel area.
Figure 4:
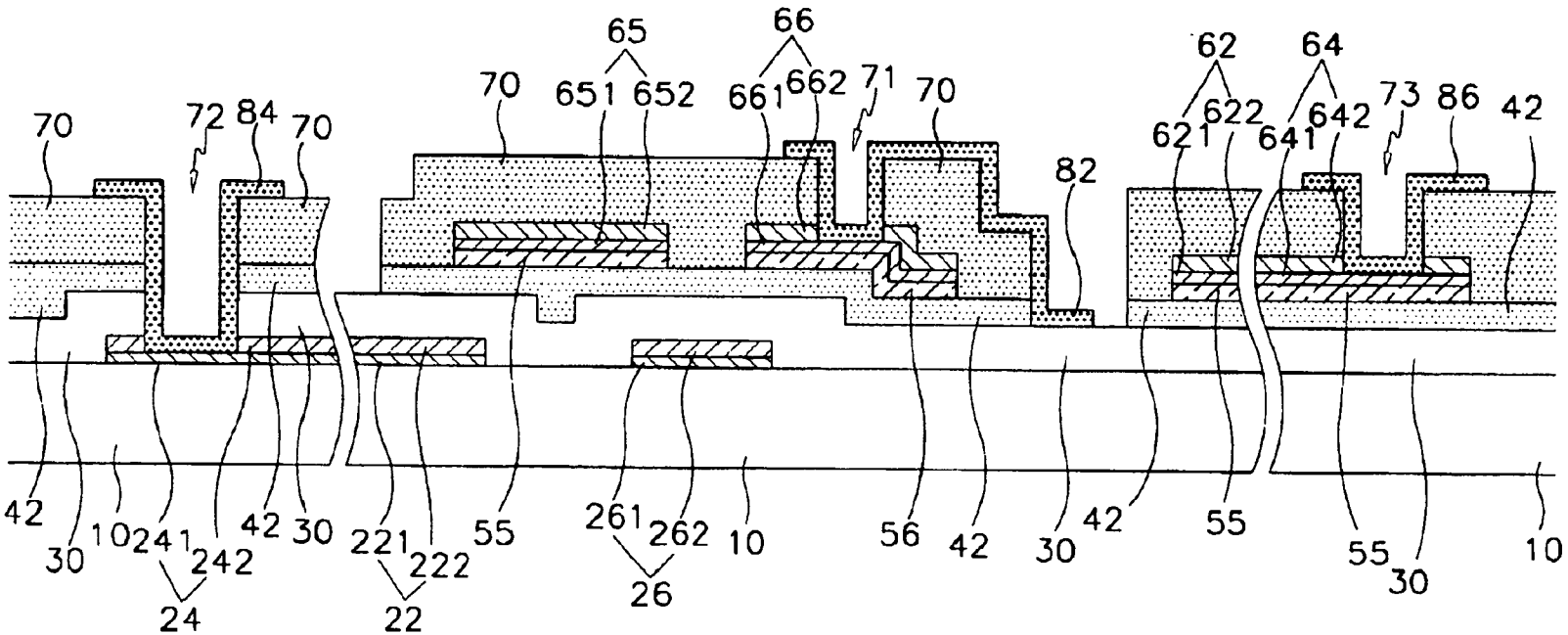
FIGS. 4 and 5 are cross sectional views of the TFT array substrate shown in FIG. 3 taken along the IV-IV' line and the V-V' line, respectively.
Figure 5:
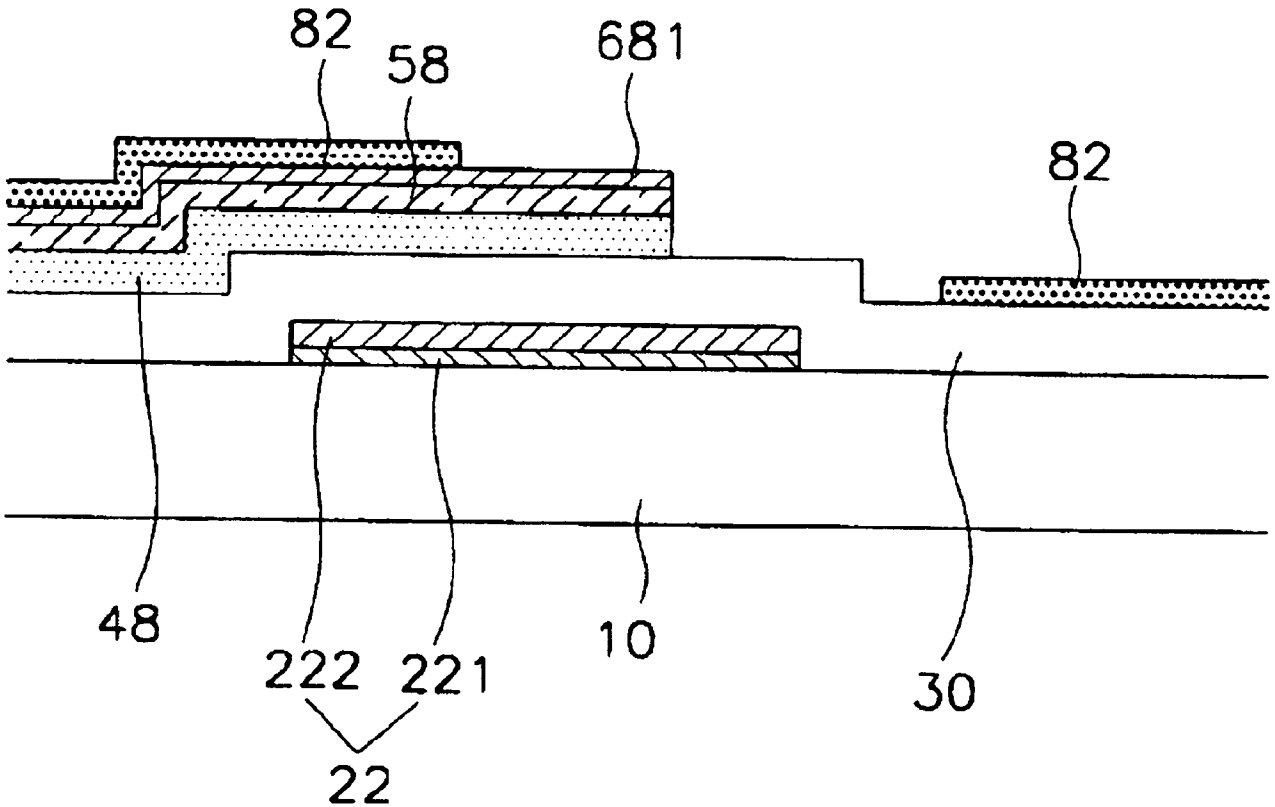

FIG. 3 is an amplified view of the TFT array substrate shown in FIG. 2 at one pixel area, and FIGS. 4 and 5 are cross sectional view taken along the IV-IV' and V-V' lines, respectively.

First, a gate line assembly is formed on the insulating substrate 10. The gate line assembly includes gate lines 22 proceeding in the horizontal direction, gate electrodes 26 branched from the gate lines 22, and gate pads 24 connected to end portions of the gate lines 22 to receive scanning signals from the outside and transmit them to the gate lines 22.

The gate line assembly may be formed with a single, double or triple layered structure. When the gate line assembly is formed with a double or triple layered structure, one layer is preferably formed of a low resistance material and the other layer of a material having a good contact characteristic.

In this preferred embodiment, a gate line assembly with a double layered structure will be introduced. That is, the gate line assembly includes lower layers 221, 241 and 261, and upper layers 222, 242 and 262. The lower layers 221 to 261 are formed with a metallic material such as Cr, Mo, or Mo alloy that exhibits a good contact characteristic with respect to indium tin oxide (ITO) or indium zinc oxide (IZO). In contrast, the upper layers 222 to 262 are formed with a low resistance metallic material such as Al or Al alloy.

The gate line assembly is overlaid sequentially with a gate insulating layer 30, semiconductor patterns 42 and 48, and ohmic contact patterns 55, 56 and 58. The gate insulating layer 30 is formed with silicon nitride ($SiN_x$). The semiconductor patterns 42 and 48 are formed of hydrogenated amorphous silicon. The ohmic contact patterns 55, 56 and 58 are formed with amorphous silicon doped with n-type impurities such as phosphorus (P).

A data line assembly is formed on the ohmic contact patterns 55, 56 and 58. The data line assembly includes data lines 62 proceeding in the vertical direction, data pads 64 connected to end portions of the data lines 62 to receive picture signals from the outside, and source electrodes 65 branched from the data lines 62. The data line assembly further includes drain electrodes 66 for the TFTs, and conductive patterns 68 for the storage capacitors. The drain electrode 66 is positioned opposite to the source electrode 65 with respect to the gate electrode 26 and separated from the source electrode 65. The conductive pattern 68 is positioned above the gate line 22 while overlapping the same. The conductive pattern 68 is connected to a pixel electrode 82 to form a storage capacitor. However, if the pixel electrode 82 and the gate line 22 can generate sufficient storage capacity, the conductive pattern 68 may be omitted.

In the following description, it is assumed that the conductive pattern 68 for the storage capacitor is present.

The data line assembly may have a single, double or triple layered structure. In this preferred embodiment, the double layered structure is used for the data line assembly. That is, the data line assembly includes lower layers 621, 641, 651, 661 and 681, and upper layers 622, 642, 652 and 662. The lower layers 621 to 681 are formed of a metallic material such as Cr, Mo or Mo alloy that exhibits a good contact characteristic with respect to ITO or IZO. The upper layers 622 to 662 are formed of a low resistance metallic material such as Al or Al alloy. As shown in FIG. 5, among the components of the data line assembly, only the conductive pattern 68 has a single layered structure with the lower layer 681.

The ohmic contact patterns 55, 56 and 58 reduce the contact resistance between the semiconductor patterns 42 and 48 and the data line assembly, and have the same shape as that of the data line assembly.

The semiconductor patterns 42 and 48 have a shape similar to that of the data line assembly and the underlying ohmic contact patterns 55, 56 and 58. Specifically, the semiconductor pattern 48 for the storage capacitor has the same shape as that of the conductive pattern 68 and the underlying ohmic contact pattern 58, while the shape of the semiconductor pattern 42 for the TFT differs from that of the data line assembly and the underlying ohmic contact patterns 55 and 56. That is, the source electrode 65 is separated from the drain electrode 66 at the channel region of the TFT, and the ohmic contact pattern 55 under the source electrode 65 is also separated from the ohmic contact pattern 56 under the drain electrode 66. In contrast, the semiconductor pattern 42 continuously proceeds at the channel region of the TFT. The semiconductor layer extends to the peripheral portion of the substrate 10 while covering the latter.

A passivation layer 70 covers the data line 62, the data pad 64, the source electrode 65, the drain electrode 66, the semiconductor pattern 42, and the overlapping portions between the gate line 22 and the data line 62.

Contact windows 71 and 73 are formed at the passivation layer 70 while exposing the drain electrode 66 and the data pad 64. The contact window 71 exposing the drain electrode 66 may be extended toward the pixel area such that it can expose the borderline of the drain electrode 66 completely. The Al-based upper layers 642 and 662 of the data pad 64 and the drain electrode 66 are removed such that the Cr-based lower layers 641 and 661 thereof are exposed through the contact windows 71 and 73. Another contact window 72 is formed at the passivation layer 70 while passing through the semiconductor pattern 42 and the gate insulating layer 30 to expose the gate pad 24 to the outside. The upper layer 242 of the gate pad 24 is removed such that the lower layer 241 thereof is exposed through the contact window 72.

The passivation layer 70 may be formed of an organic insulating material such as silicon nitride and acryl-based materials. The passivation layer 70 protects the channel portion of the semiconductor pattern 42 between the source and drain electrodes 65 and 66.

The aforementioned pixel electrode 82 is formed on the gate insulating layer 30 at the pixel area enclosed by the neighboring gate and data lines 22 and 62. The pixel electrode 82 is electro-physically connected to the underlayer 661 of the drain electrode 66 through the contact window 71 such that it receives picture signals from the TFT while making the required electrical field in association with a common electrode. The pixel electrode 82 is formed of a transparent conductive material such as ITO or IZO. The pixel electrode 82 is extended over the conductive pattern 68, and electro-physically connected to the latter such that it serves as a storage capacitor together with the conductive pattern 68 and the gate line 22.

In the meantime, a supplemental gate pad 84 and a supplemental data pad 86 are formed on the gate pad 24 and the data pad 64, respectively. The supplemental gate and data pads 84 and 86 are formed together with the pixel electrode 82 with the same material, and contact the Cr-based lower layers 241 and 641 of the gate and data pads 24 and 64, respectively. The supplemental gate and date pads 84 and 86 strengthen the adhesion between the gate 24 and the data pad 64 and the external circuit devices and protect them. However they may be dispensed with.

The pixel electrode 82, the supplemental gate and data pads 84 and 86 directly contact the Cr- or Mo-based lower layers 661, 841 and 861 of the drain electrode 66, and the gate and data pads 24 and 64, which results in stable and good contacts between them.

In a reflection-type liquid crystal display, an opaque conductive material may be used for the pixel electrode 82 instead of ITO or IZO.

A method for fabricating the TFT array substrate according to the first preferred embodiment will be now explained with reference to FIGS. 3 to 5 and FIGS. 6A to 17B.

Figure 6A:
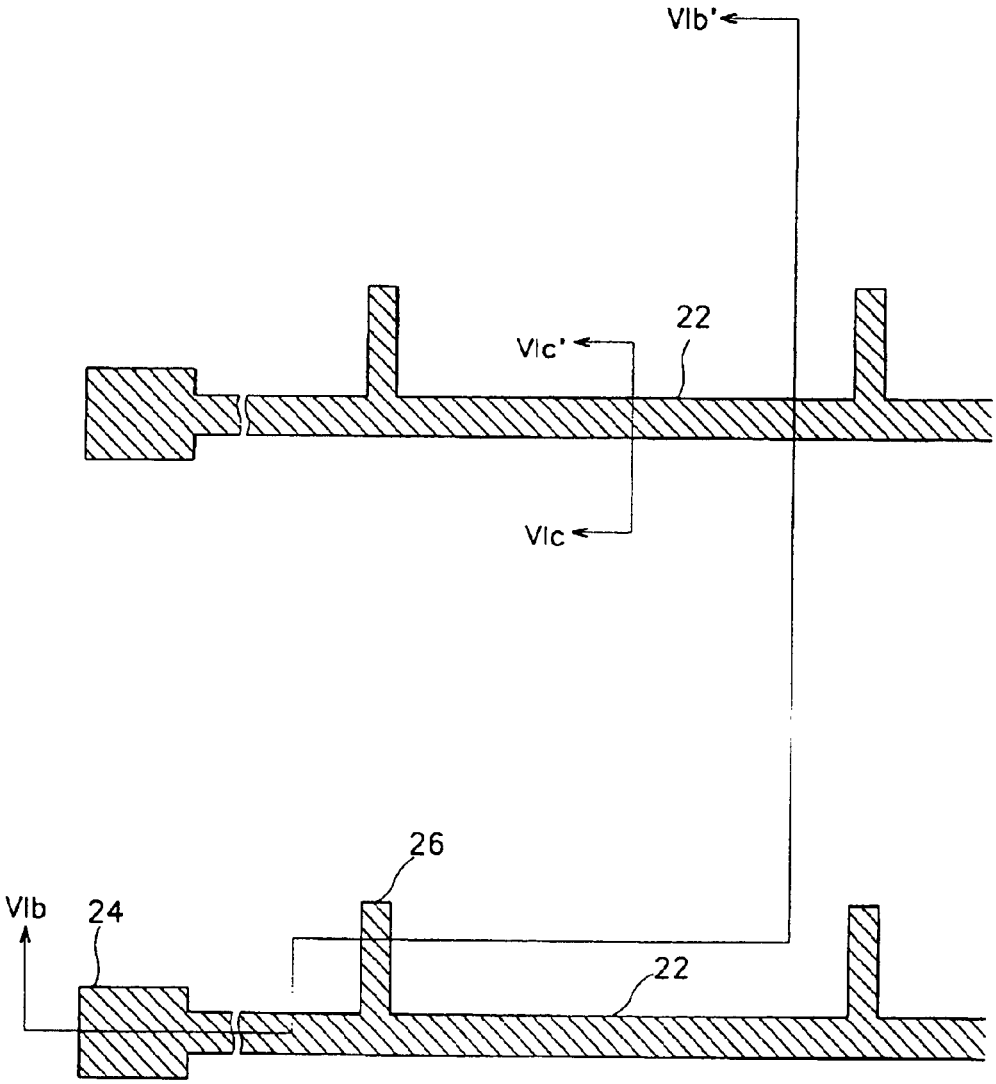
FIG. 6A is a plan view of the TFT array substrate shown in FIG. 3 illustrating the step of forming a gate line assembly.
Figure 6B:
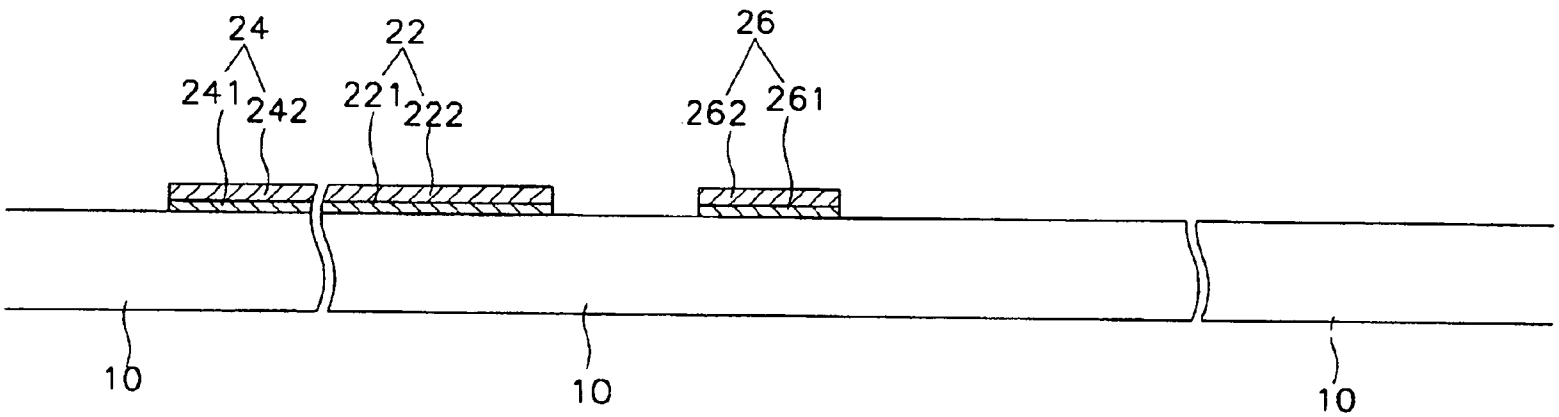
FIGS. 6B and 6C are cross sectional views of the TFT array substrate taken along the IVb-IVb' line and the IVc-IVc' line of FIG. 6A, respectively.
Figure 6C:
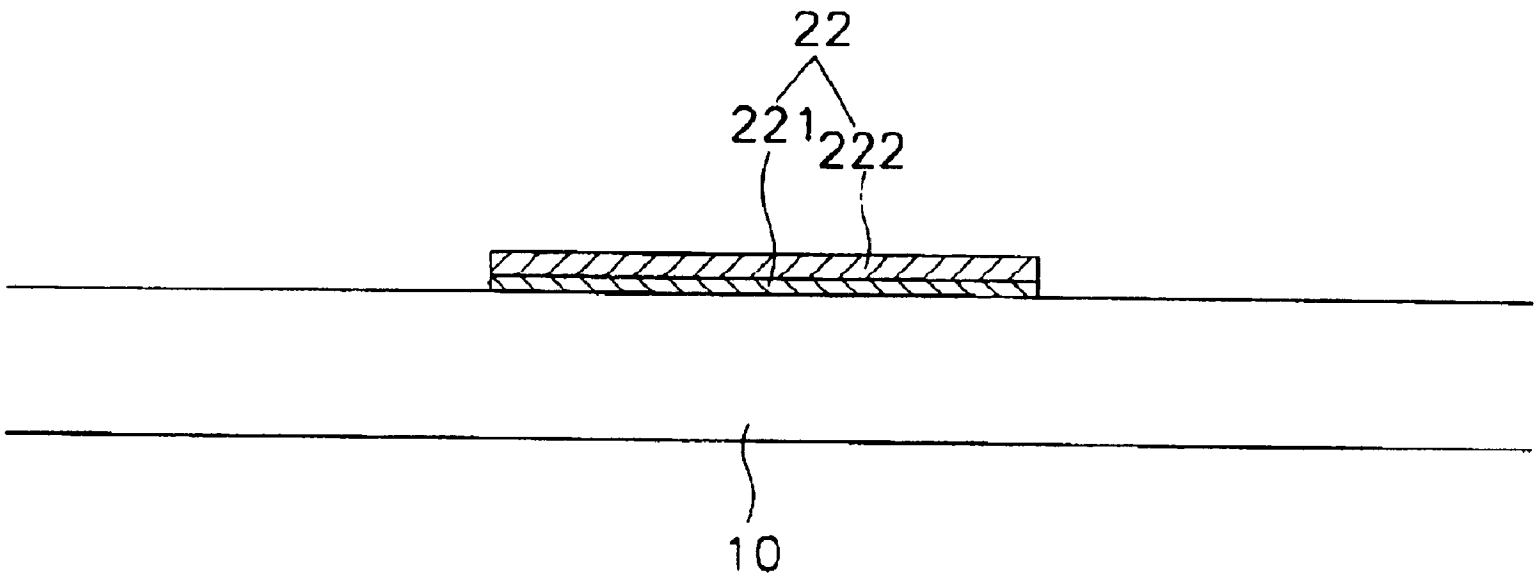

As shown in FIGS. 6A to 6C, a first metal gate line layer of chrome, molybdenum or molybdenum alloy is deposited onto a substrate 10 to a thickness of 500-1,500 Å. A second metal gate line layer of aluminum or aluminum alloy is then deposited onto the first gate line layer to a thickness of 1,000-4,000 Å. The first and second metal gate line layers are wet or dry-etched through a first mask so that a double-layered gate line assembly is formed at the substrate 10. The gate line assembly includes a gate line 22 with lower layer 221 and upper layer 222, a gate pad 24 with lower layer 241 and upper layer 242, and a gate electrode 26 with lower layer 261 and upper layer 262.

Figure 7A:
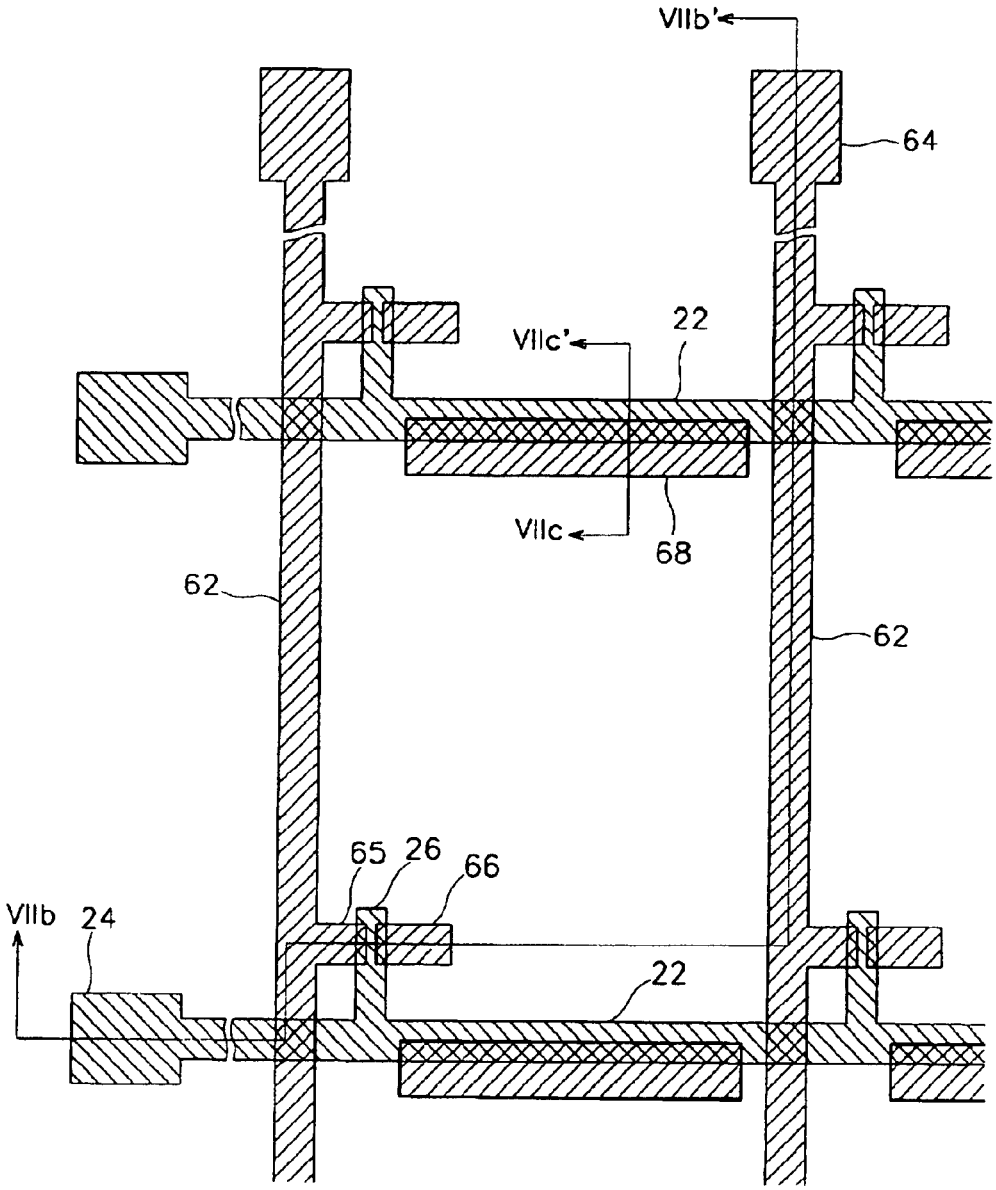
FIG. 7A is a plan view of the TFT array substrate shown in FIG. 3 illustrating the step of forming a data line assembly.
Figure 7B:
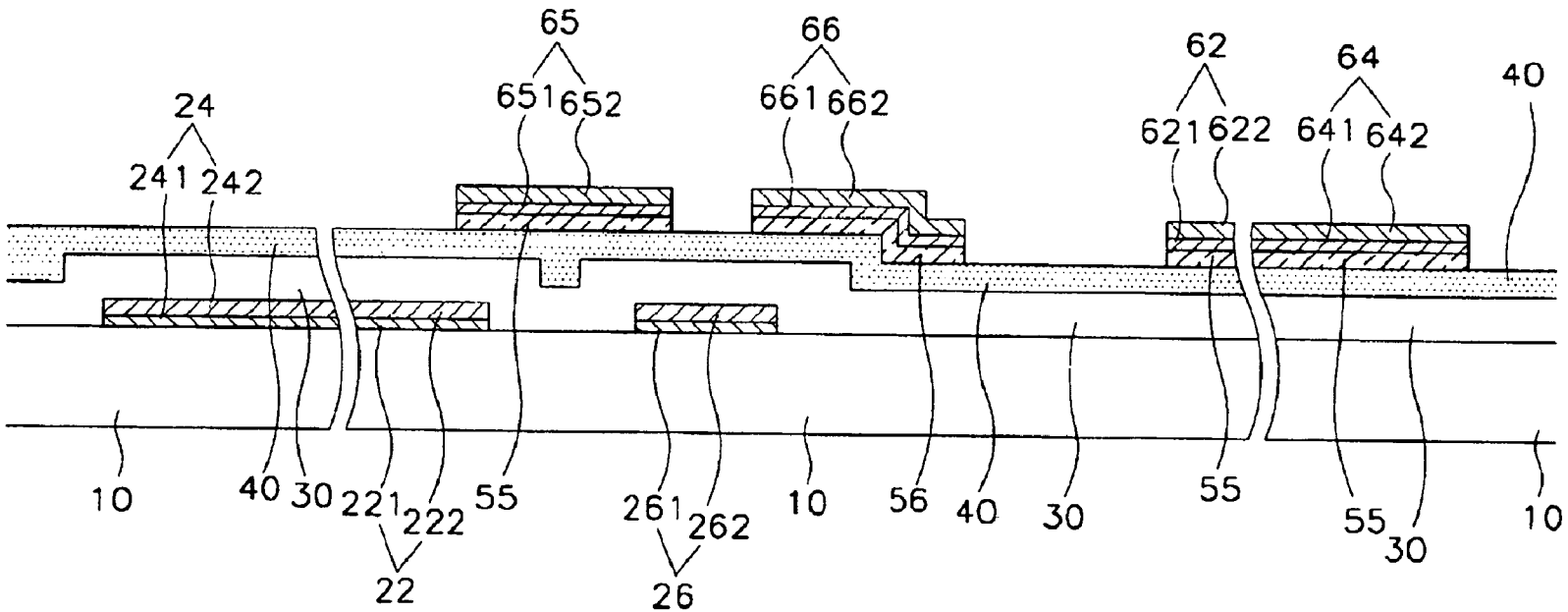
FIGS. 7B and 7C are cross sectional views of the TFT array substrate taken along the VIIb-VIIb' line and the VIIc-VIIc' line of FIG. 7A, respectively.
Figure 7C:
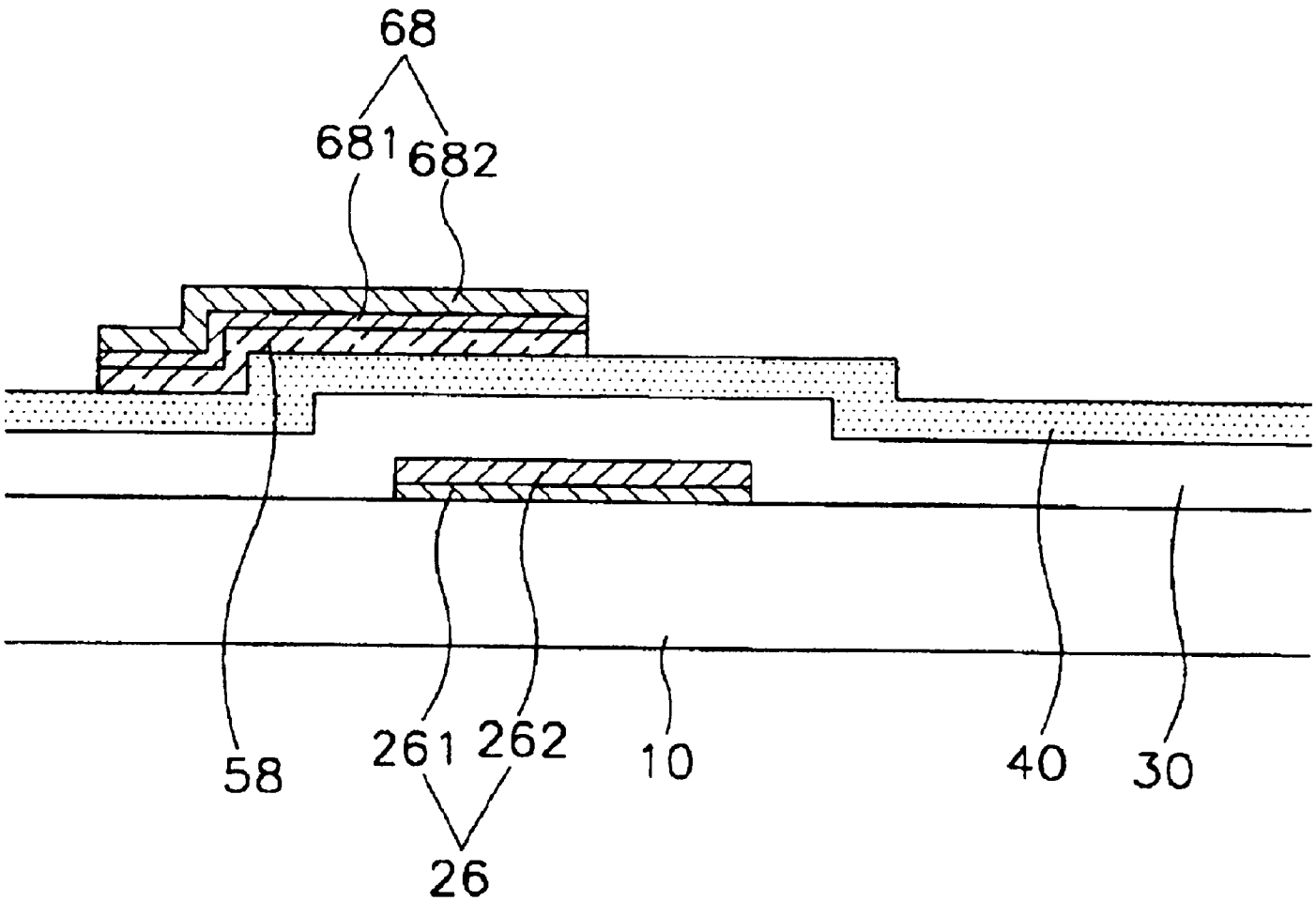

Thereafter, as shown in FIGS. 7A to 7C, a gate insulating layer 30 having a thickness of 1,500-5,000 Å, a semiconductor layer 40 having a thickness of 500-1,500 Å, and an ohmic contact layer 50 having a thickness of 300-600 Å are sequentially deposited onto the substrate 10 along with the gate line assembly through chemical vapor deposition. The gate insulating layer 30 is formed of silicon nitride, the semiconductor layer 40 of amorphous silicon (a-Si), and the ohmic contact layer 50 of doped amorphous silicon ($n^+$a-Si).

A first metal data line layer of chrome, molybdenum or molybdenum alloy is then deposited onto the ohmic contact layer 50 to a thickness of 500-1,500 Å. A second metal data line layer of aluminum or aluminum alloy is deposited onto the first data line layer to a thickness of 500-4,000 Å. The first and second data line layers are etched through a second mask together with the underlying ohmic contact layer 50 to form a double-layered data line assembly. The data line assembly includes a data line 62 with lower layer 621 and upper layer 622, a data pad 64 with lower layer 641 and upper layer 642, a source electrode 65 with lower layer 651 and upper layer 652, a drain electrode 66 with lower layer 661 and upper layer 662, and a conductive pattern 68 with lower layer 681 and upper layer 682. At this time, the ohmic contact layer 50 is also etched to form a first contact pattern 55 for the data line 62, the data pad 64 and the source electrode 65, a second contact pattern 56 for the drain electrode 66, and a third contact pattern 58 for the conductive pattern 68. The conductive pattern 68 with the third contact pattern 58 may be omitted.

Figure 8A:
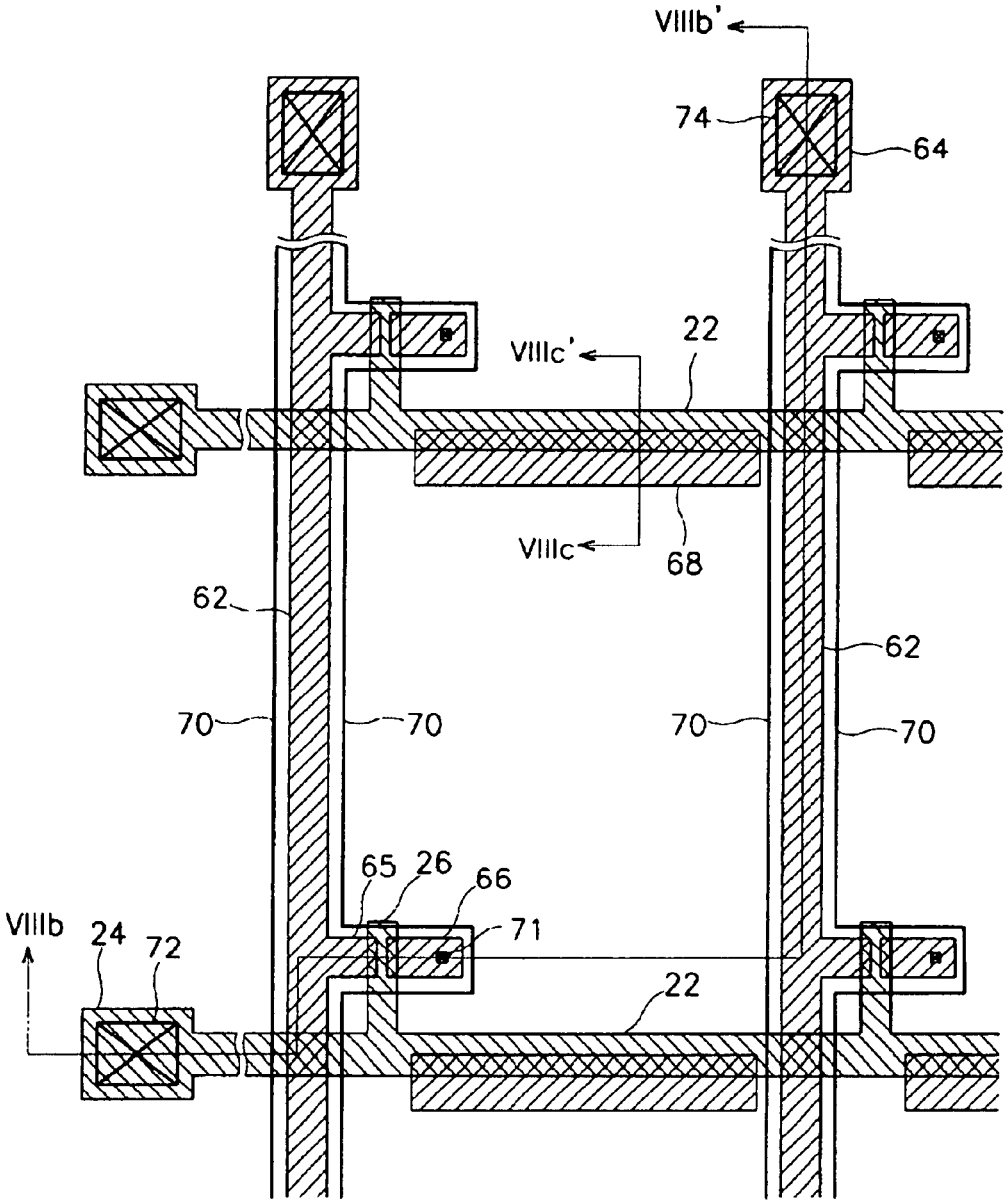
FIG. 8A is a plan view of the TFT array substrate shown in FIG. 3 illustrating the step of forming a semiconductor pattern and contact windows.
Figure 8B:
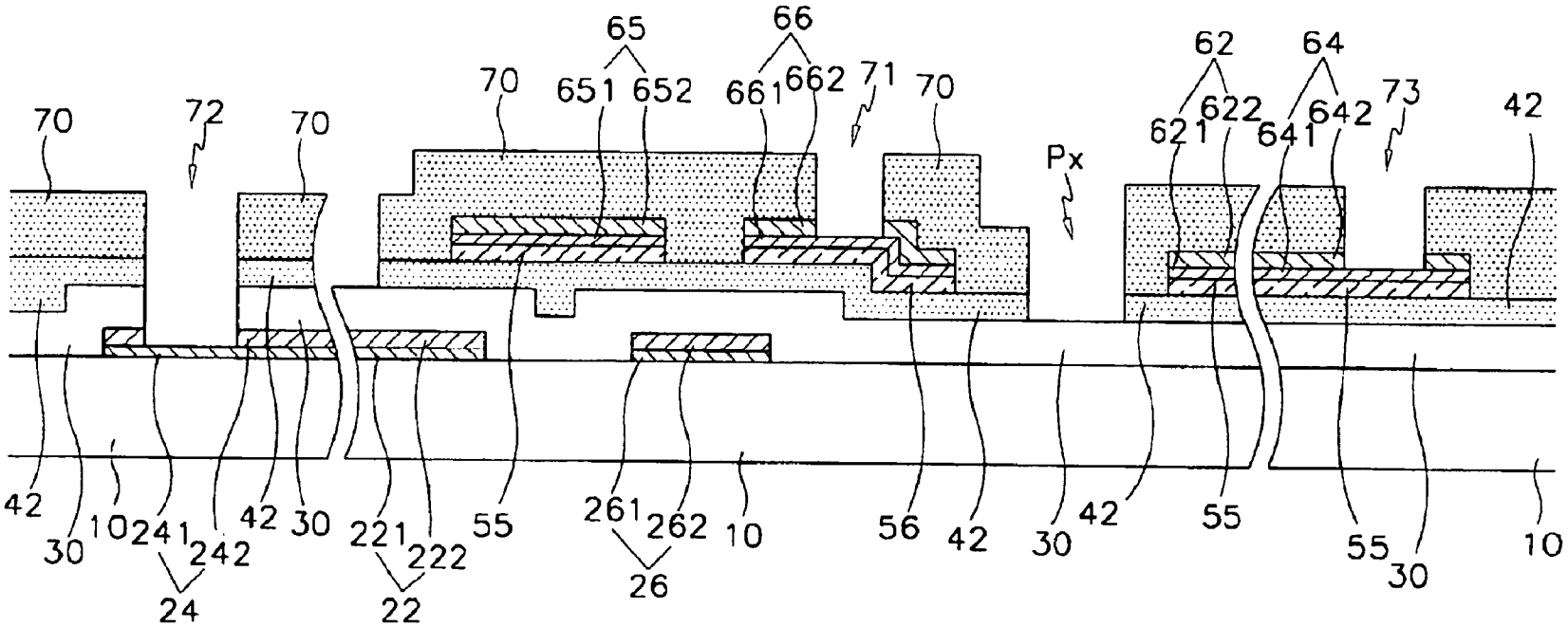
FIGS. 8B and 8C are cross sectional views of the TFT array substrate taken along the VIIIb-VIIIb' line and the VIIIc-VIIIc' line of FIG. 8A, respectively.
Figure 8C:
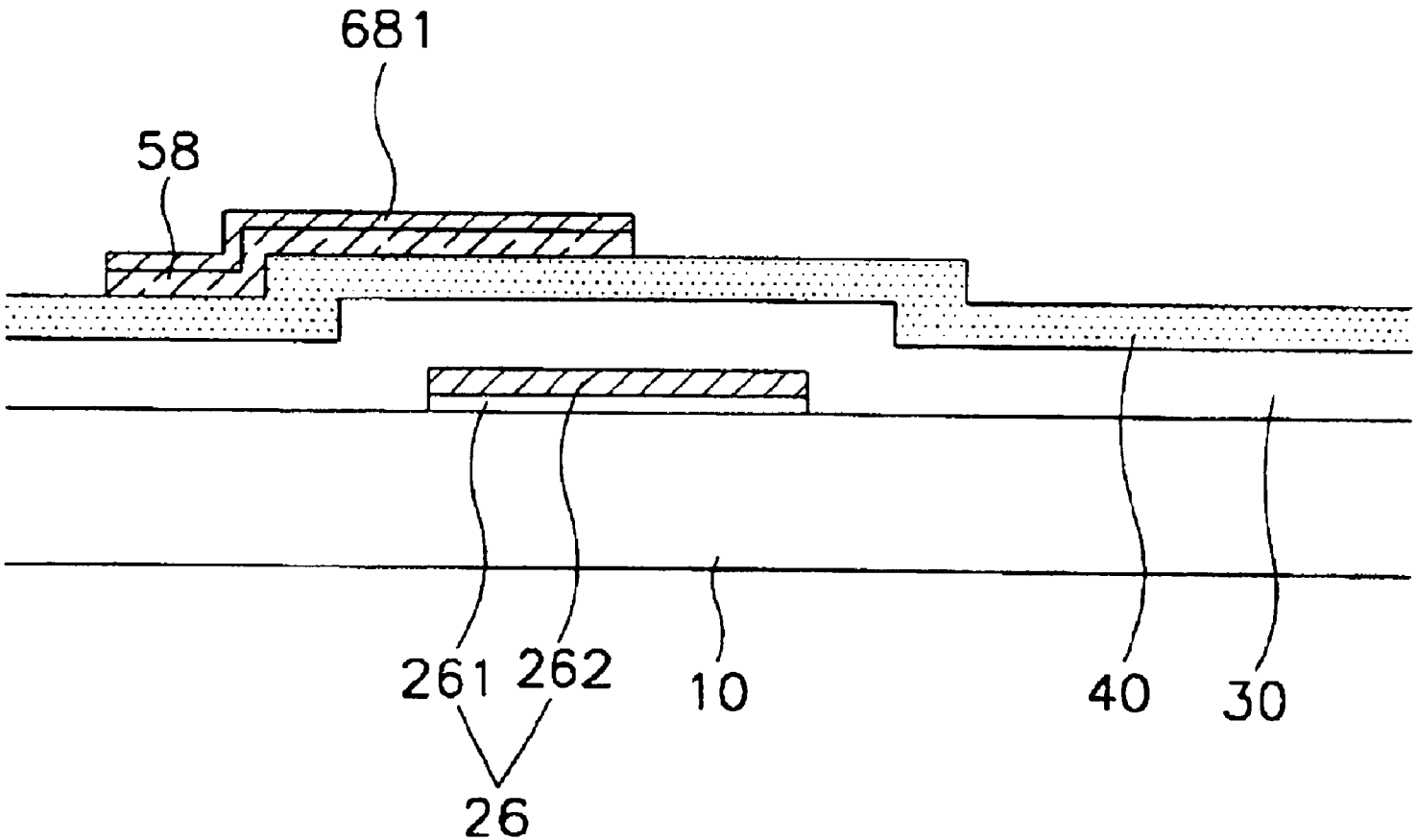

Thereafter, as shown in FIGS. 8A to 8C, a passivation layer 70 of silicon nitride is deposited onto the substrate 10 through chemical vapor deposition to a thickness of 3,000 Å. The passivation layer 70 is then etched through a third mask together with the underlying semiconductor layer 40 and gate insulating layer 30. As a result, the passivation layer 70 and the upper layer 662 are removed from the drain electrode 66 to form a first contact window 71. The passivation layer 70, the semiconductor layer 40, the gate insulating layer 30 and the upper layer 242 are removed from the gate pad 24 to form a second contact window 72. The passivation layer 70 and the upper layer 642 are removed from the data pad 64 to form a third contact window 73. The upper layer 682 is removed from the conductive pattern 68. Furthermore, the passivation layer 70 and the semiconductor layer 40 at the pixel area between the neighboring data lines 62 are removed to form the channel region only at the required portion.

The etching process using the third mask will be now described in detail.

Figure 9A:
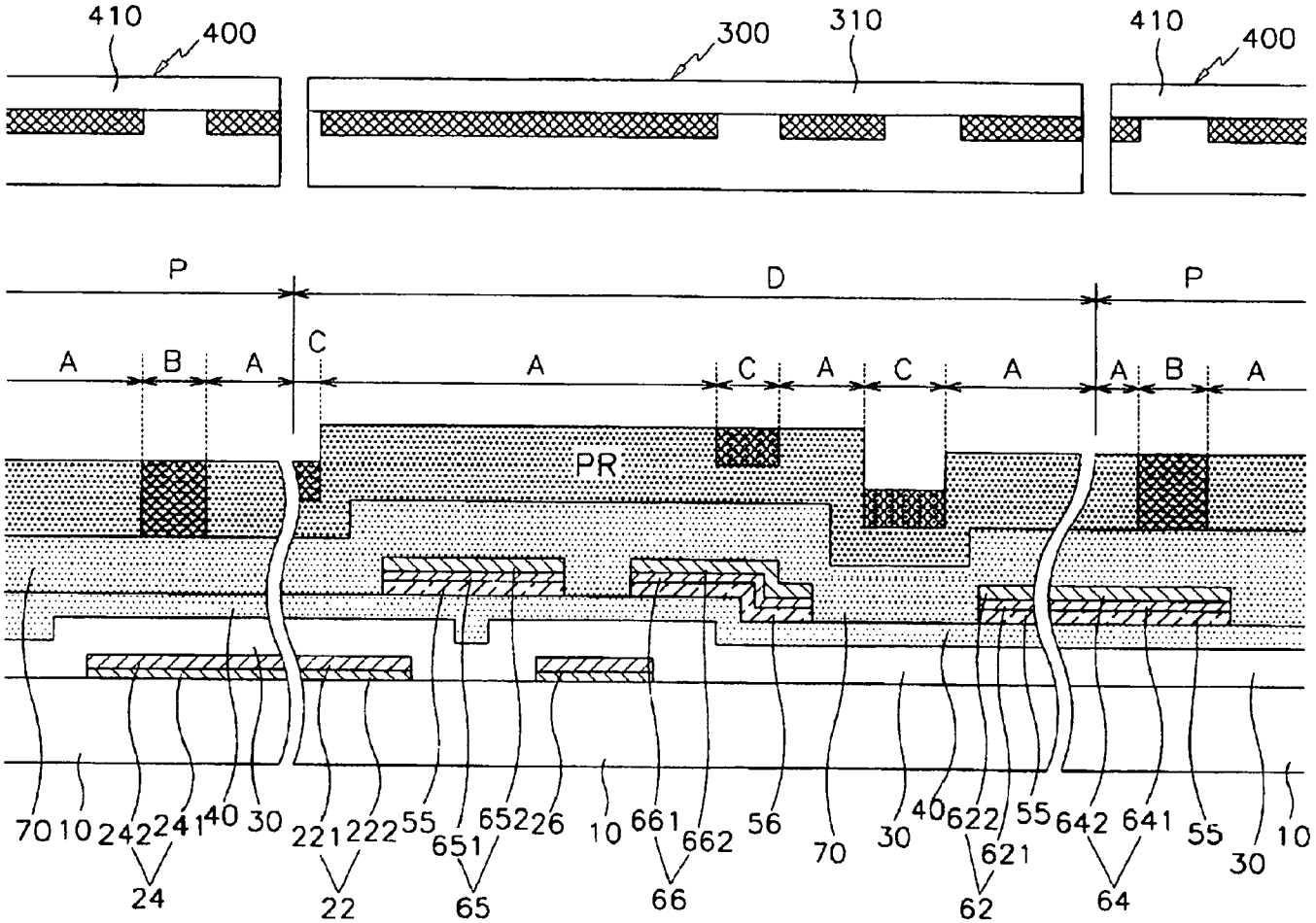
FIGS. 9A and 9B are cross sectional views of the TFT array substrate taken along the VIIIb-VIIIb' line and the VIIIc-VIIIc' line of FIG. 8A illustrating the step of exposing a photoresist film to light.
Figure 9B:
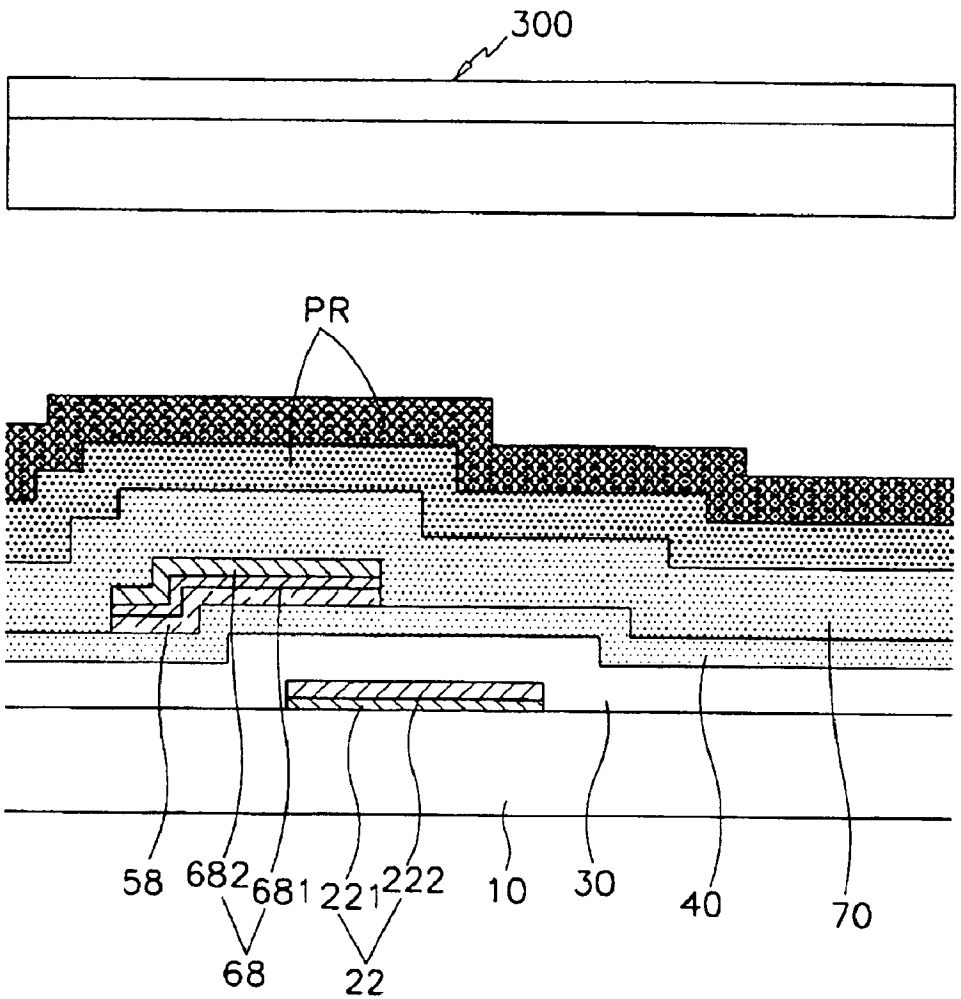

A photoresist film PR having a thickness of 5,000-30,000 Å is coated onto the passivation layer 70, and exposed to light through the third mask. As shown in FIGS. 9A and 9B, the light exposure at the display area D is different from the light exposure at the peripheral area P. That is, the exposed portion C of the photoresist film PR at the display area D reacts to the light such that the molecules thereof are partially resolved to a predetermined depth from the surface while leaving the molecules thereunder unresolved. In contrast, the exposed portion B of the photoresist film PR at the peripheral area P reacts to the light such that the molecules thereof are completely resolved to the bottom.

In order to perform such a differential light exposure, the light transmissivity of the third mask corresponding to the display area D and the peripheral area P of the photoresist film PR should be controlled appropriately. Three types of techniques will be here introduced.

FIGS. 10A to 12 illustrate possible structures of the third mask for etching the passivation layer 70 along with the underlying layers.

First, separate masks can be used for the third mask to perform the masking operation with respect to the display area D and the peripheral area P of the photoresist film PR, respectively.

Figure 10A:
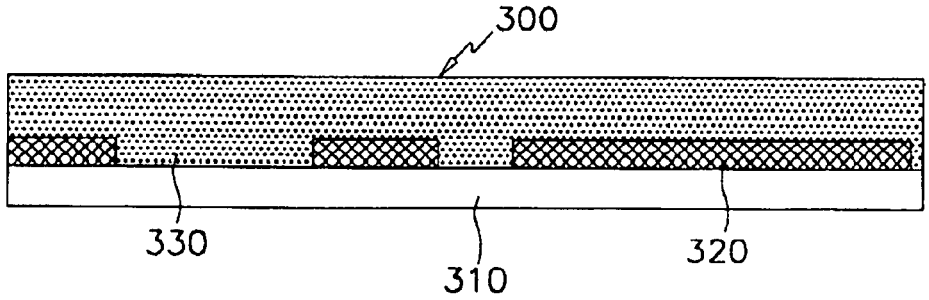
FIGS. 10A to 12 are cross sectional views of a mask for light-exposing the photoresist film shown in FIGS. 9A and 9B.
Figure 10B:
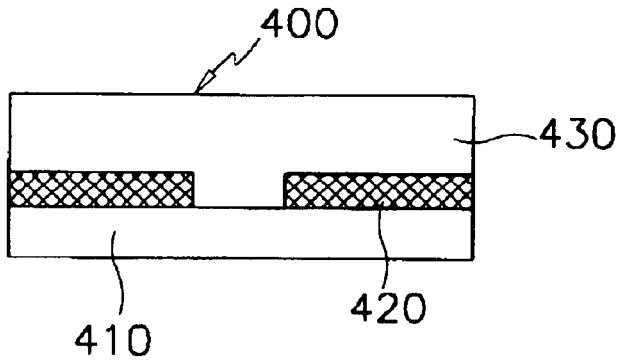

As shown in FIGS. 10A and 10B, a mask 300 for the display area D and a mask 400 for the peripheral area P are formed with substrates 310 and 410, chrome-based opaque films 320 and 420 formed on the substrates 310 and 410, and semitransparent pellicles 330 and 430 covering the substrates 310 and 410 with the opaque films 320 and 420. It is preferable that the light transmissivity of the opaque films 320 and 420 be 3% or less, the light transmissivity of the pellicle 430 of the mask 400 for the peripheral area P to be 90% or more, and the pellicle 330 of the mask 300 for the display area D to be 20-40% that is in the range of 20-60% of the light transmissivity of the pellicle 430 for the peripheral area P.

Meanwhile, patterns of slit or lattice with an opening width of about 2.5 μm that is smaller than the resolution capability of the light source for exposure may be formed as a replacement for the semitransparent pellicle 330 for the display area D.

Figure 11A:
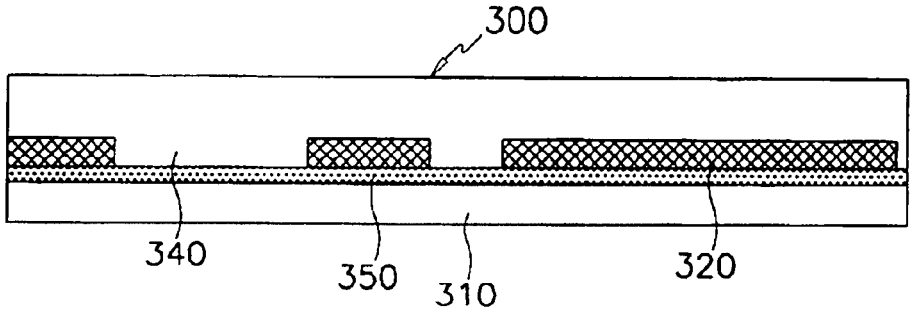
Figure 11B:
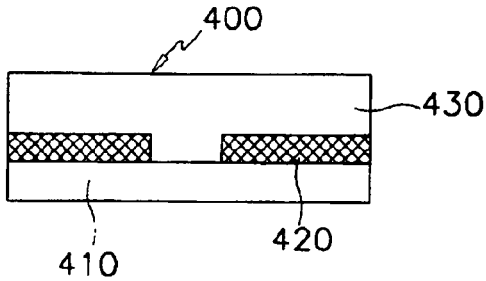

Alternatively, as shown in FIGS. 11A and 11B, a chrome-based thin film 350 with a thickness of 100-300 Å covers the entire surface of the mask 300 for the display area D while being positioned under the opaque film 320, whereas such a chrome-based thin film is absent at the mask 400 for the peripheral area P. In this case, the pellicle 340 of the mask 300 for the display area D may have the same light transmissivity as that of the pellicle 430 of the mask 400 for the peripheral area P.

Of course, the above two techniques may be used together in a suitable application.

The above two types of masks can be applied for use in partitioned exposure with a stepper, and separately perform the masking operation with respect to the display area D and the peripheral area P. The thickness of the target film can be also controlled by making the light exposure period different depending on the display area D and the peripheral area P.

Figure 12:
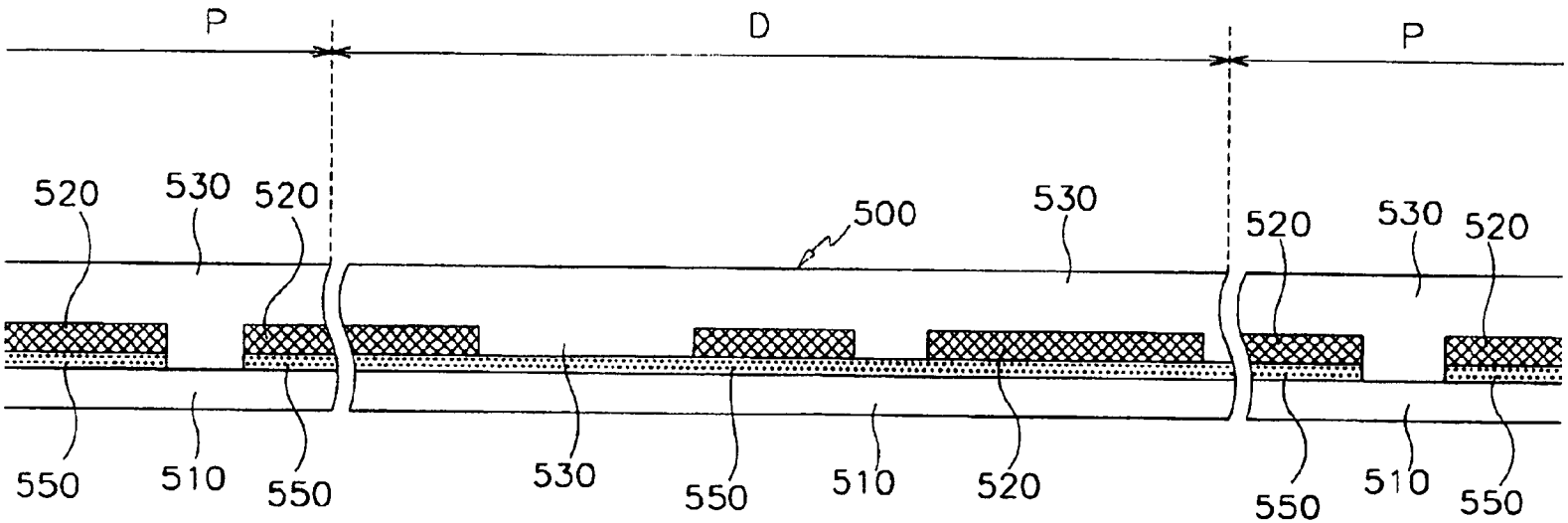

On the other hand, only one mask can be used for the light exposure with respect to the display and the peripheral areas D and P at the same time while controlling the amount of light applied thereto. FIG. 12 illustrates the structure of such a mask 500.

As shown in FIG. 12, a light transmissivity control film 550 is formed on a substrate 510 for the mask 500, and an opaque film 520 is formed on the light transmissivity control film 550. Whereas the light transmissivity control film 550 for the display area D is formed on the entire surface of the substrate 510, the light transmissivity control film 550 for the peripheral area P is formed only under the opaque film 520. That is, two or more patterns with different thickness are formed on the substrate 510. Of course, such a light transmissivity control film may be formed on the entire surface of the substrate 510 both at the display and the peripheral areas D and P. In this case, the light transmissivity of the light transmissivity control film 550 for the peripheral area P should be established to be higher than that of the light transmissivity control film 550 for the display area D.

In the fabrication process of the mask 500, a light transmissivity control film 550, and an opaque film 520 with an etching ratio different from that of the light transmissivity control film 550 are sequentially deposited onto the substrate 510. A photoresist film is coated on the entire surface of the substrate 510 with the light transmissivity film 550 and the opaque film 520, exposed to light, and developed to form a photoresist pattern. The opaque layer 520 is then etched by using the photoresist pattern for the mask. The photoresist pattern is then removed, and a second photoresist pattern is formed while exposing the portions of the light transmissivity film 550 corresponding to the contact windows at the peripheral area P to the outside. The light transmissivity film 550 is then etched by using the second photoresist pattern for a mask. A semitransparent pellicle 530 is finally formed on the substrate 510 with the patterns of the light transmissivity film 550 and the opaque layer 520.

Meanwhile, the portions of the photoresist film PR with the underlying metal gate or data line assembly may be applied with a larger amount of light due to the light reflected against the metallic component. Therefore, in order to prevent such a problem, a new layer for intercepting the reflected light, for example a colored photoresist film PR, may be introduced.

Figure 13A:
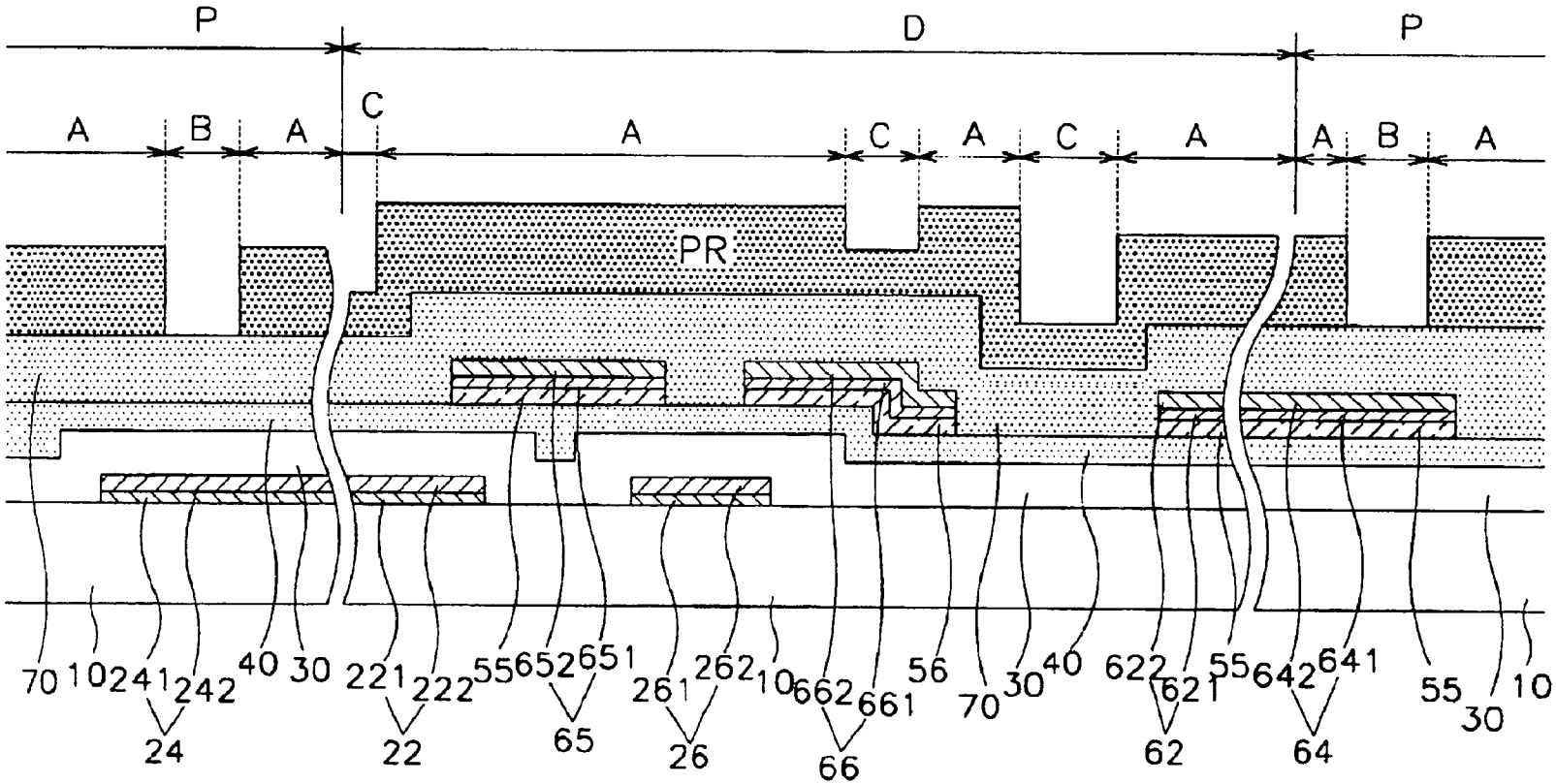
FIGS. 13A and 13B are cross sectional views of the TFT array substrate taken along the VIIIb-VIIIb' line and the VIIIc-VIIIc' line of FIG. 8A illustrating the step of developing the photoresist film.
Figure 13B:
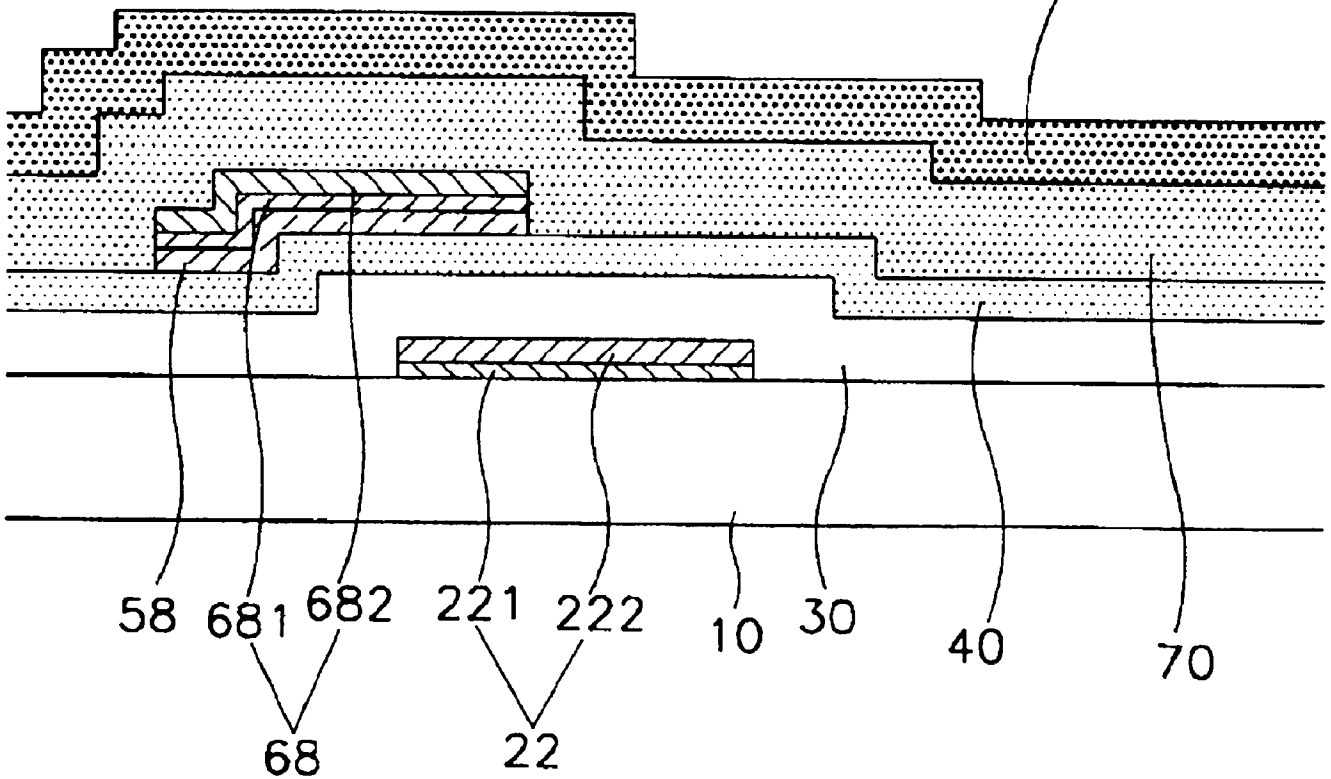

As shown in FIGS. 13A and 13B, when the photoresist film PR exposed through the third mask is developed, a photoresist pattern PR results. That is, some portions B of the photoresist film at the peripheral area P over the gate and data pads 24 and 64 are completely removed, and some portions C of the photoresist film at the display area D over the drain electrode 66 and the pixel area are partially removed with a resulting small thickness. The remaining portions of the photoresist film at the display and the peripheral areas D and P are left with a relatively large thickness. In this process, as shown in FIG. 13B, the photoresist film having a small thickness may be formed over the conductive pattern 68.

The thickness of the thin photoresist film is preferably in the range of 350-10,000 Å that is one fourth to one seventh of the initial thickness, and more preferably in the range of 1,000-6,000 Å. For instance, the initial thickness of the photoresist film may be established to be 25,000-30,000 Å, and the thickness of the thin photoresist film to be 3,000-5,000 Å by controlling the light transmissivity of the mask at the display area D to 30%. However, since the resulting thickness is determined in accordance with the processing conditions, the pellicle of the mask, the thickness of the chrome-based film, and the light transmissivity of the light transmissivity control film, the exposing time should be controlled depending upon such processing conditions.

Alternatively, such a thin photoresist film may be formed by using a common processing technique including the steps of exposing and developing the photoresist film, and then performing the following operation, whereby the photoresist pattern PR and the underlying passivation layer 70, semiconductor layer 40 and gate insulating layer 30 are etched by using a dry etching technique, passivation In the etching process, the A portion of the photoresist pattern PR should be partially left, the passivation layer 70, semiconductor layer 40 and gate insulating layer 30 positioned under the B portion of the photoresist pattern PR should be removed, and the passivation layer 70 and semiconductor layer 40 under the C portion of the photoresist pattern PR should be removed, while leaving the gate insulating layer 30.

For this purpose, a dry etching technique that is capable of etching the photoresist pattern PR and the underlying layers at the same time may be used.

Alternatively, in order to prevent only partial removal of the semiconductor layer 40 over the gate insulating layer 30 due to the non-uniform thickness of the resulting photoresist film, the photoresist pattern PR and the underlying layers can be etched through several etching steps as described below.

Figure 14A:
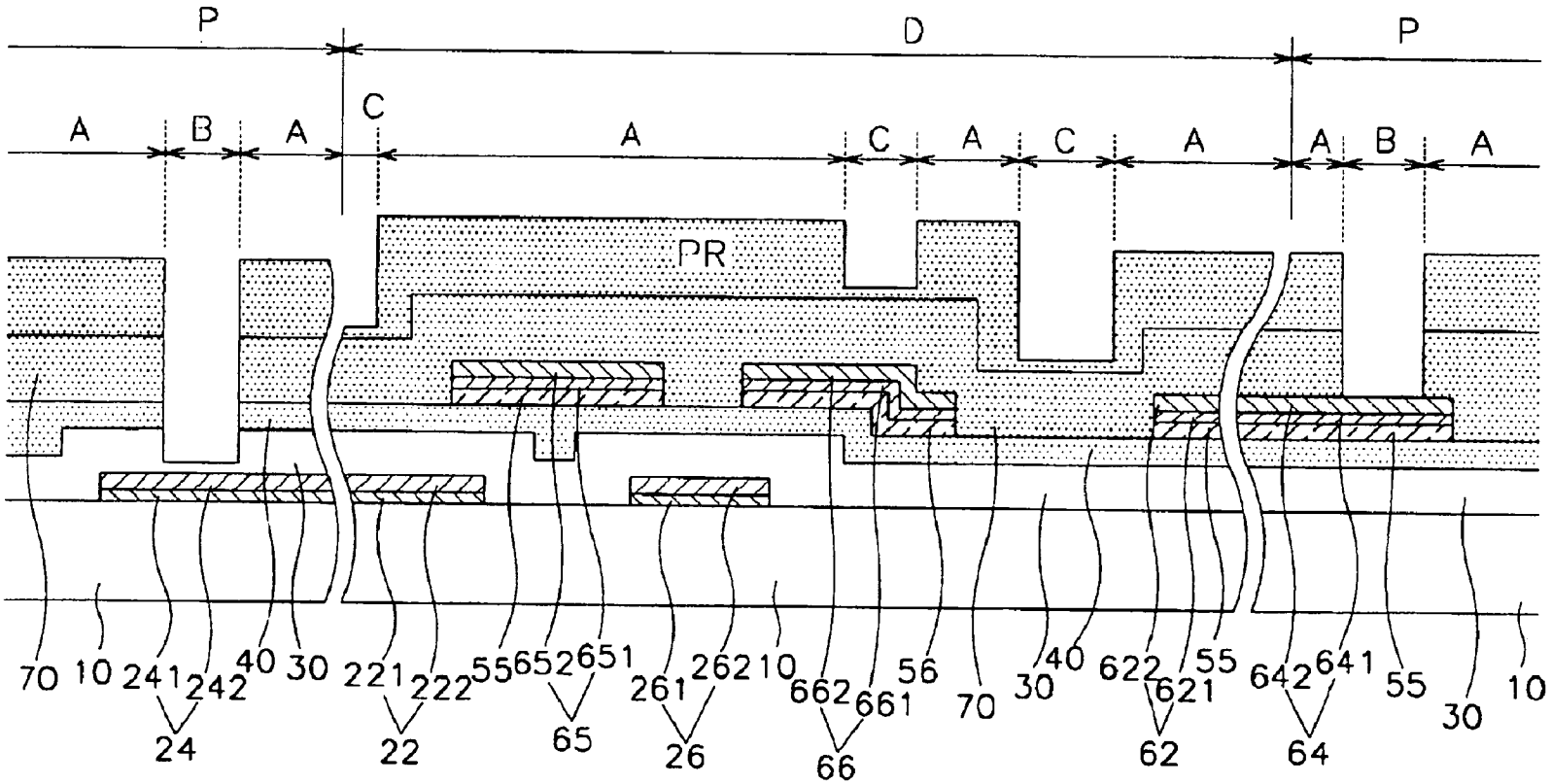
FIGS. 14A and 14B are cross sectional views of the TFT array substrate taken along the VIIIb-VIIIb' line and the VIIIc-VIIIc' line of FIG. 8A illustrating the step of etching some portions of a passivation layer.
Figure 14B:
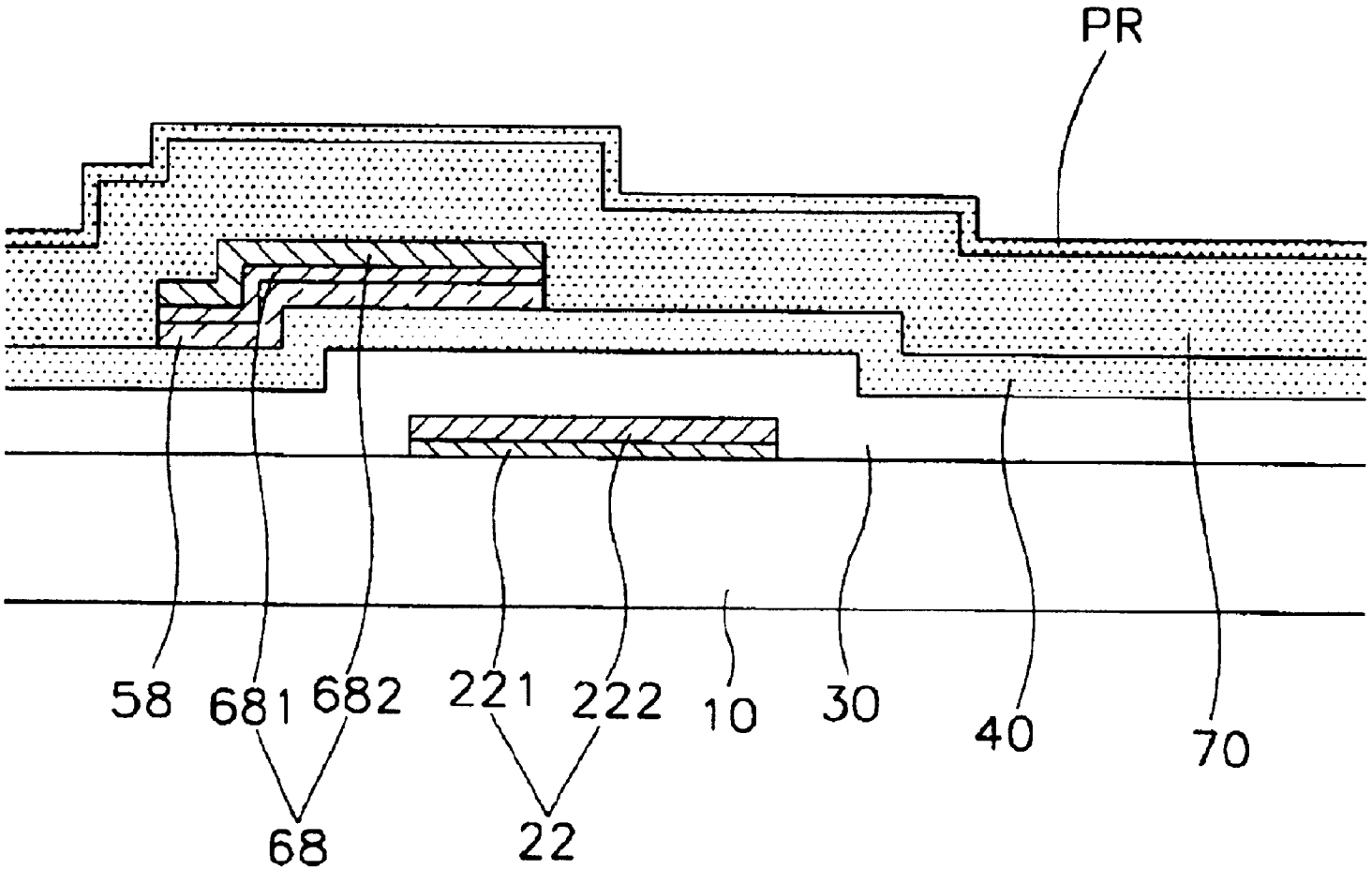

As shown in FIGS. 14A and 14B, the passivation layer 70 at the B portion of the photoresist film over the data pad 64 is dry-etched while exposing the data pad 64. The passivation layer and the underlying semiconductor layer 40 and gate insulating layer 30 at the B portion of the photoresist film over the gate pad 24 is dry-etched while partially leaving the gate insulating layer 30. At this time, the gate insulating layer 30 over the gate pad 24 may be completely removed while exposing the underlying gate pad 24. $SF_6$+$N_2$ or $SF_6$+HCL can be used for the dry etching, and the photoresist film PR at the display area D may be partially removed during the dry etching. Therefore, the consumption of the photoresist film PR should be controlled such that the passivation layer 70 at the display area D is not exposed to the outside. In this process, as shown in FIG. 14B, the thickness of the photoresist film PR over the conductive pattern 68 becomes reduced by as much as that of the photoresist film PR at the display area D.

Figure 15A:
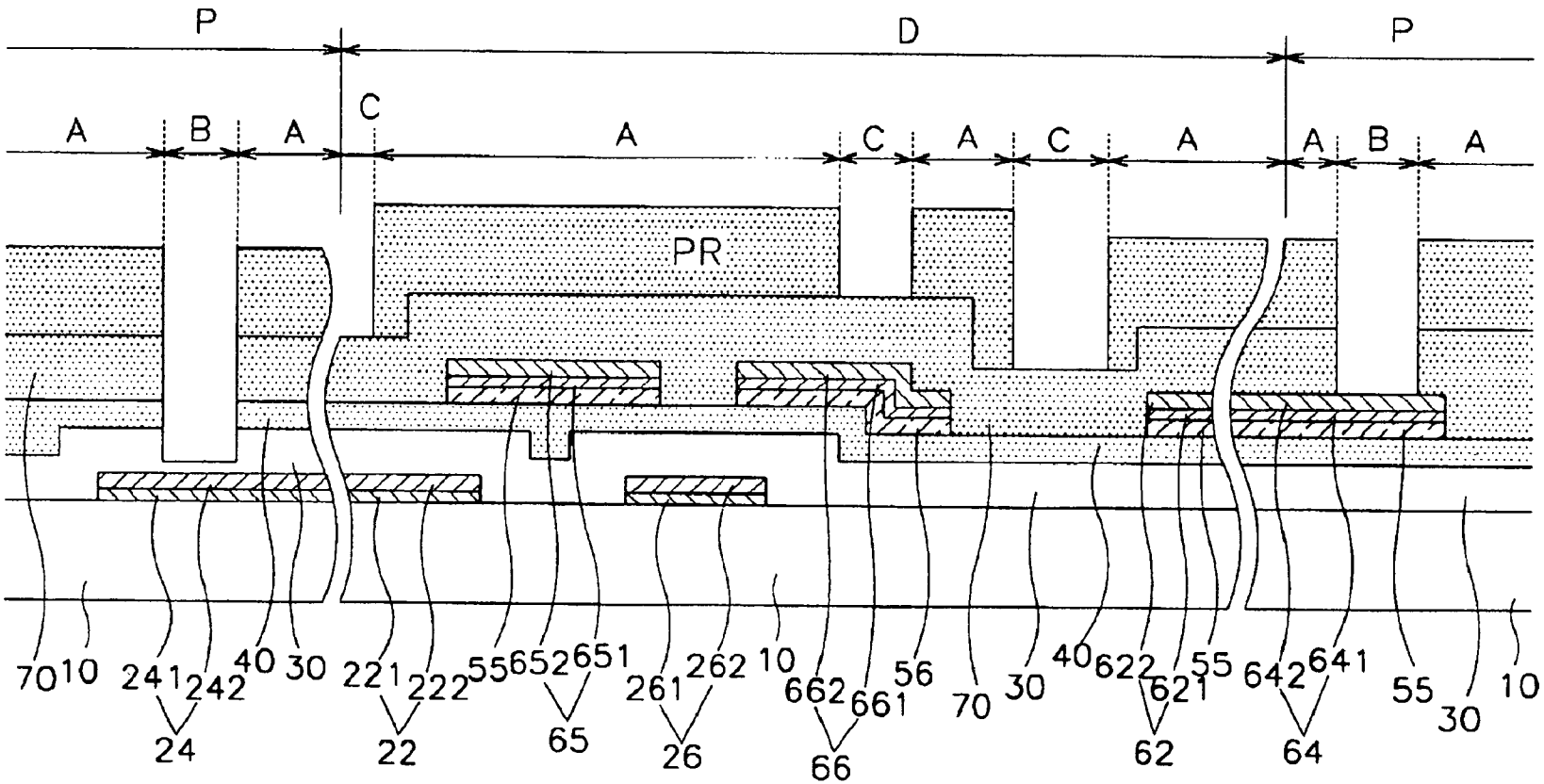
FIGS. 15A and 15B are cross sectional views of the TFT array substrate taken along the VIIIb-VIIIb' line and the VIIIc-VIIIc' line of FIG. 8A illustrating the step of ashing the etched portions of the passivation layer.
Figure 15B:
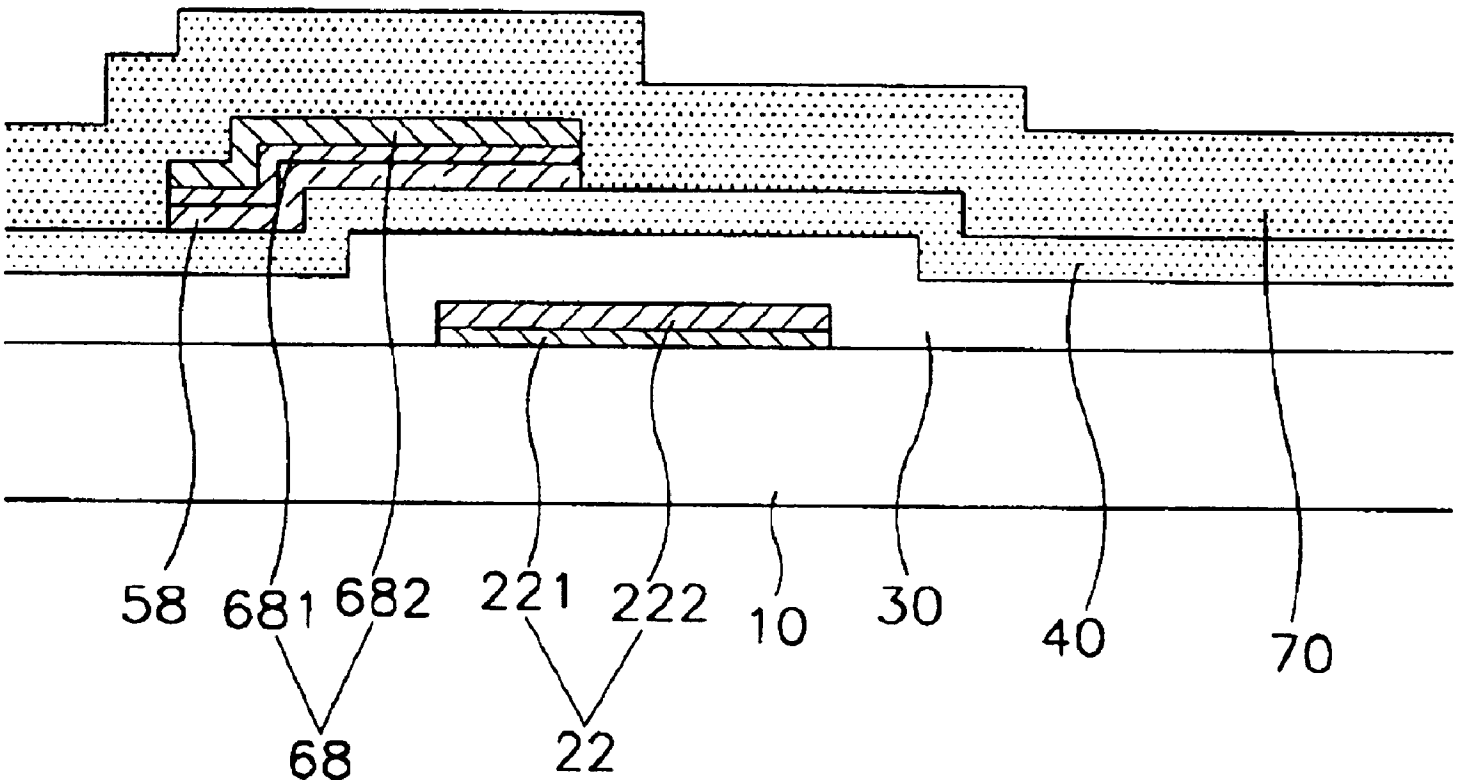

Thereafter, as shown in FIGS. 15A and 15B, the C portion of the photoresist film PR over the passivation layer 70 are removed through oxygen-based ashing. At this time, considering that the C portion of the photoresist film PR may be left with a non-uniform thickness, the ashing should be sufficiently performed by using $N_6$+$O_2$ or Ar+$O_2$. In this way, even though the C portion of the photoresist film is non-uniformly formed with a small thickness, it can be completely removed.

Figure 16A:
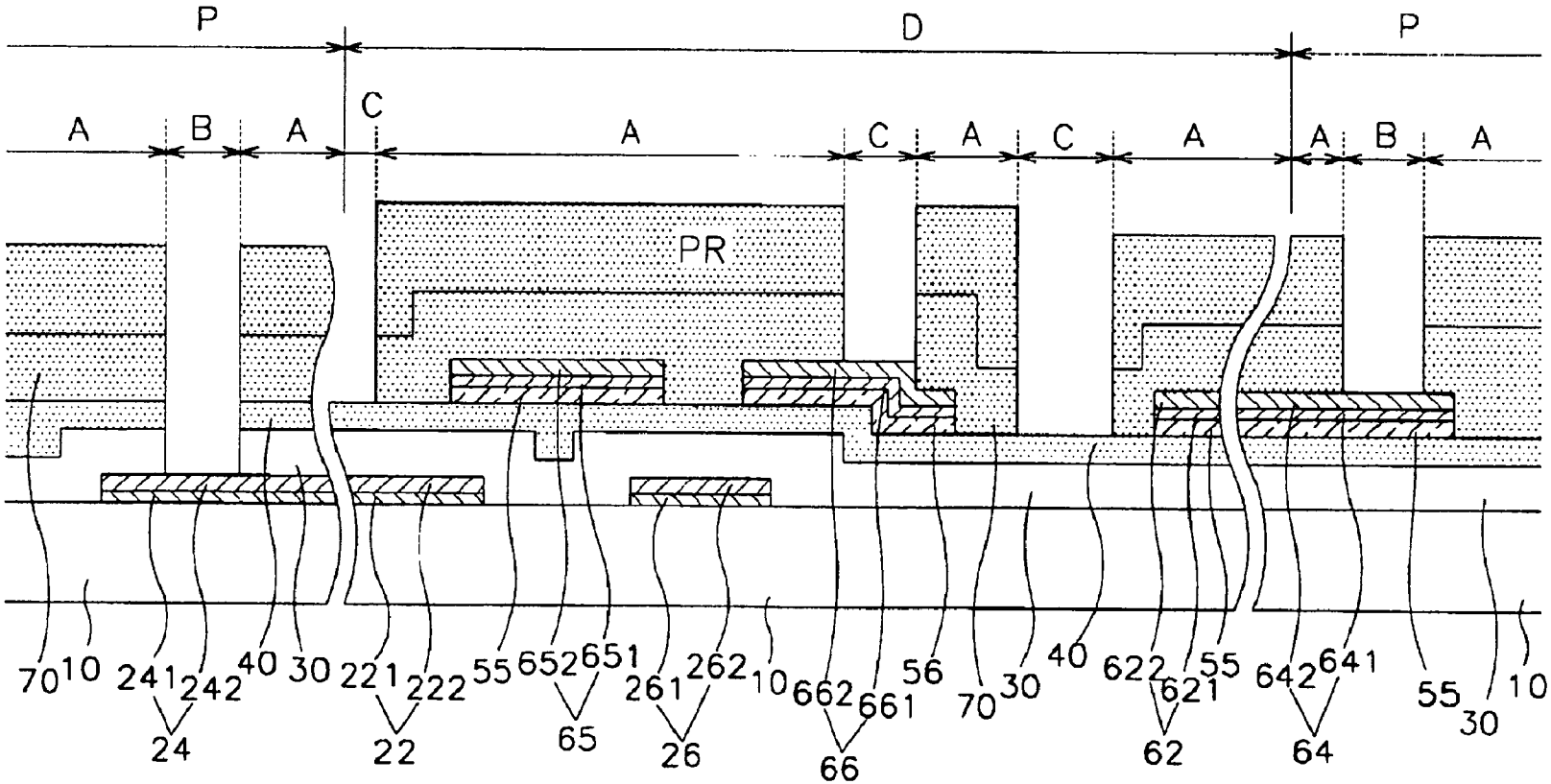
FIGS. 16A and 16B are cross sectional views of the TFT array substrate taken along the VIIIb-VIIIb' line and the VIIIc-VIIIc' line of FIG. 8A illustrating the step of etching other portions of the passivation layer.
Figure 16B:
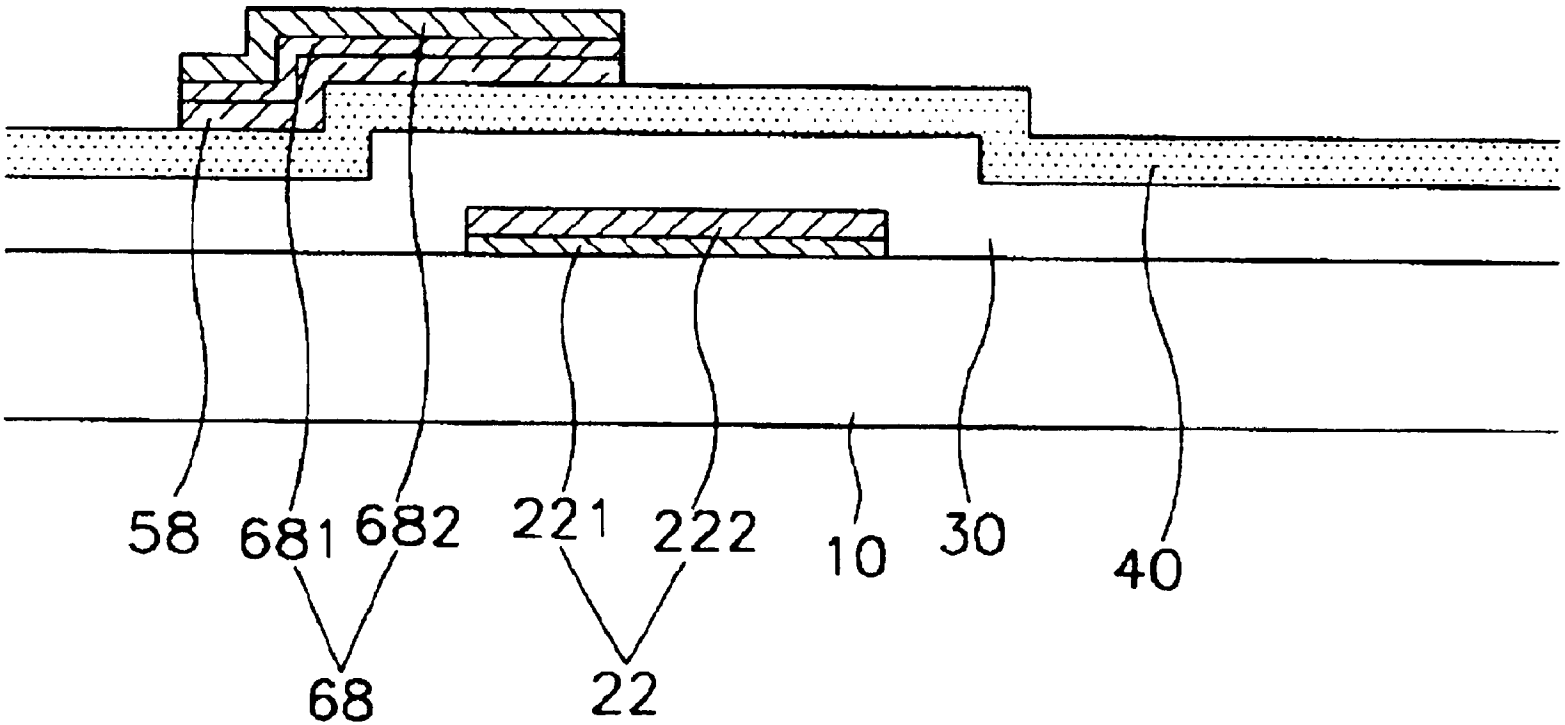

Thereafter, as shown in FIGS. 16A and 16B, the passivation layer 70 over the drain electrode 66, the pixel area and the conductive pattern 68 as well as the gate insulating layer 30 over the gate pad 24 are removed by using the photoresist pattern PR for a mask. In order to make etching conditions suitable for the semiconductor layer 40 and the passivation layer 70, the etching gas preferably contains large amount of $O_2$ or $CF_4$. $SF_6+N_2$, $SF_6+O_2$, $CF_4+O_2$ or $CF_4+CHF_3+O_2$ are preferably used for the dry etching.

Figure 17A:
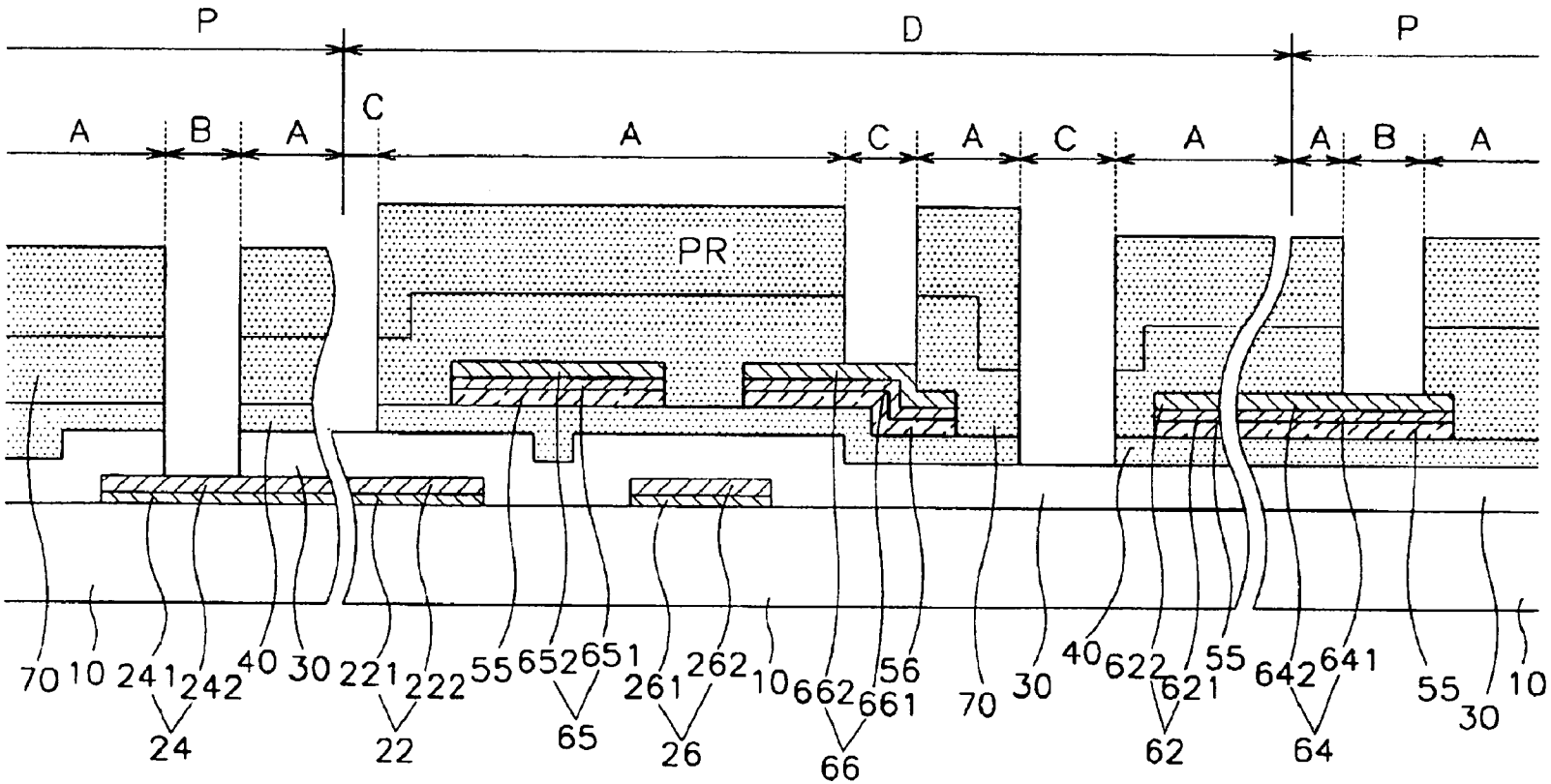
FIGS. 17A and 17B are cross sectional views of the TFT array substrate taken along the VIIIb-VIIIb' line and the VIIIc-VIIIc' line of FIG. 8A illustrating the step of forming a semiconductor pattern.
Figure 17B:
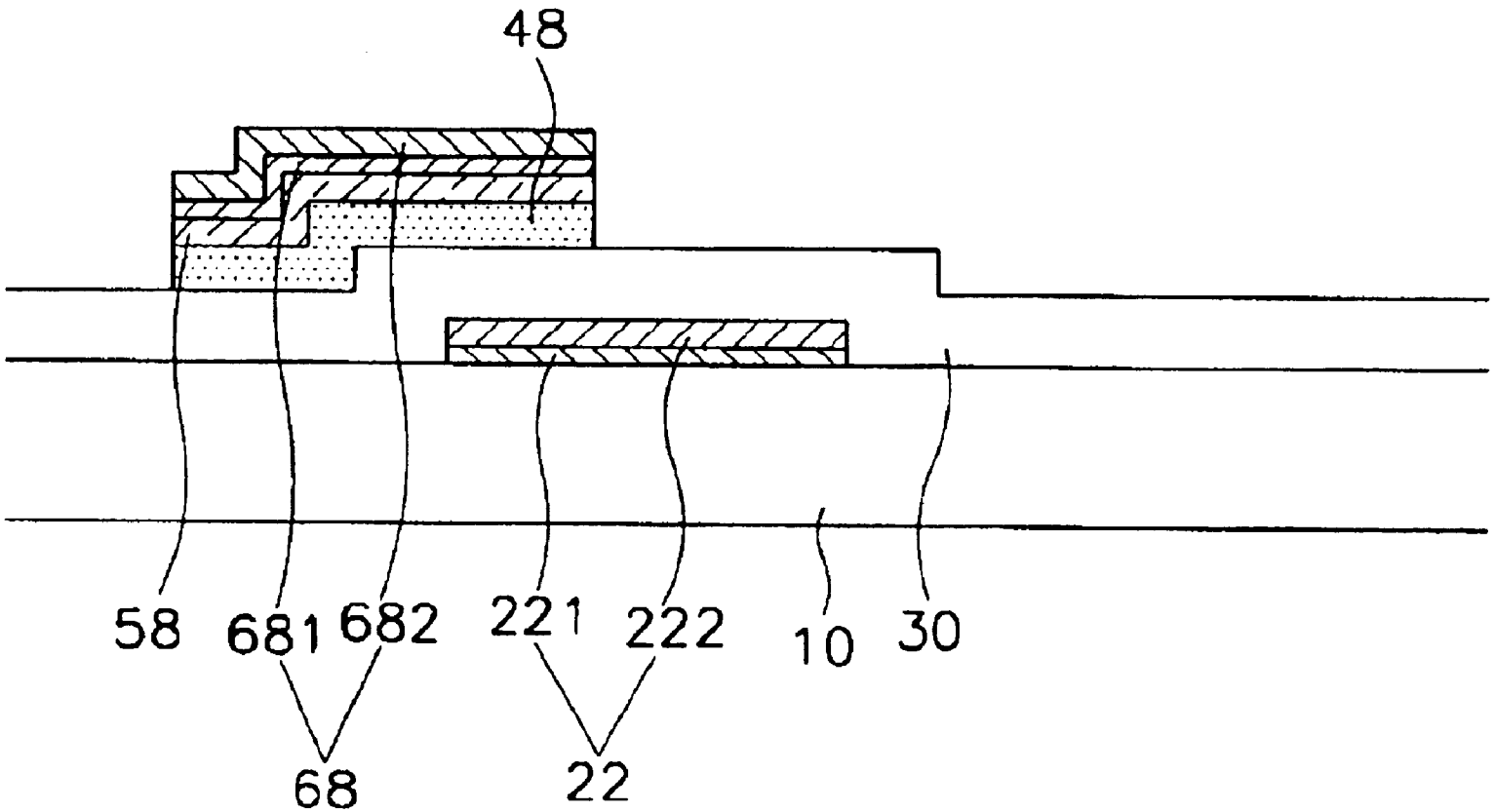

As shown in FIGS. 17A and 17B, the semiconductor layer 40 between the neighboring data lines 62 is removed by etching, to complete the semiconductor patterns 42 and 48. $Cl_2+O_2$ or $SF_6+HCl+O_2+Ar$ is preferably used for etching the semiconductor layer 40.

Thereafter, as shown in FIGS. 4 and 5, the upper layer 242 of the gate pad 24, the upper layer 662 of the drain electrode 66, the upper layer 642 of the data pad 64, and the upper layer 682 of the conductive pattern 68 exposed to the outside are removed through dry-etching or wet-etching, and the remaining photoresist film PR is also removed. An ITO or IZO film is deposited onto the substrate 10, and etched through a fourth mask. Consequently, a pixel electrode 82, a supplemental gate pad 84 and a supplemental data pad 86 are formed while contacting the lower layer 661 of the drain electrode 66, the lower layer 241 of the gate pad 24, and the lower layer 641 of the data pad 64, respectively.

As described above, in this preferred embodiment, the semiconductor patterns 42 and 48 together with the contact windows 71 to 73 is formed through one masking process and the desired TFT array substrate can be fabricated using only four masks. Furthermore, multiple etching can be uniformly performed on a large target area with different depth. In addition, the data or gate line assembly may have a double-layered structure with a low-resistance aluminum-based layer, eliminating poor contact characteristics of an aluminum-based layer at the pad portions.

In the meantime, when the upper layer 662 of the drain electrode 66, and the upper layer 642 of the data pad 64 are etched, over-etching is liable to occur inside of the edge of the passivation layer 70. In this case, the ITO or IZO film pattern for the pixel electrode 82 at the over-etched portion may be broken.

Second Preferred Embodiment

FIGS. 18 to 23 illustrate a method for fabricating a TFT array substrate according to a second preferred embodiment of the present invention. In this preferred embodiment, the processing steps are the same as those related to the first preferred embodiment up to the step of depositing the passivation layer 70 onto the substrate 10.

Figure 18:
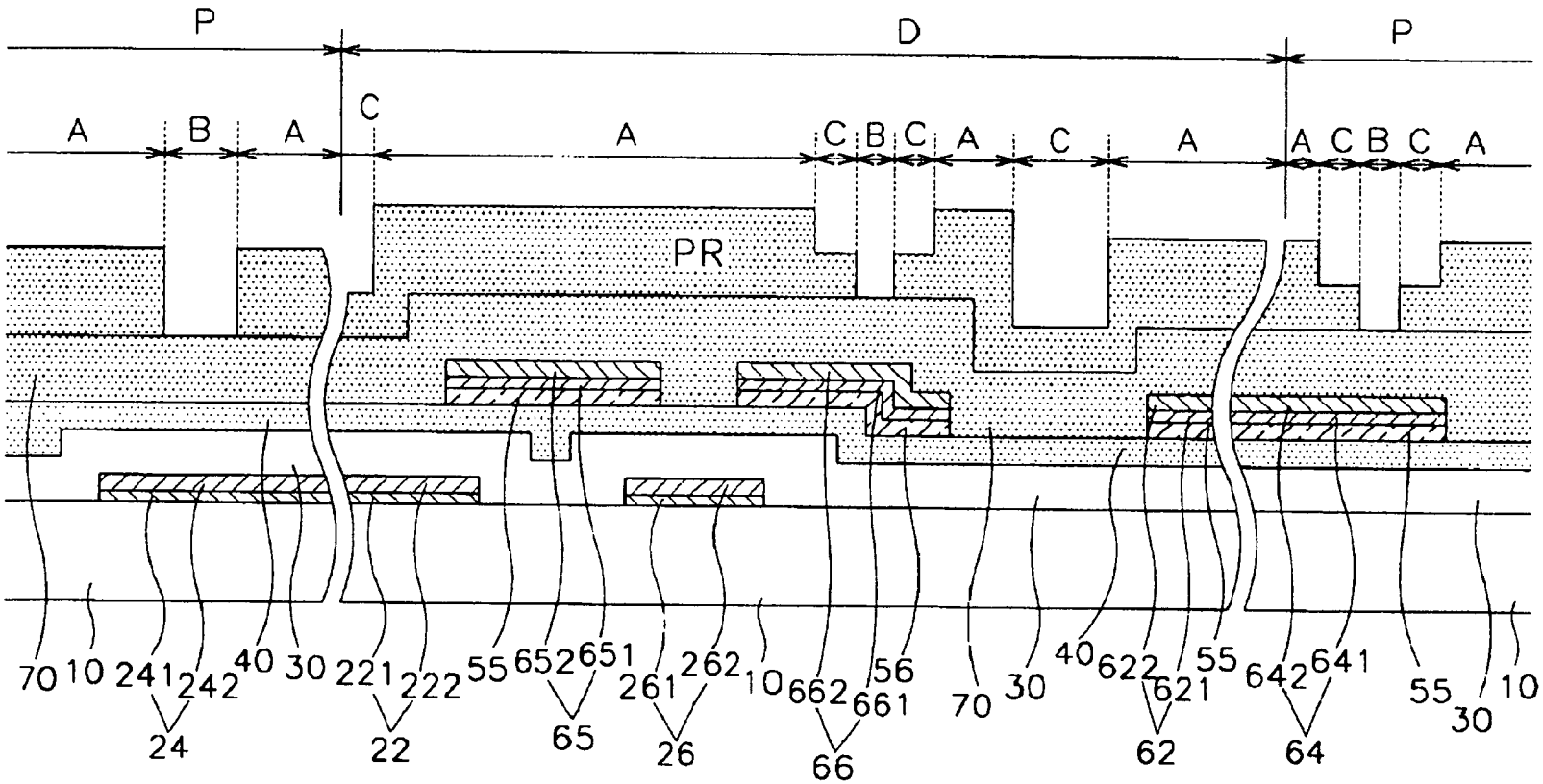
FIGS. 18 to 23 are cross sectional views illustrating the steps of fabricating a TFT array substrate in a sequential manner according to a second preferred embodiment of the present invention.

As shown in FIG. 18, a photoresist film PR is coated onto the passivation layer 70. The photoresist film PR is exposed to light through a third mask, and developed to form a photoresist pattern. That is, the portion B of the photoresist film PR over the gate pad 24, data pad 64 and drain electrode 66 is completely removed. The portion C of the photoresist film PR adjacent to the portion B over the drain electrode 66 and the data pad 64 and positioning at the pixel area is partially removed such that it has a small thickness. The remaining portion A of the photoresist film PR is left without being consumed.

Figure 19:
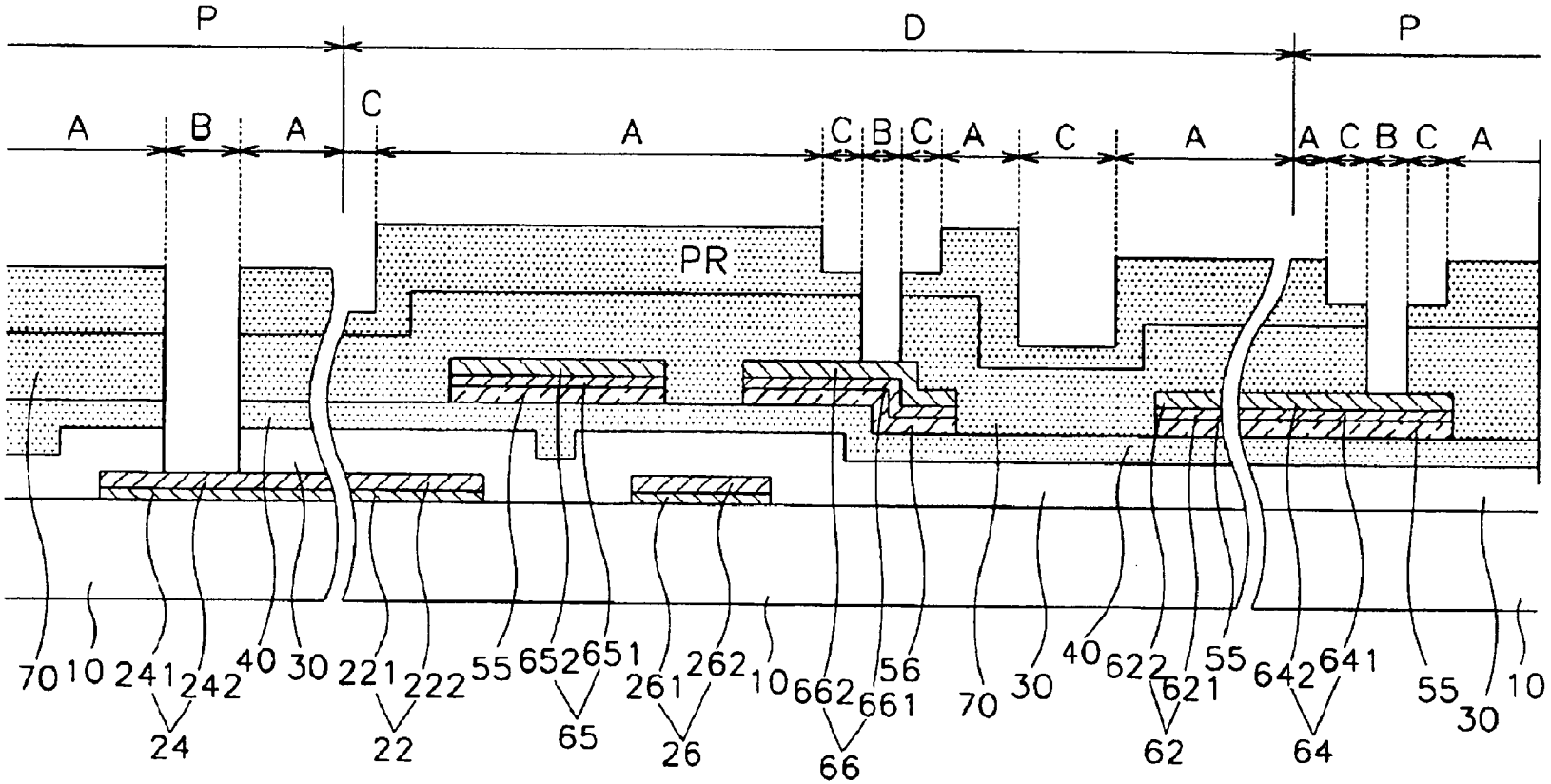

Thereafter, as shown in FIG. 19, the passivation layer 70, the semiconductor layer 40 and the gate insulating layer 30 at the B portion of the photoresist film PR are dry-etched such that the gate pad 24, the drain electrode 66 and the data pad 64 are exposed to the outside.

In this process, the A portion of the photoresist film PR may be partially removed.

Figure 20:
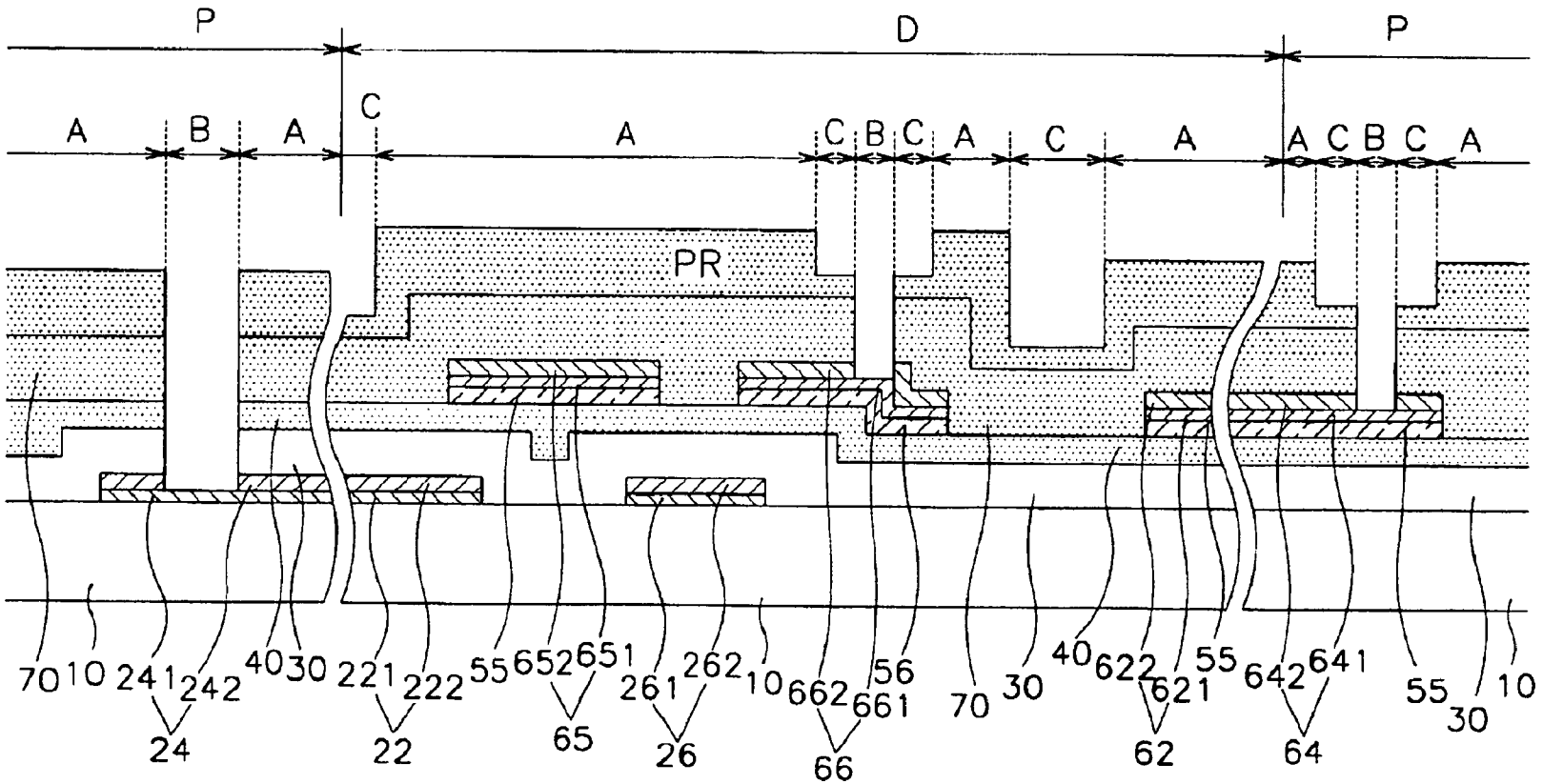

Then, as shown in FIG. 20, the upper layer 242 of the gate pad 24, the upper layer 662 of the drain electrode 66 and the upper layer 642 of the data pad 64 are dry or wet-etched such that the lower layers 241, 661 and 641 are exposed. The thin photoresist film PR over the drain electrode 66, the pixel area and the data pad 64 are removed through oxygen-based ashing to expose the underlying passivation layer 70.

Figure 21:
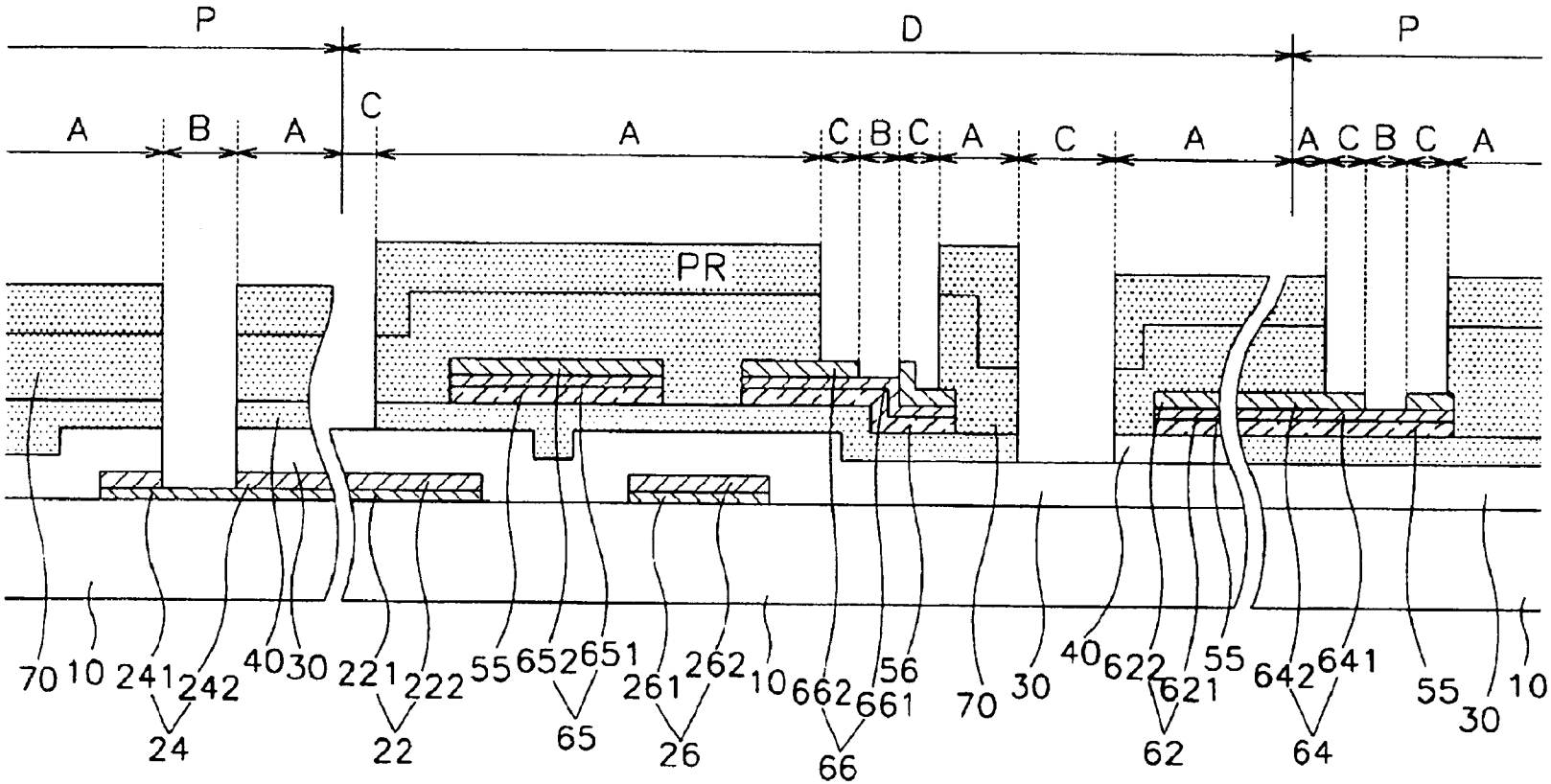

As shown in FIG. 21, the exposed passivation layer 70 over the drain electrode 66 and the data pad 64 is dry-etched such that the upper layer 662 of the drain electrode 66 and the upper layer 642 of the data pad 64 are exposed to the outside through the contact windows 71 and 73. At this time, the passivation layer 70 at the pixel area and the underlying semiconductor layer 40 are also removed to complete semiconductor patterns 42 and 48.

Figure 22:
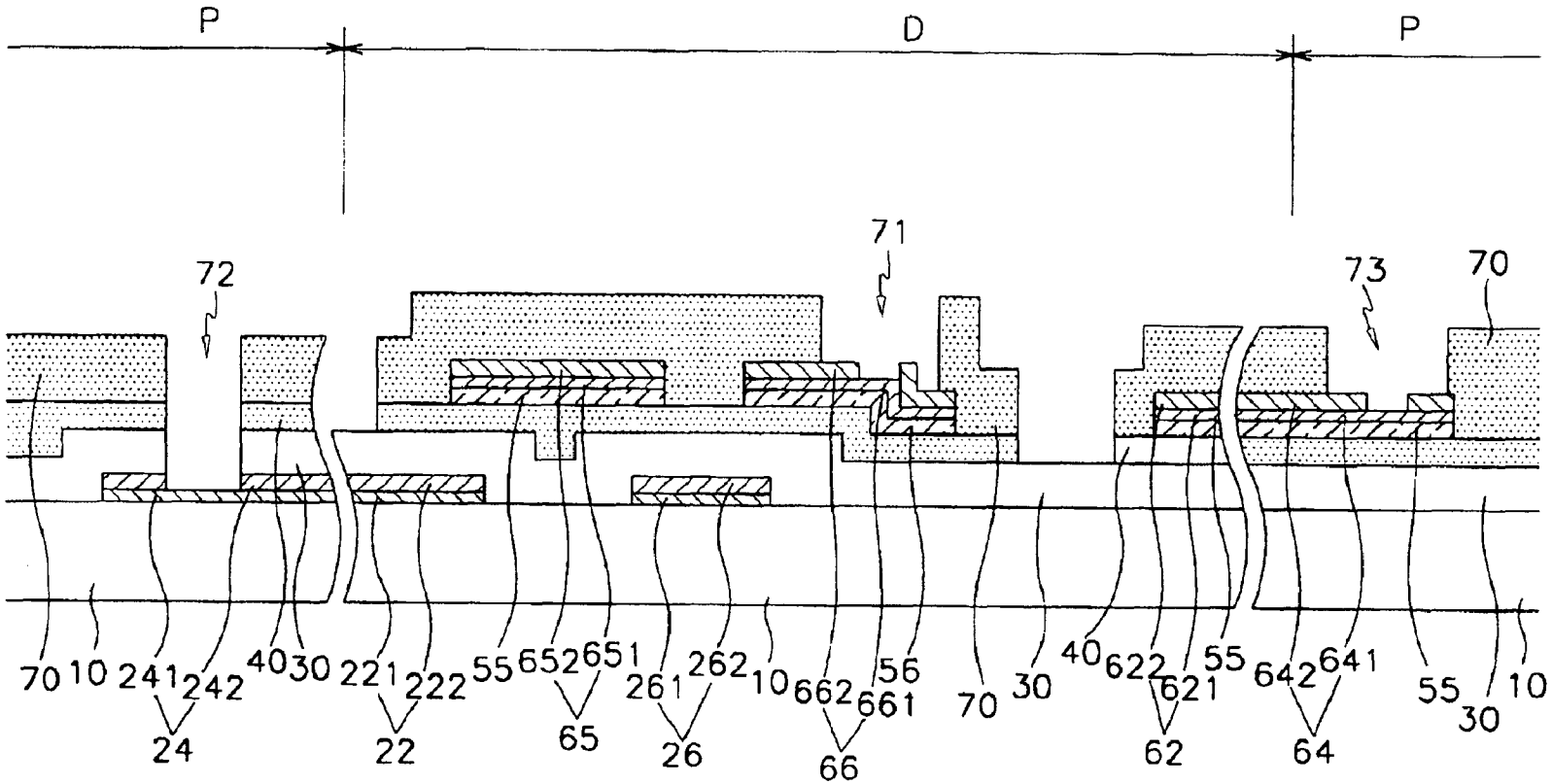

As shown in FIG. 22, the remaining photoresist film PR is removed to complete the contact windows 71, 72 and 73.

Figure 23:
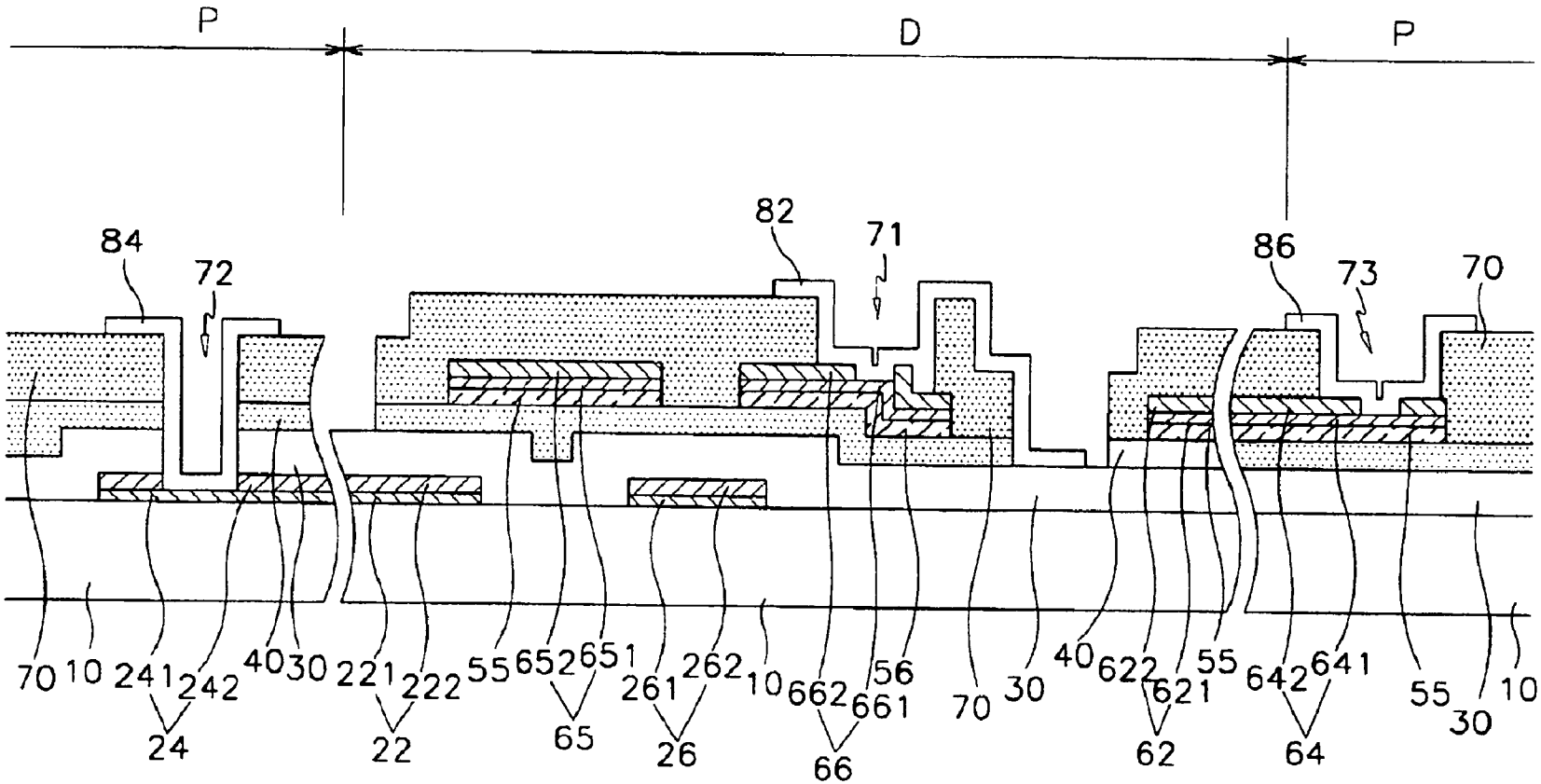

As shown in FIG. 23, an ITO or IZO film is deposited onto the entire surface of the substrate 10, and etched through a fourth mask. As a result, a subsidiary gate pad 84, a pixel electrode 82 and a subsidiary data pad 86 are formed while contacting the lower layer 241 of the gate pad 24, the lower layer 661 of the drain electrode 66 and the lower layer 641 of the data pad 64, respectively.

As described above, in this preferred embodiment, the semiconductor patterns 42 and 48 together with the contact windows 71 to 73 is formed through one masking process so that the desired TFT array substrate can be fabricated using only four mask. Furthermore, multiple etching can be uniformly performed on large target areas with different depth. In addition, the data or gate line assembly may have a double-layered structure with a low-resistance aluminum-based layer, not showing poor contact characteristics of an aluminum-based layer at the pad portions.

Furthermore, removing the passivation layer 70 after removing the upper layer 662 of the drain electrode 66 and the upper layer 642 of the data pad 64 eliminates the problem of over-etching the upper layers 662 and 642. Therefore, the pixel electrode 82 and the subsidiary data pad 86 at the contact windows 71 and 73 can be prevented from breaking. In addition, the above structure can mitigate the height differences of the components at the contact windows 71 to 73.

Third Preferred Embodiment

FIGS. 24 to 29 illustrate the steps of fabricating a TFT array substrate according to a third preferred embodiment of the present invention where a photosensitive organic layer is used for the passivation layer. In this preferred embodiment, the processing steps are similar to those related to the first preferred embodiment prior to the step of depositing a passivation layer onto the substrate 10.

Figure 24:
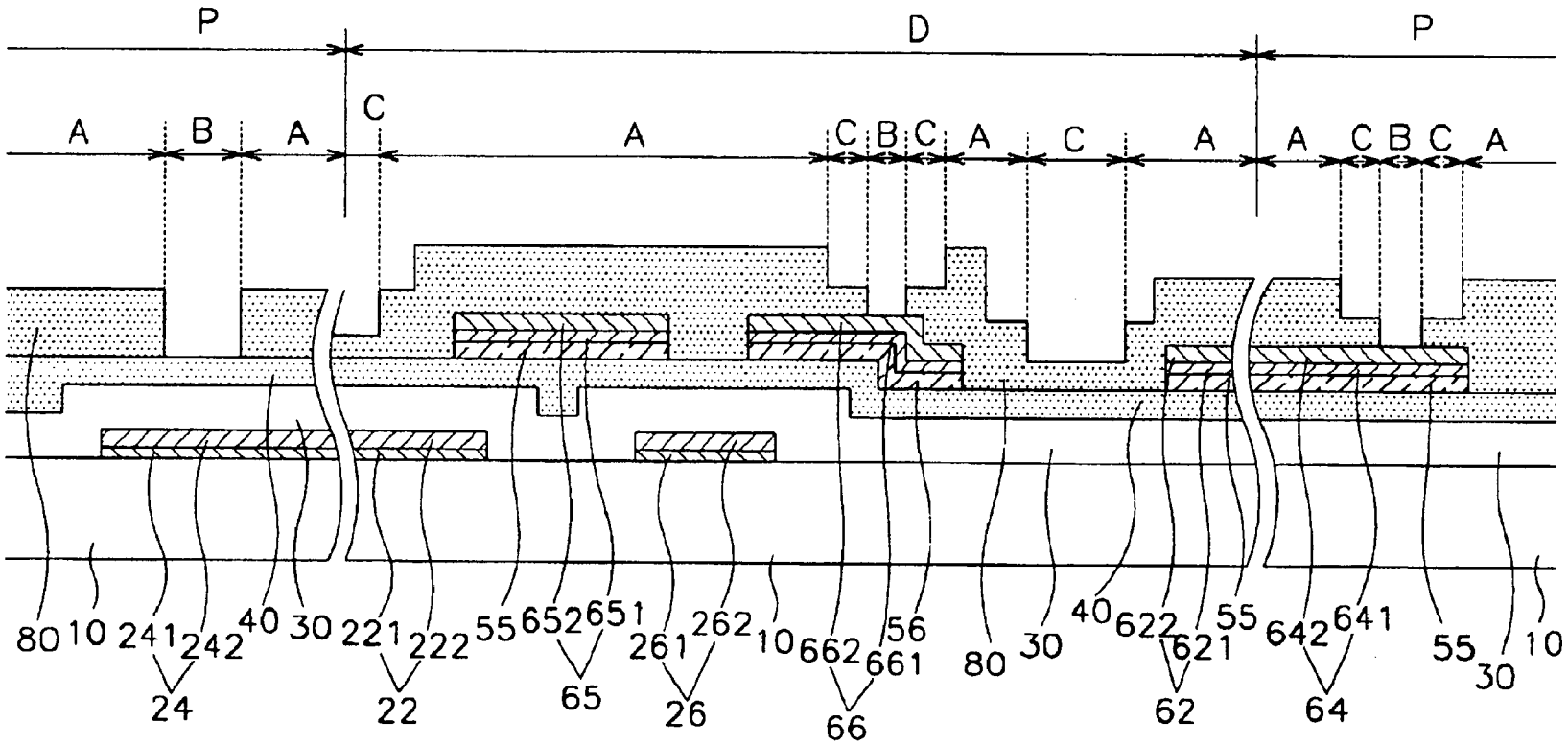
FIGS. 24 to 29 are cross sectional views illustrating the steps of fabricating a TFT array substrate in a sequential manner according to a third preferred embodiment of the present invention.

As shown in FIG. 24, a photosensitive passivation layer 80 of a photosensitive organic material is deposited onto the substrate 10 to a thickness of 3,000 Å. The photosensitive passivation layer 80 is then exposed to light through a third mask, and developed to form a photoresist pattern. That is, the portion B of the photosensitive passivation layer 80 over the gate pad 24, the data pad 64 and the drain electrode 66 is completely removed. The portion C of the photosensitive passivation layer 80 adjacent to the portion B over the drain electrode 66 and the data pad 64 and positioned at the pixel area is partially removed such that it has a small thickness. The remaining portion A of the photosensitive passivation layer 80 is left intact.

Figure 25:
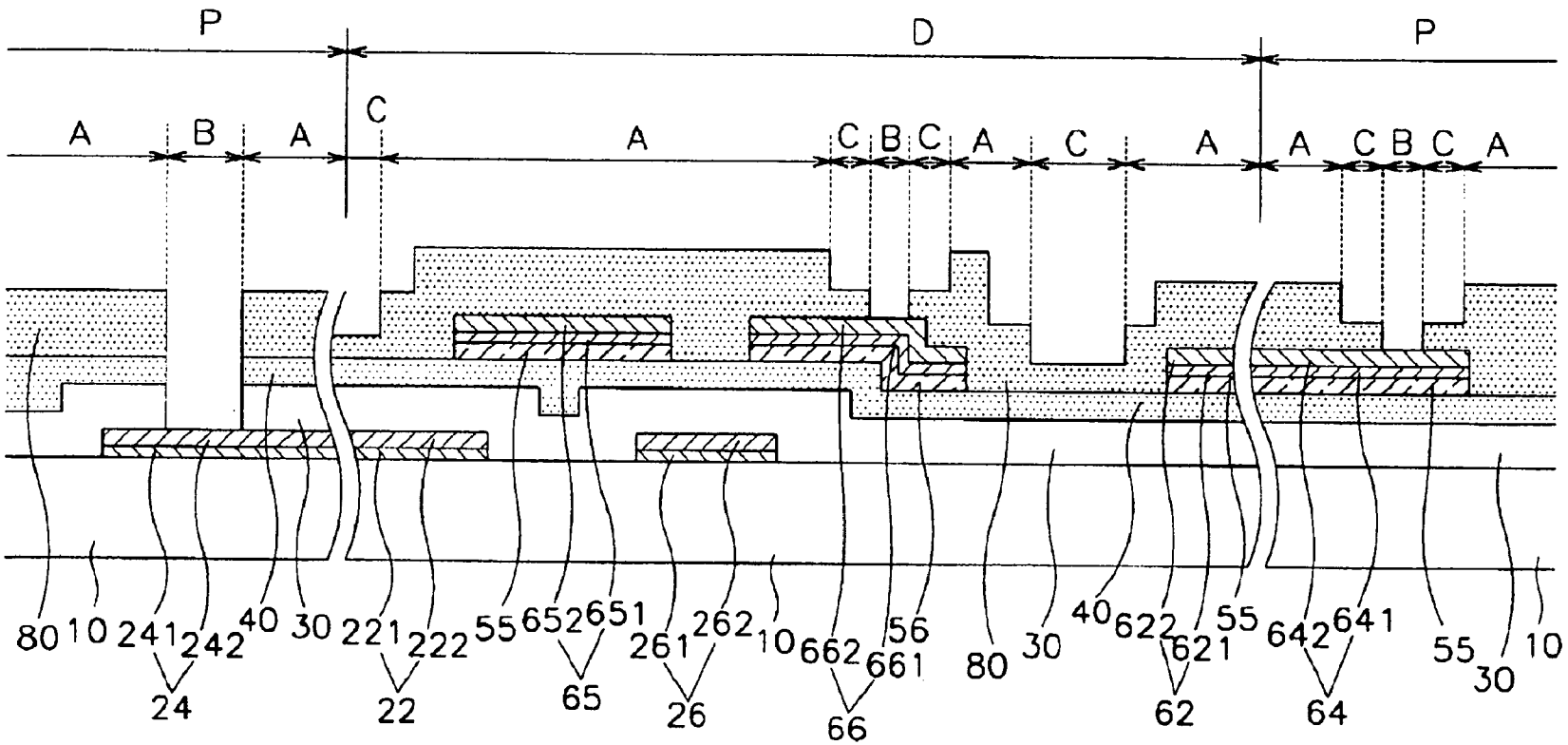

Thereafter, as shown in FIG. 25, passivation the semiconductor layer 40 and the gate insulating layer 30 are dry-etched through the removed portion B of the photosensitive passivation layer 80 exposing the gate pad 24, the drain electrode 66 and the data pad 64.

Figure 26:
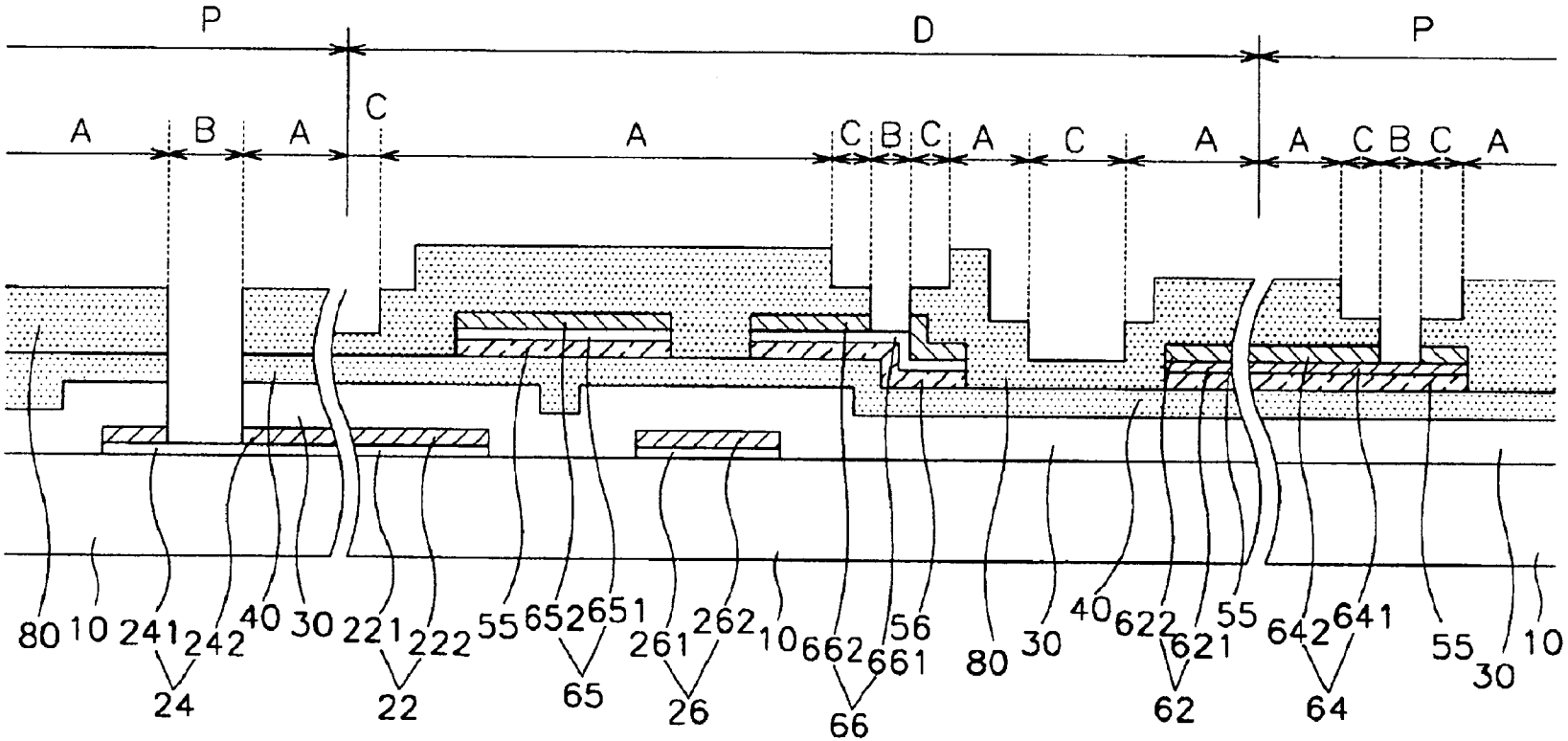

Then, as shown in FIG. 26, the upper layer 242 of the gate pad 24, the upper layer 662 of the drain electrode 66 and the upper layer 642 of the data pad 64 are dry or wet-etched exposing the lower layers 241, 661 and 641.

Figure 27:
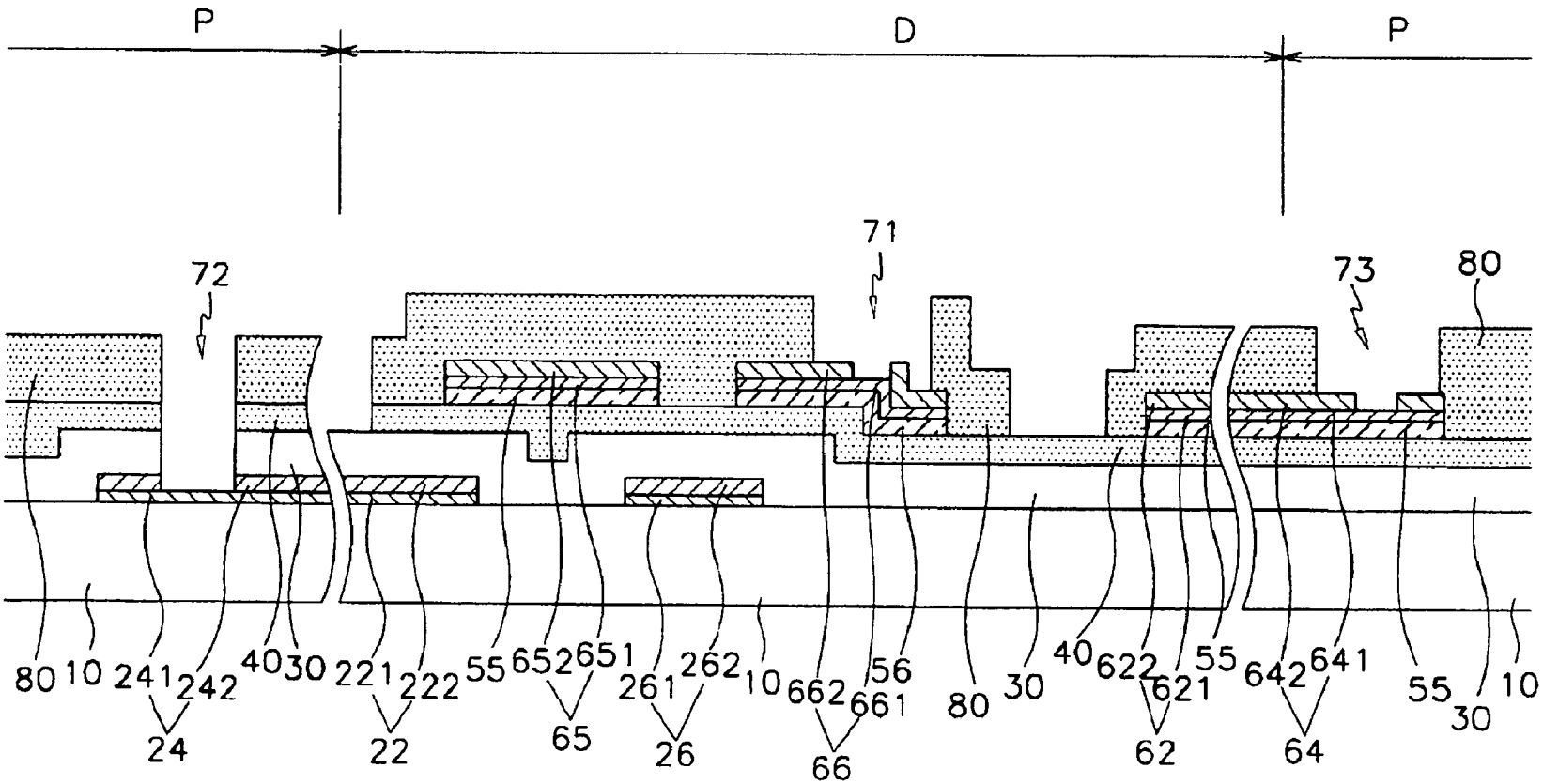

As shown in FIG. 27, the thin photosensitive passivation layer 80 remaining over the drain electrode 66 and the data pad 64 is removed through oxygen-based aching to expose the upper layer 662 of the drain electrode 66 and the upper layer 642 of the data pad 64 to the outside through the contact windows 71 and 73. At this time, the thin photosensitive passivation layer 80 remaining at the pixel area is also removed to expose the underlying semiconductor layer 40.

Figure 28:
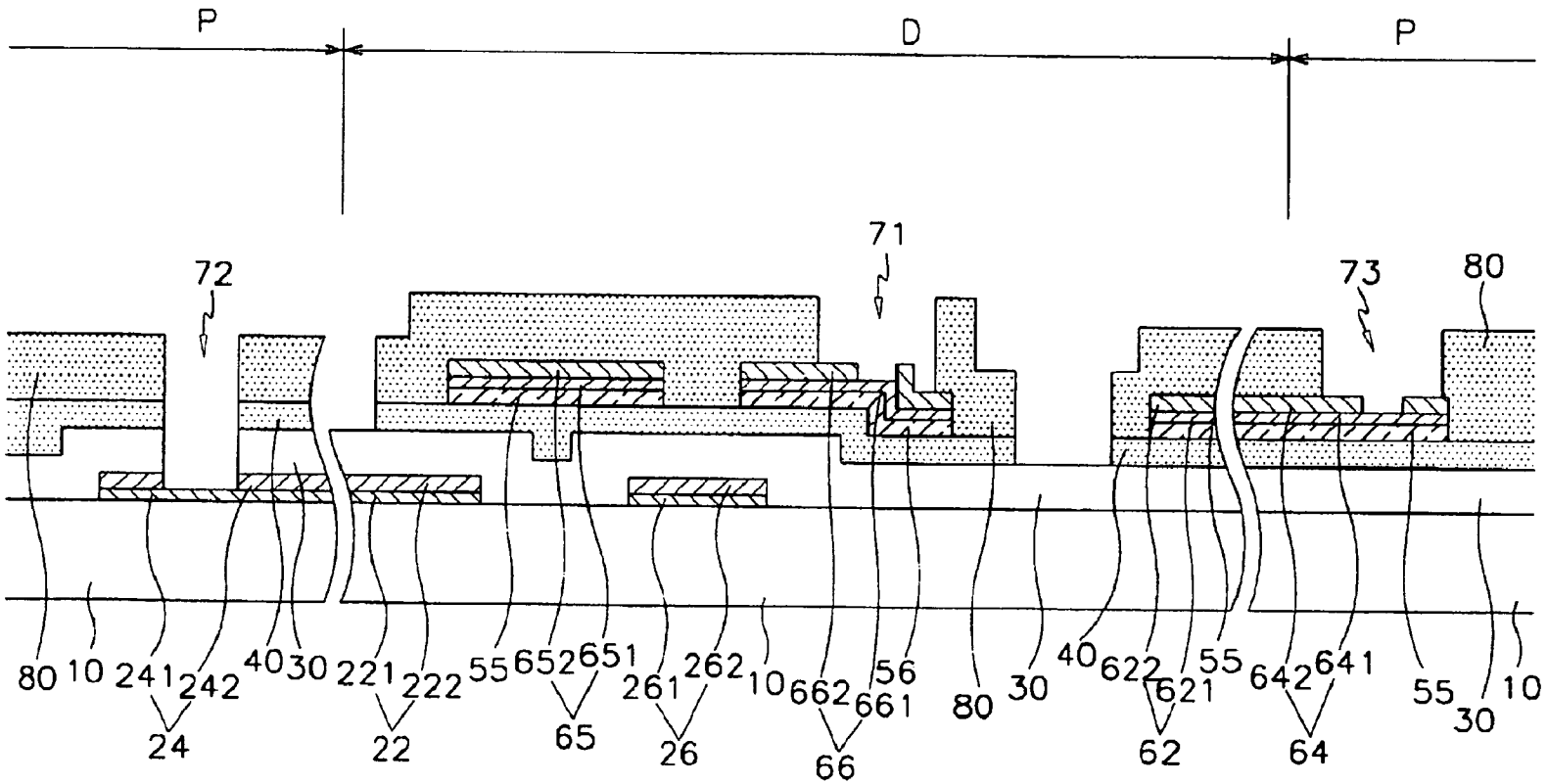

As shown in FIG. 28, the exposed semiconductor layer 40 is dry-etched to complete semiconductor patterns 42 and 48.

Figure 29:
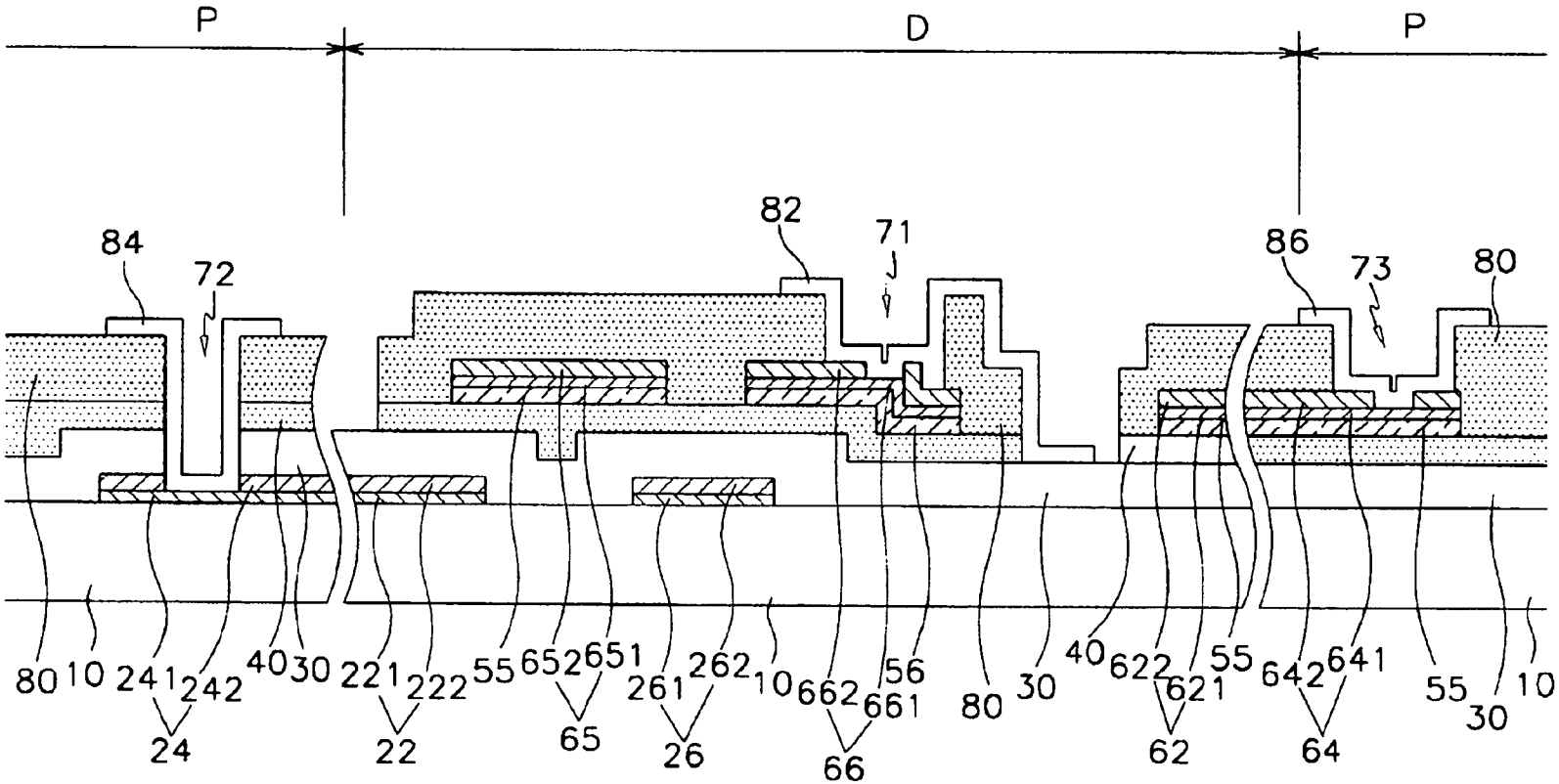

As shown in FIG. 29, an ITO or IZO film is deposited onto the entire surface of the substrate 10, and etched through a fourth mask. As a result, a supplemental gate pad 84, a pixel electrode 82 and a subsidiary data pad 86 are completed while contacting the lower layer 241 of the gate pad 24, the lower layer 661 of the drain electrode 66 and the lower layer 641 of the data pad 64, respectively.

This preferred embodiment, in addition to the advantages related to the previous preferred embodiments, simplifies the processing steps because the separate steps of processing a photoresist film after the formation of the passivation layer are not necessary.

Fourth Preferred Embodiment

FIGS. 30A to 37B illustrate the steps of fabricating a TFT array substrate according to a fourth preferred embodiment of the present invention. In this preferred embodiment, other components and structures of the TFT array substrate are similar to those related to the first preferred embodiment except that a single layered structure is used for the gate and data line assemblies, the conductive pattern 68 for the storage capacitor is eliminated, and an opening portion 31 is formed between the pixel electrode 82 and the data line 62 while exposing the substrate 10. The gate and data line assemblies having a single layered structure of a metallic or conductive material such as Al, Al alloy, Mo, Mo—W alloy, Cr, and Ta are formed to a thickness of 1,000-4,000 Å. The opening portion 31 is to prevent a short circuit between the pixel electrode 82 and the data line 62 occurring when the semiconductor pattern 42 is over-extended toward the periphery of the data line 62, and connected to the data line 62.

In the method of fabricating the TFT array substrate according to the fourth preferred embodiment, the processing steps are similar as those related to the first preferred embodiment up to the step of depositing the passivation layer onto the substrate except that the gate and data line assemblies are formed with a single layered structure.

Figure 30A:
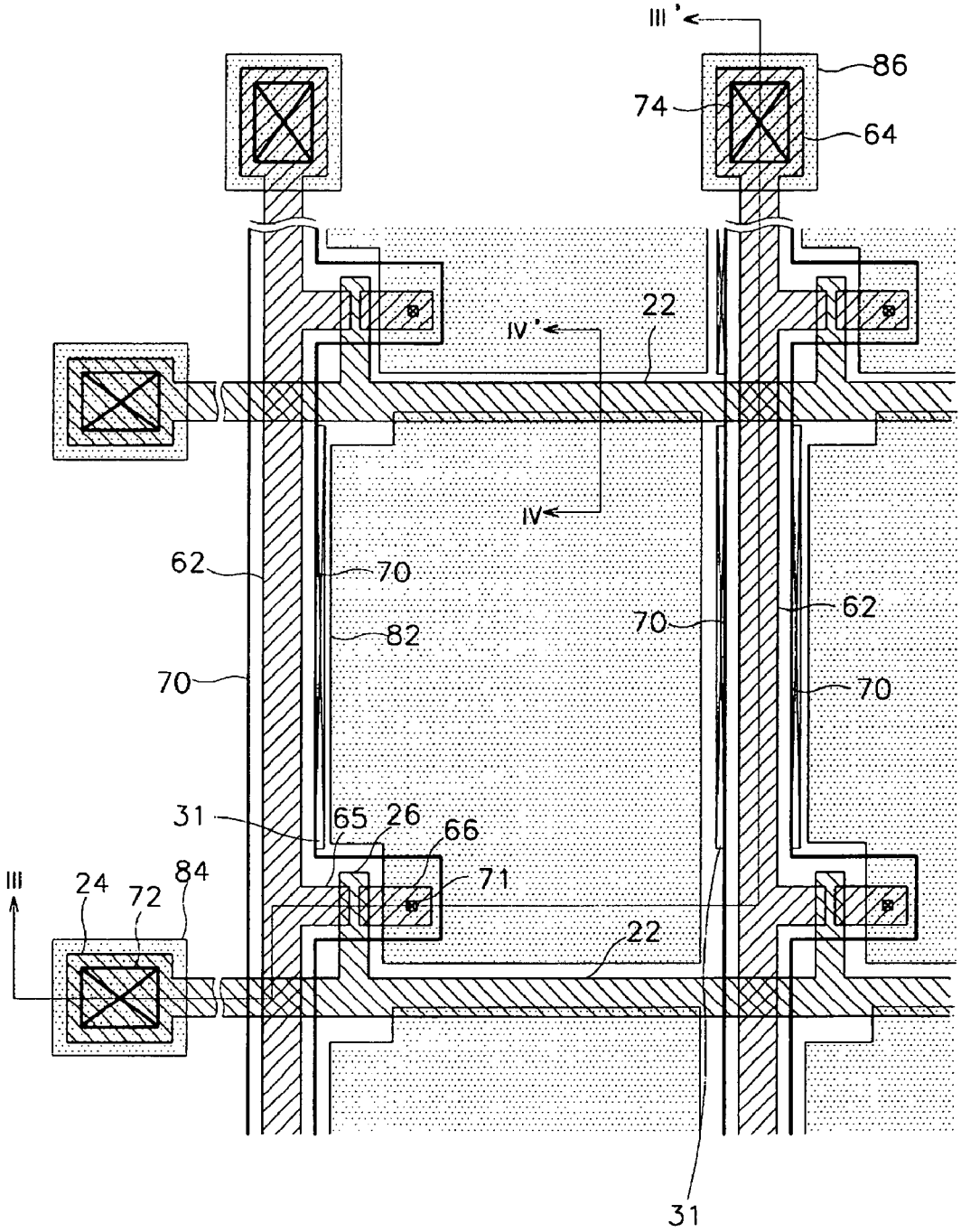
FIG. 30A is a plan view of a TFT array substrate according to a fourth preferred embodiment of the present invention.
Figure 30B:
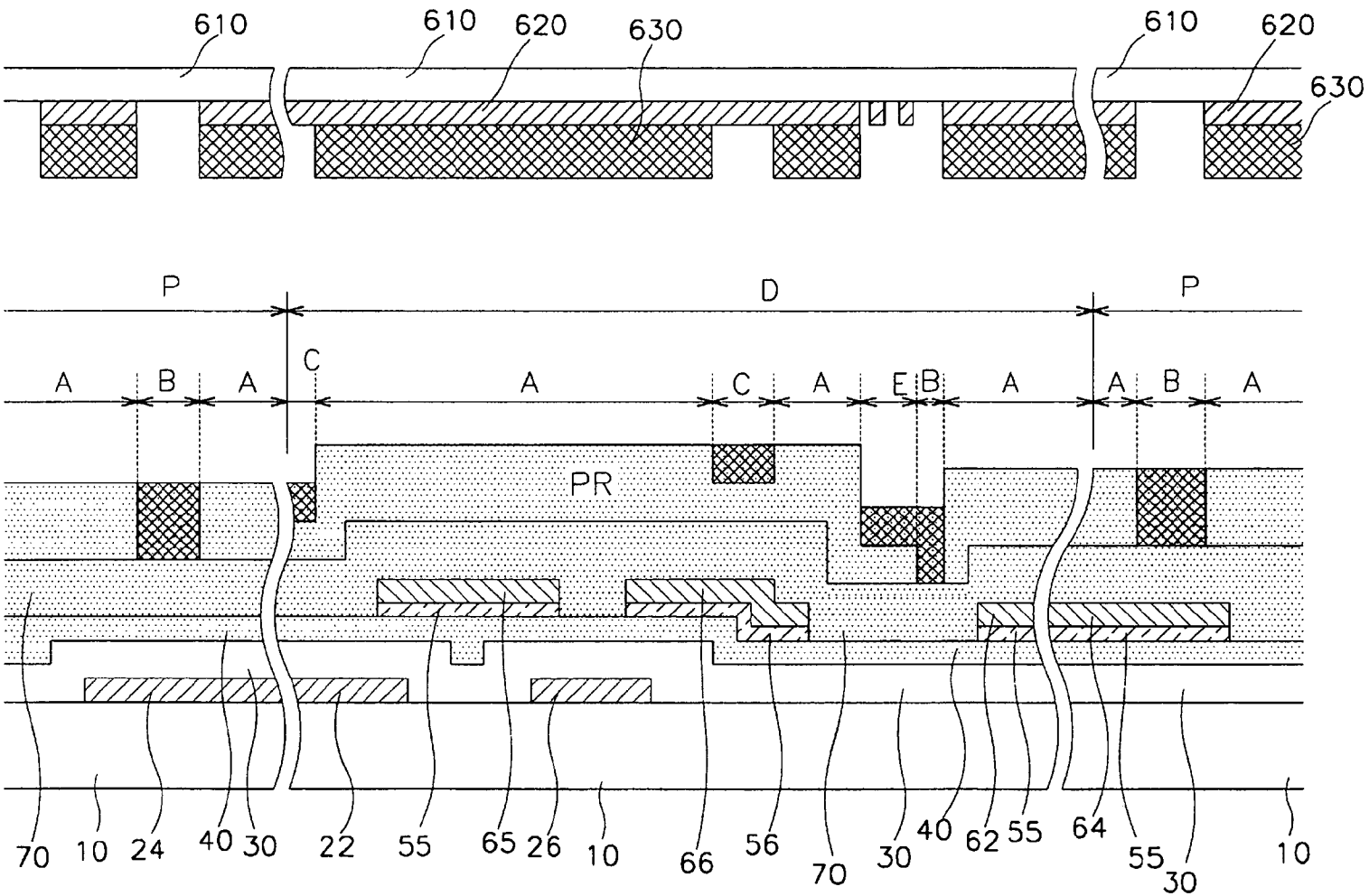
FIGS. 30B and 30C are cross sectional views of the TFT array substrate taken along the III-III' line and the IV-IV' line of FIG. 30A illustrating the step of exposing a photoresist film to light.
Figure 30C:
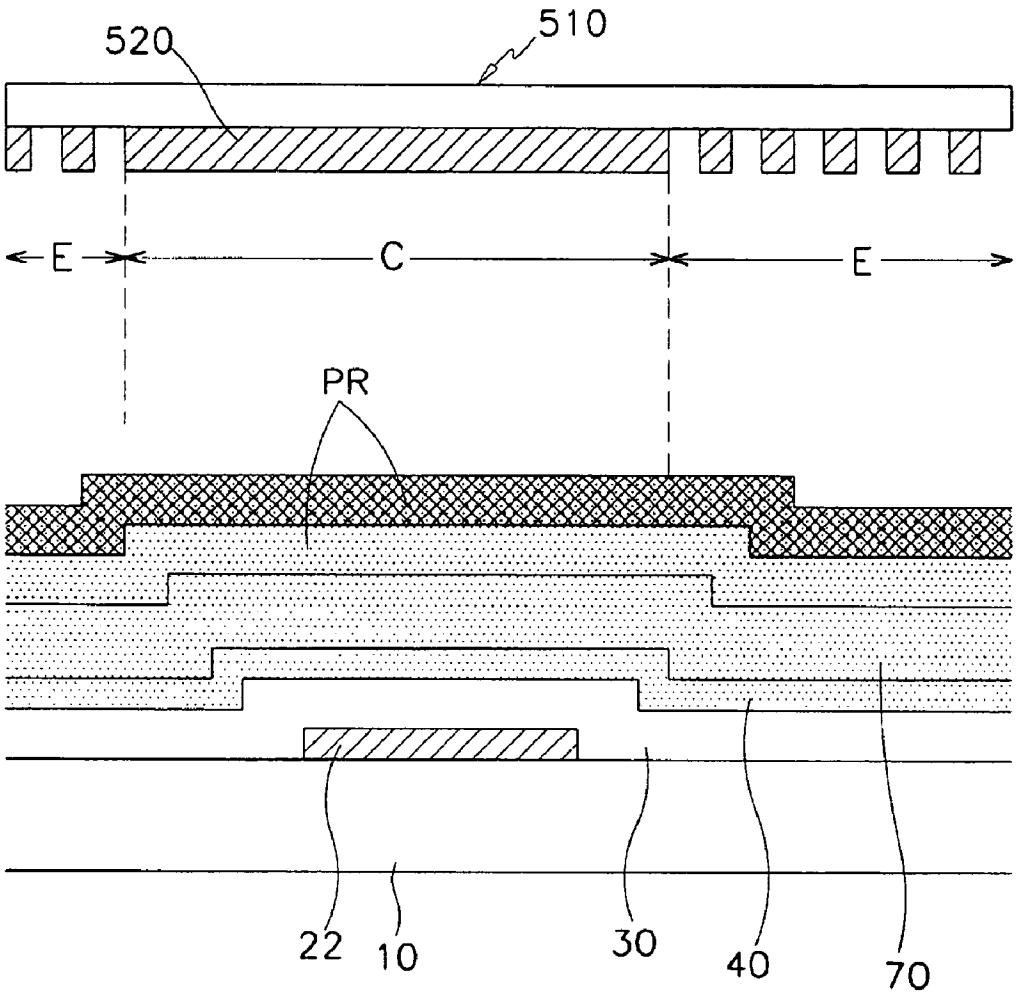

As shown in FIG. 30B, a photoresist film PR is coated onto the passivation layer 70. The photoresist film PR is exposed to light through a third mask. The light exposure to the photoresist film PR at the display area D is mainly different from that at the peripheral area P. That is, the exposed portions C and E of the photoresist film PR at the display area D over the drain electrode 66 and the pixel area react to light such that the molecules thereof are partially resolved to a predetermined depth from the surface while leaving the molecules thereunder intact. In contrast, the exposed portion B of the photoresist film PR at the peripheral area P over the gate pad 24 and the data pad 64 reacts to the light such that the molecules thereof are completely resolved to the bottom.

The exposed portion B of the photoresist film PR at the display area D between the pixel area and the data line 62 also reacts to the light such that the molecules thereof are completely resolved to the bottom.

In order to achieve such different light exposures, the light transmission of the third mask at the display area D and the peripheral area P should be controlled appropriately.

Figure 31:
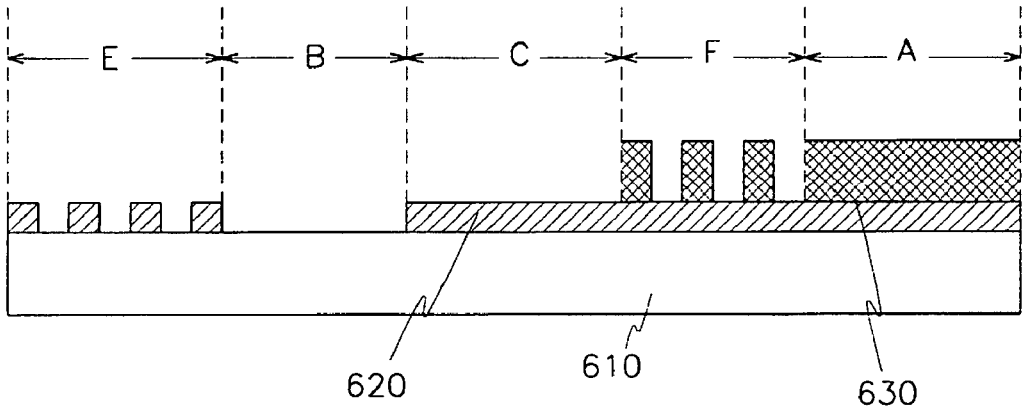
FIG. 31 is a cross sectional view of a mask for light-exposing the photoresist film shown in FIGS. 30B and 30C.

As shown in FIG. 31, the third mask for the above etching is formed with a transparent substrate 610. The transparent substrate 610 is sequentially overlaid with a light transmission control film 620 and an opaque film 630. It is preferable that the opaque film 630 has a light transmissivity of 3%, the light transmission control film 620 has a light transmissivity of 20-40%, and the transparent substrate 610 has a light transmissivity of 90% or more. The light transmission control film 620 and the opaque film 630 may be formed with materials having different light transmissivities, or with the same material while bearing a thickness different from each other. For instance, in the latter case, a chrome-based film having a thickness of 100-300 Å may be used for the light transmission control film 620, and a chrome-based film sufficiently thicker than the light transmission control film 620 for the opaque film 630.

According to the of light transmissivity, the mask can be divided into A, B, C and E portions corresponding to those portions of the photoresist film PR, and an additional F portion. The A portion has a lowest light transmissivity, and the B portion has a highest light transmissivity. The C portion has a light transmissivity between A and B. The E portion has a light transmissivity between B and C. The F portion has a light transmissivity between A and C. The substrate 610, the light transmission control film 620 and the opaque film 630 are all present at the A portion. Only the substrate 610 is present at the B portion. The substrate 610 and the light transmission control film 620 are present at the C portion. The substrate 610 and the light transmission control film 620 are present at the E portion, but the light transmission control film 620 at the E portion has a plurality of slit patterns. The substrate 610, the light transmission control film 620 and the opaque film 630 are all present at the F portion, but the opaque film 630 at the F portion has a plurality of slit patterns.

The slit patterns formed at the light transmission control film 620 and the opaque film 630 for the E and F portions have a width narrower than the resolution capability of the light source for the exposure such that the incident light diffracts and partially passes through the slit. Any patterns capable of inducing diffraction of the light may replace the slit patterns. For instance, mosaic patterns may be used for such purpose.

The reason for forming the slit or mosaic patterns at the required portions is to reduce the amount of light applied thereto. That is, when any metal component is present under the photoresist film to be exposed to light, the portion of the photoresist film under the metal component is applied with an increased amount of light due to the light reflected against the metal component so that the relevant portion of the photoresist film has a relatively small thickness compared to other portions. Furthermore, when the photoresist film is coated onto the protruded portion with the metal component, it is planarized to be placed on a plane with the photoresist film at other portions without the metal component so that the portion of the photoresist film over the metal component has a relatively small thickness compared to other portions. For these reasons, slit or mosaic patterns are formed at the mask portions corresponding to those of the photoresist film with the underlying metal layers to reduce the amount of light applied thereto. Alternatively, a colored photoresist film may be used for that purpose.

Figure 32A:
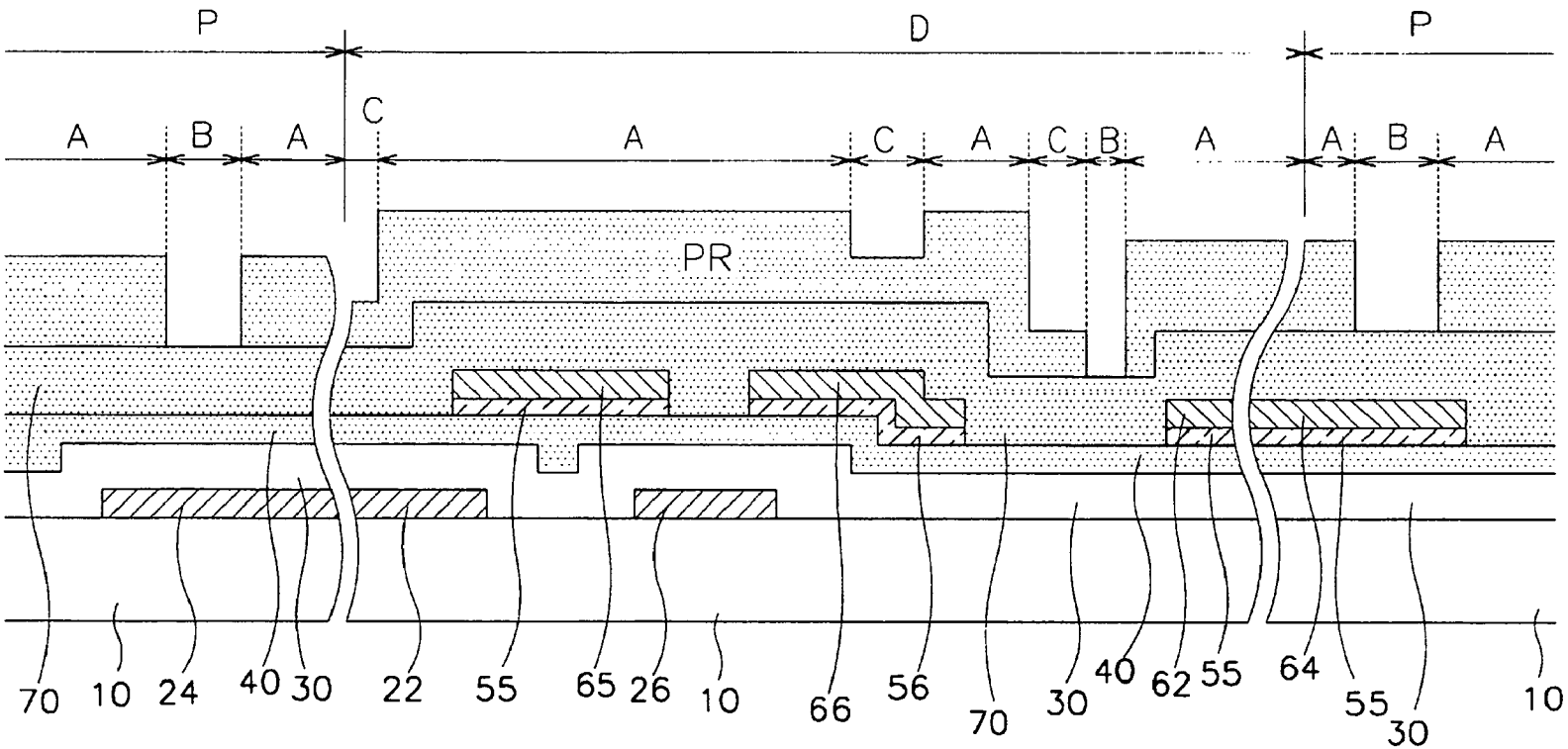
FIGS. 32A and 32B are cross sectional views of the TFT array substrate taken along the III-III' line and the IV-IV' line of FIG. 30A illustrating the step of developing the photoresist film.
Figure 32B:
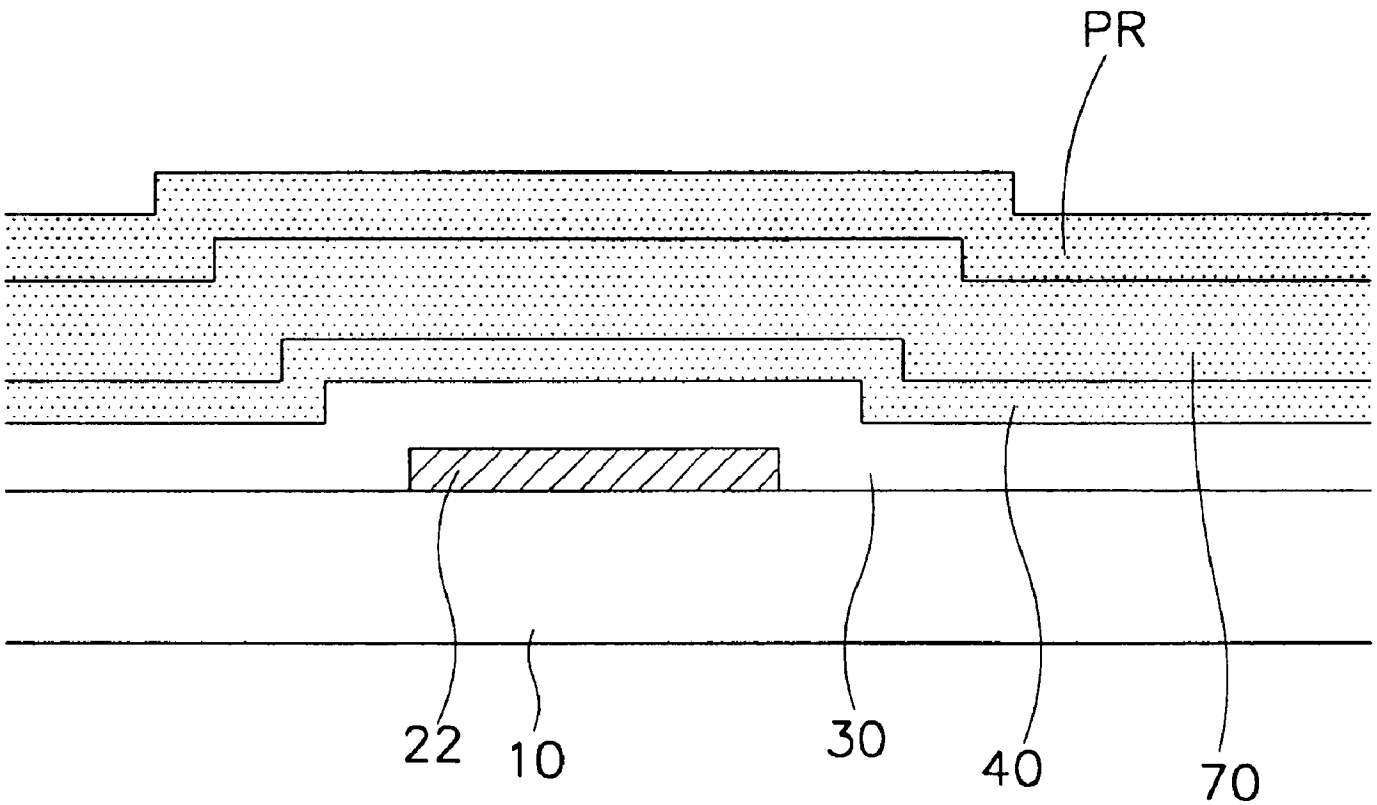

As shown in FIGS. 32A and 32B, when the photoresist film PR exposed through the third mask is developed, a photoresist pattern PR is formed. That is, the B portion of the photoresist film over the gate and data pads 24 and 64 is completely removed, whereas the C portion of the photoresist film over the drain electrode 66 and the pixel area is partially removed leaving a relatively small thickness. The B portion of the photoresist film between the pixel area and the data line 62 is completely removed. The remaining A portion of the photoresist film is left with a relatively large thickness.

Figure 33A:
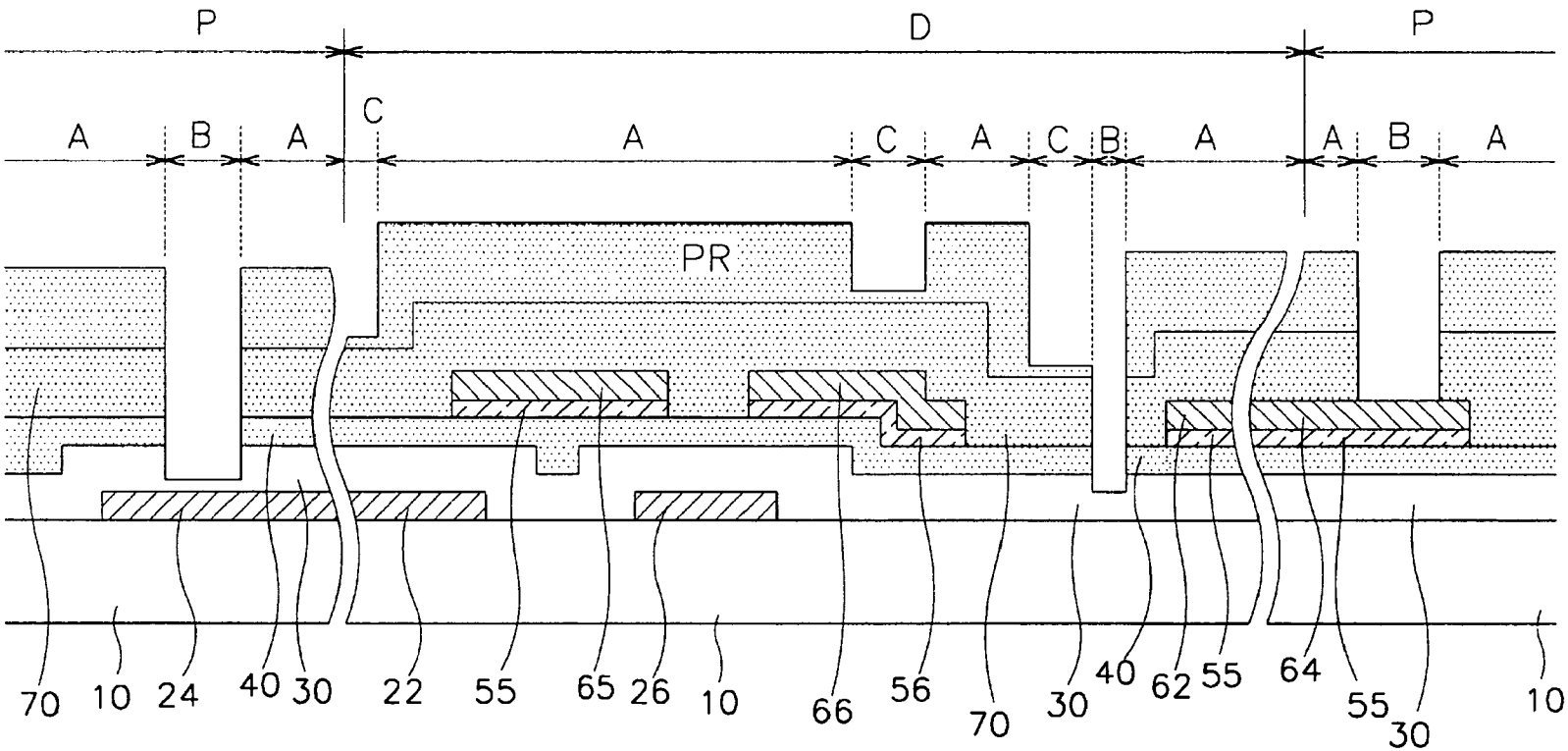
FIGS. 33A and 33B are cross sectional views of the TFT array substrate taken along the line and the IV-IV' line of FIG. 30A illustrating the step of etching some portions of a passivation layer.
Figure 33B:
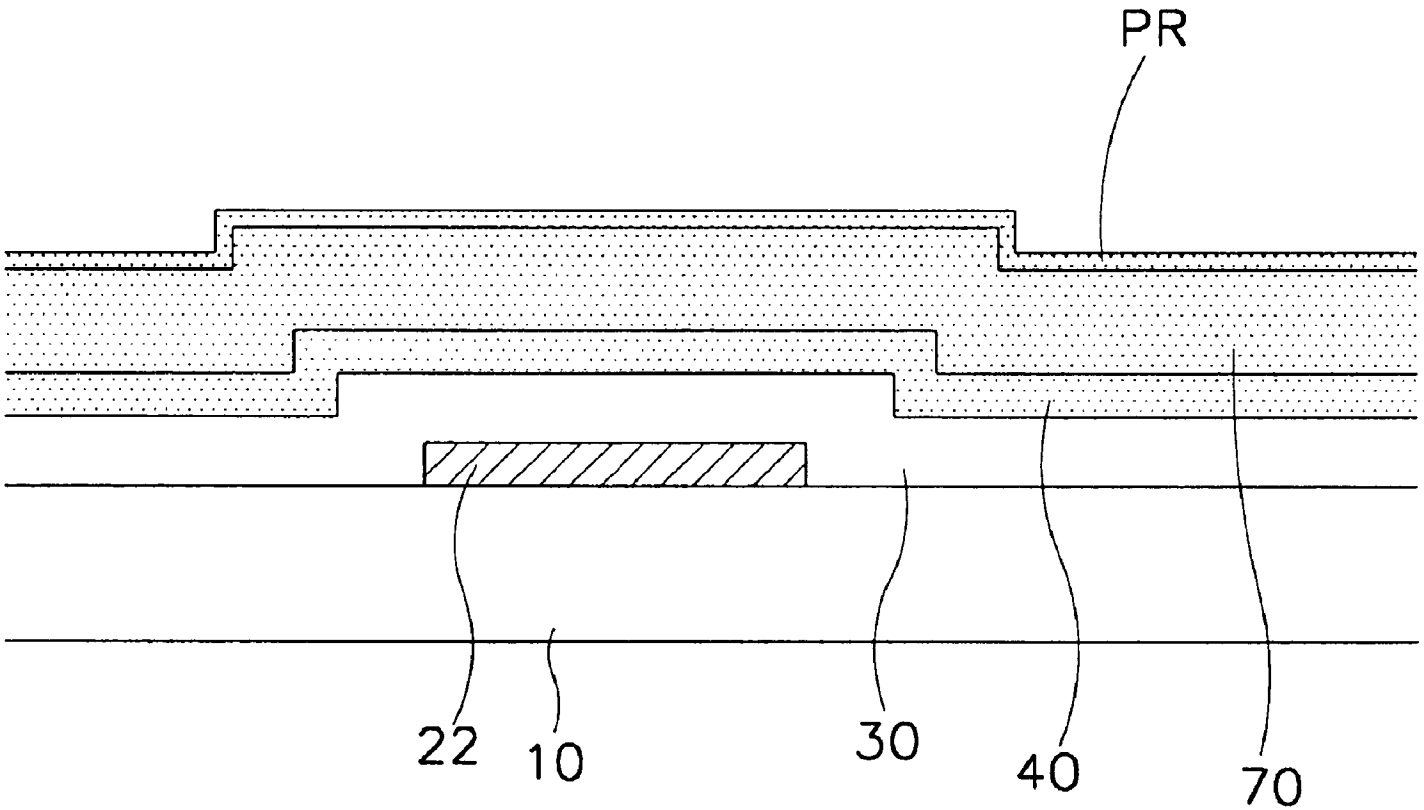

Thereafter, as shown in FIGS. 33A and 33B, the passivation layer 70 at the B portion over the data pad 64 is dry-etched while exposing the data pad 64, and the passivation layer 70 and the underlying semiconductor layer 40 and gate insulating layer 30 at the B portion over the gate pad 24 are dry-etched while partially leaving the gate insulating layer 30. At this time, the gate insulating layer 30 over the gate pad 24 may be completely removed while exposing the underlying gate pad 24. The passivation layer 70 and the gate insulating layer 30 at the B portion between the pixel area and the data line 62 are removed while partially leaving the gate insulating layer 30.

Figure 34A:
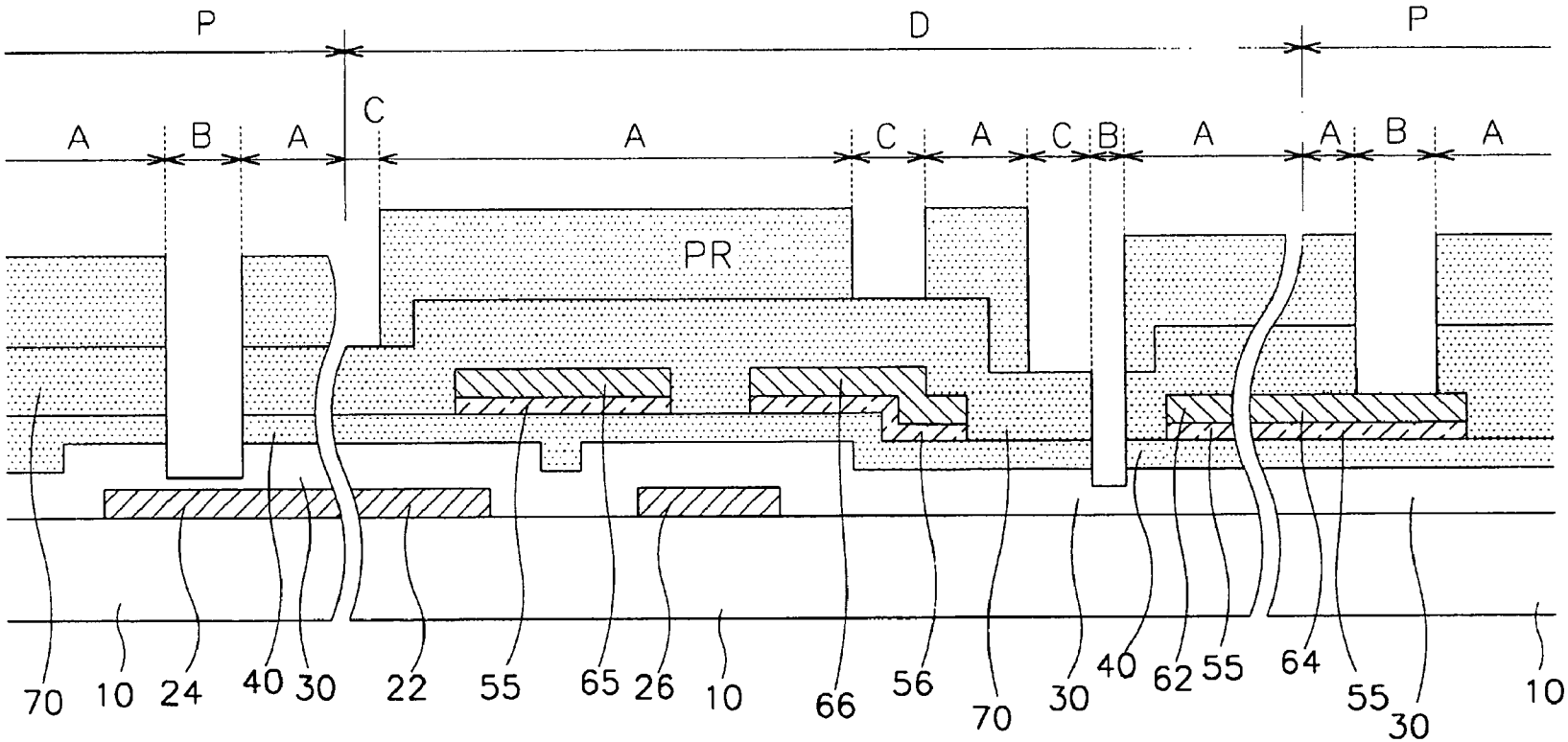
FIGS. 34A and 34B are cross sectional views of the TFT array substrate taken along the line and the IV-IV' line of FIG. 30A illustrating the step of ashing the etched portions of the passivation layer.
Figure 34B:
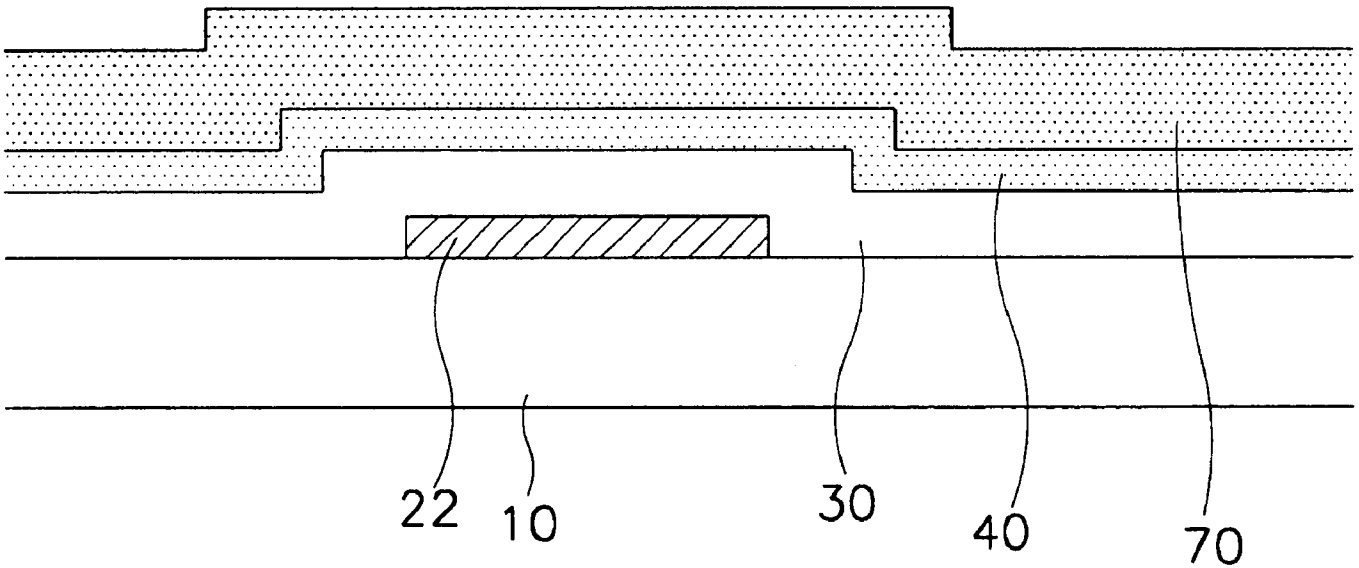

Thereafter, as shown in FIGS. 34A and 34B, the C portion of the photoresist film PR over the passivation layer 70 are removed through oxygen-based ashing.

Figure 35A:
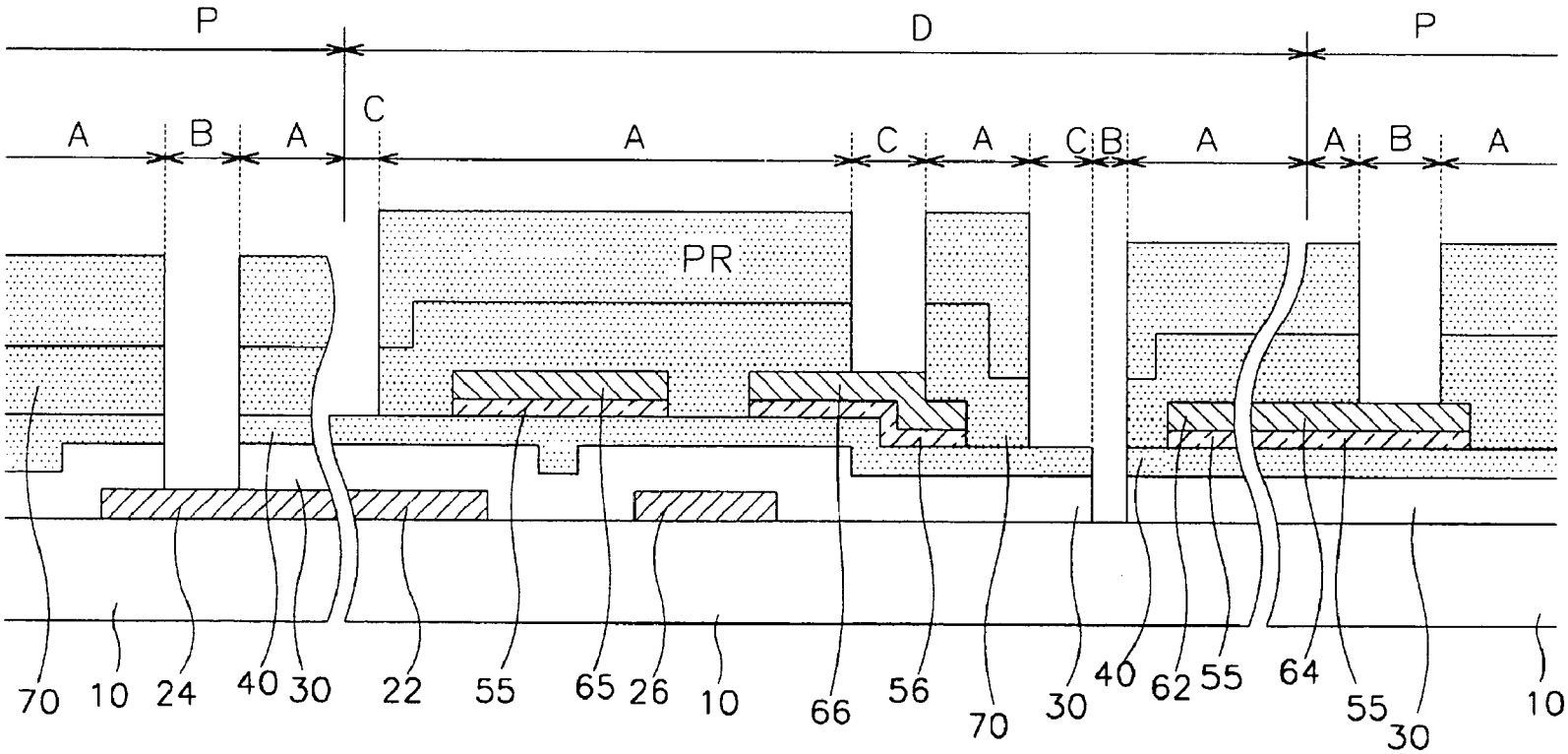
FIGS. 35A and 35B are cross sectional views of the TFT array substrate taken along the line III-III' line and the IV-IV' line of FIG. 30A illustrating the step of etching other portions of the passivation layer.
Figure 35B:
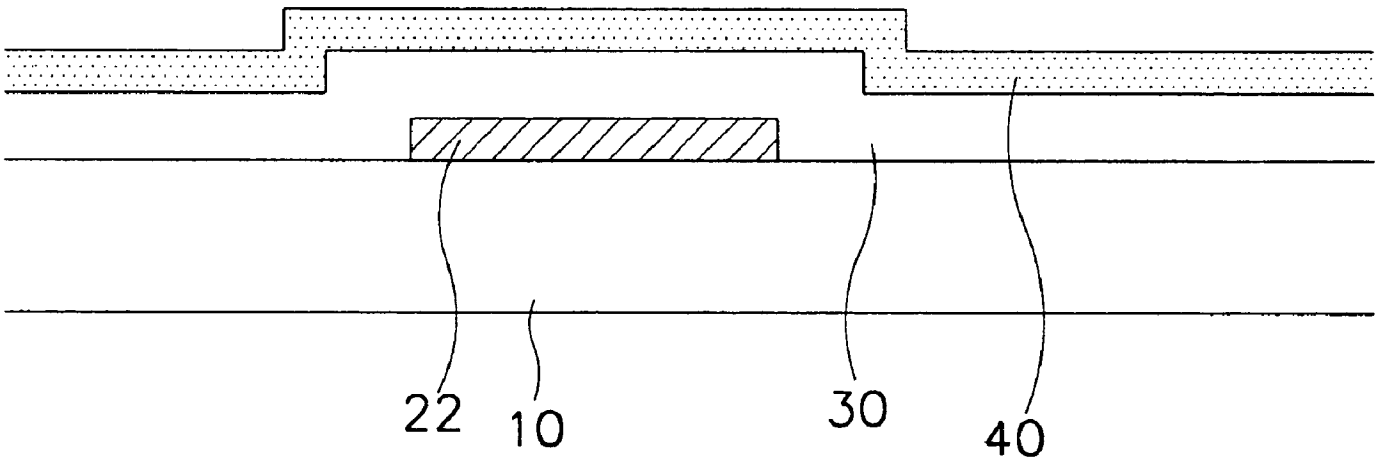

Then, as shown in FIGS. 35A and 35B, the passivation layer 70 over the drain electrode 66 and the pixel area, and the gate insulating layer 30 remaining over the gate pad 24 is removed by using the photoresist pattern PR for a mask. At this time, the gate insulating layer 30 remaining between the pixel area and the data line 62 is also removed.

Figure 36A:
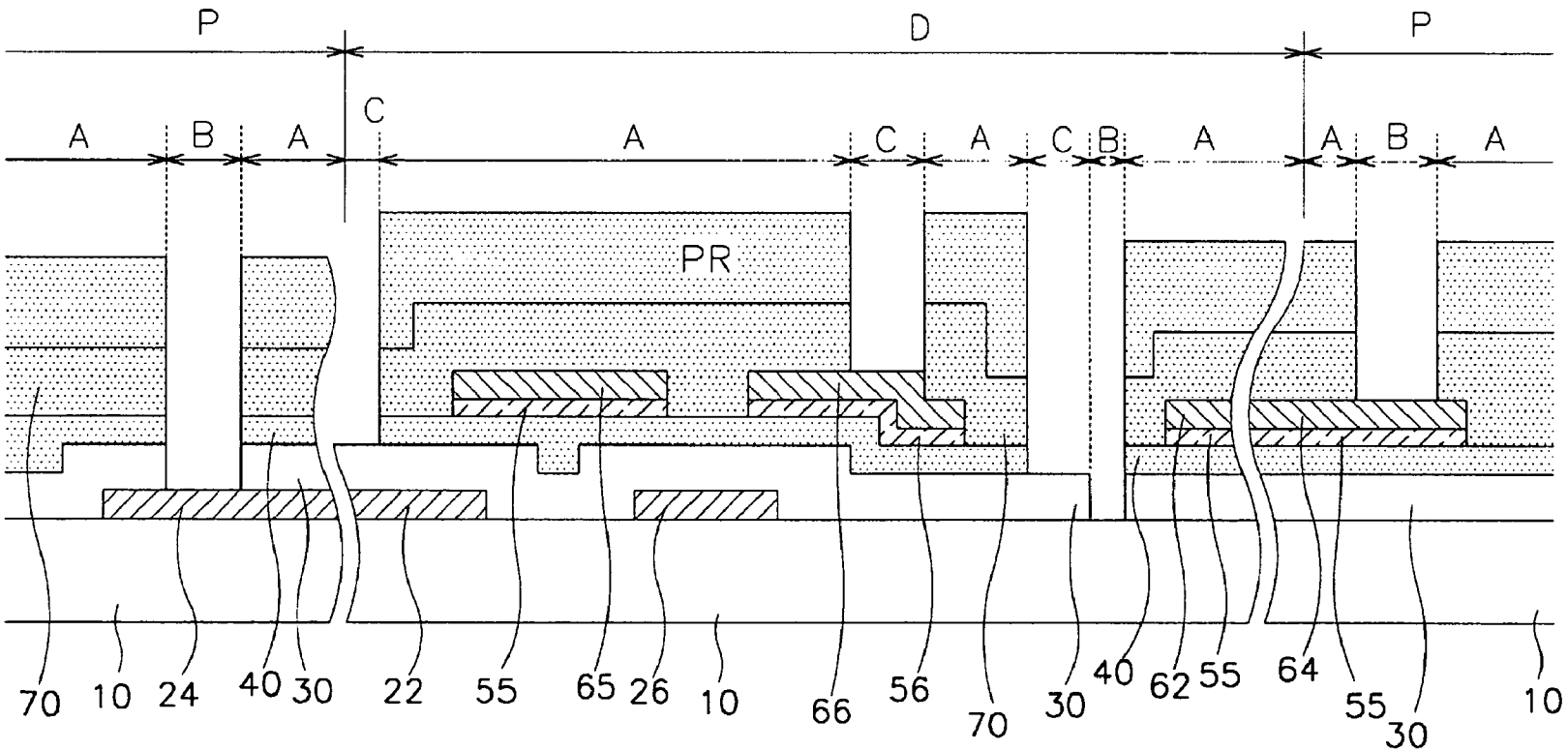
FIGS. 36A and 36B are cross sectional views of the TFT array substrate taken along the III-III' line and the IV-IV' line of FIG. 30A illustrating the step of forming a semiconductor pattern.
Figure 36B:
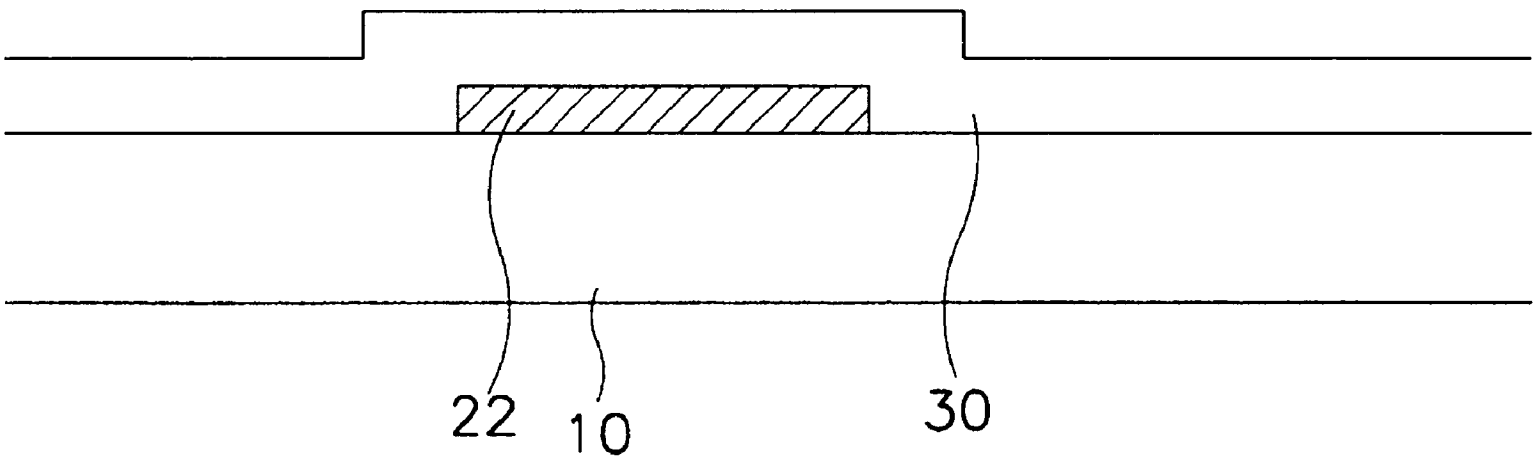

As shown in FIGS. 36A and 36B, the semiconductor layer 40 at the pixel area between the neighboring data lines 62 is removed by etching, thereby completing the semiconductor patterns 42.

Figure 37A:
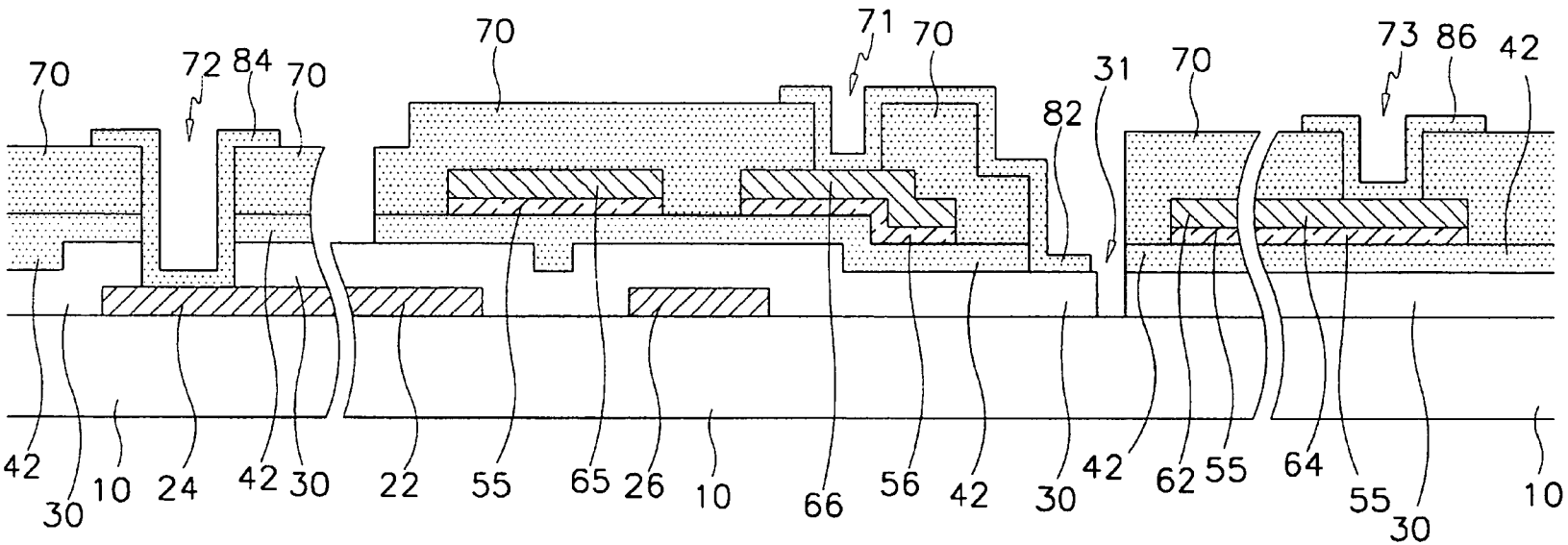
FIGS. 37A and 37B are cross sectional views of the TFT array substrate taken along the III-III' line and the IV-IV' line of FIG. 30A illustrating the step of forming a pixel electrode.
Figure 37B:
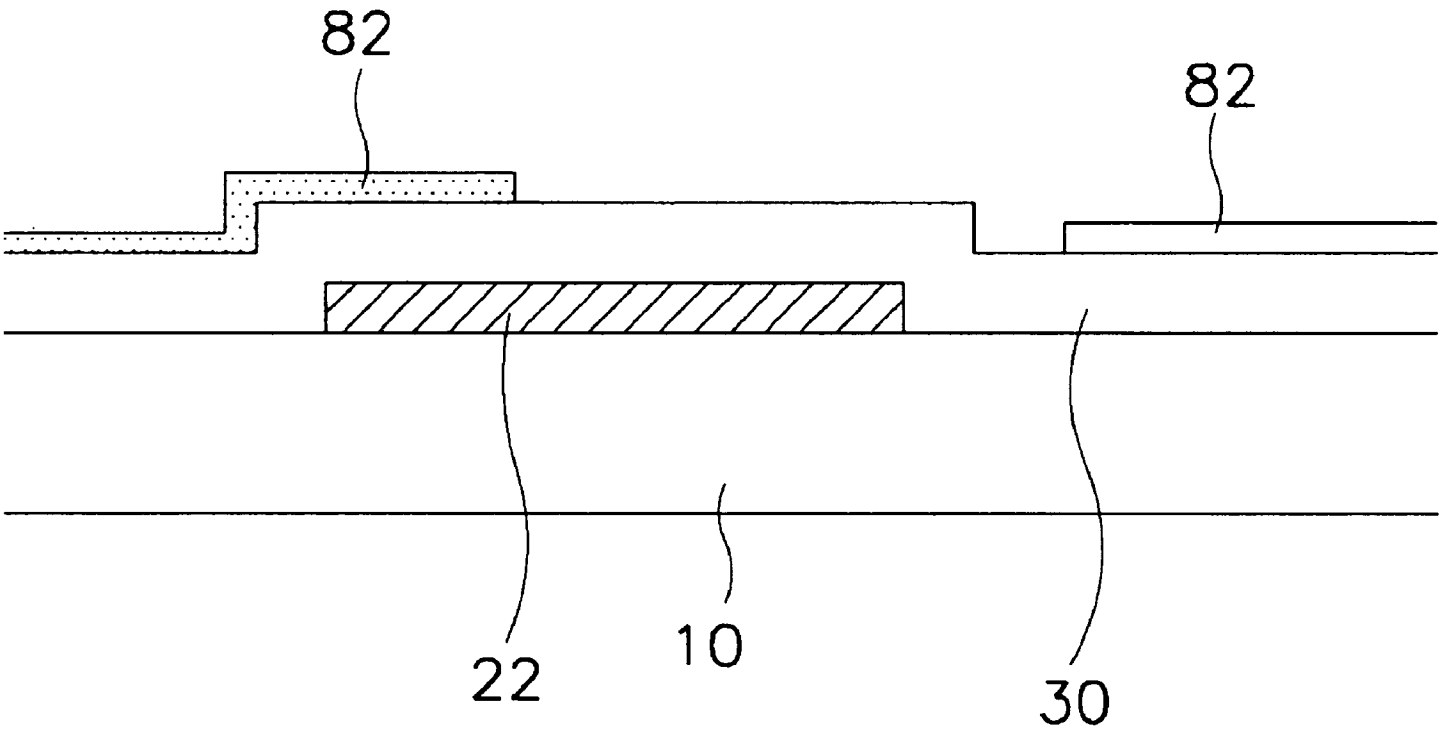

Thereafter, as shown in FIGS. 37A to 37B, the remaining photoresist film PR is removed. An ITO or IZO film is deposited onto the substrate 10, and etched through a fourth mask. Consequently, a pixel electrode 82, a supplemental gate pad 84 and a supplemental data pad 86 are formed while contacting the drain electrode 66, the gate pad 24, and the data pad 64, respectively. Furthermore, the section 31 is opened between the pixel electrode 82 and the data line 62 to electrically separate them.

As is in the third preferred embodiment, the passivation layer 70 may be replaced by a photosensitive organic layer. In this case, the separate steps of processing a photoresist film may be eliminated.

This preferred embodiment, in addition to the advantages related to the previous preferred embodiments, can minutely divide the light transmissivity of the third mask while simplifying the relevant processing steps. Furthermore, the possible short circuit between the pixel electrode 82 and the data line 62 can be prevented by forming the opening portion 31.

Fifth Preferred Embodiment

FIGS. 38A to 40 illustrate the steps of fabricating a TFT array substrate according to a fifth preferred embodiment of the present invention. In this preferred embodiment, other components and structures of the array substrate are similar to those related to the first preferred embodiment except that a single layered structure is used for the gate and data line assemblies, the conductive pattern 68 for the storage capacitor is eliminated, and a black matrix 90 and a color filter 100 are newly introduced.

In the method of fabricating the TFT array substrate according to the fifth preferred embodiment, the processing steps are similar to those related to the first preferred embodiment prior to the step of depositing the ITO or IZO film to form the pixel electrode 82.

Figure 38A:
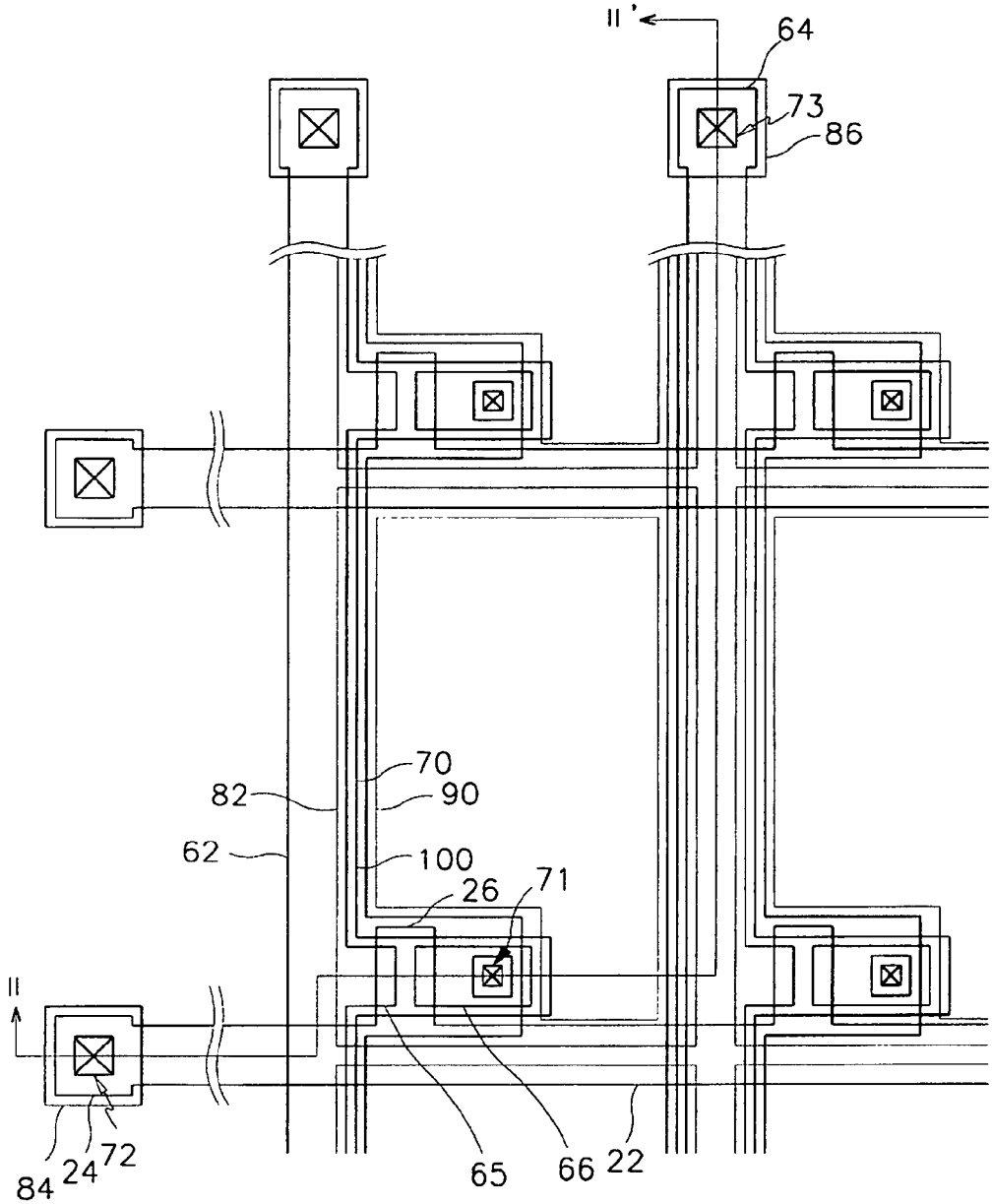
FIG. 38A is a plan view of a TFT array substrate according to a fifth preferred embodiment of the present invention.
Figure 38B:
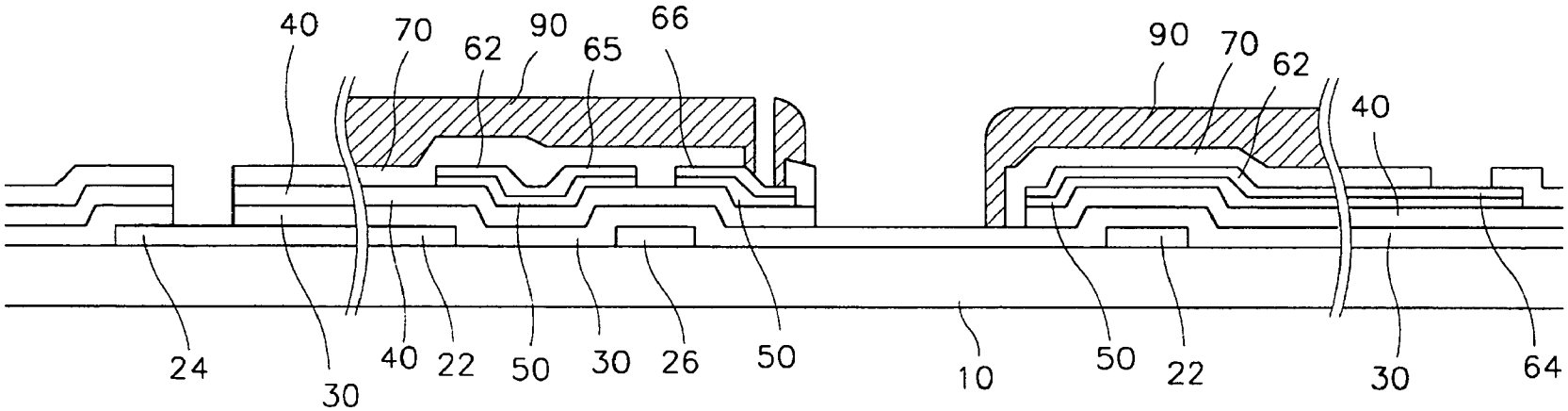
FIG. 38B is a cross sectional view of the TFT array substrate taken along the II-II' line of FIG. 38A illustrating the step of forming a black matrix pattern.

As shown in FIG. 38B, after the semiconductor layer 40 is etched to form a semiconductor pattern and the remaining photoresist film PR is removed, an organic black matrix layer is deposited onto the substrate 10, and etched through a fourth mask to form a black matrix pattern 90. Alternatively, a black photoresist film may be used to form such a black matrix pattern.

Figure 39:
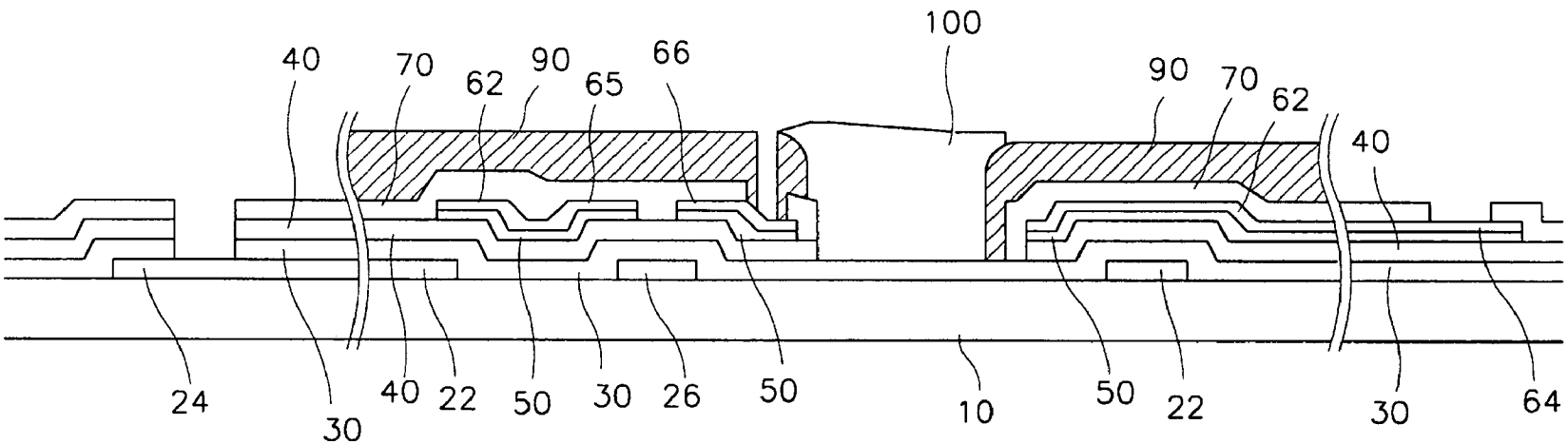
FIG. 39 is a cross sectional view of the TFT array substrate taken along the II-II' line of FIG. 38A illustrating the step of forming a color filter.

Then, as shown in FIG. 39, a color filter 100 of red, green and blue is formed at the pixel area between the neighboring data lines 62. The color filter 100 formed through screen printing, or photolithography using fifth to seventh masks.

Figure 40:
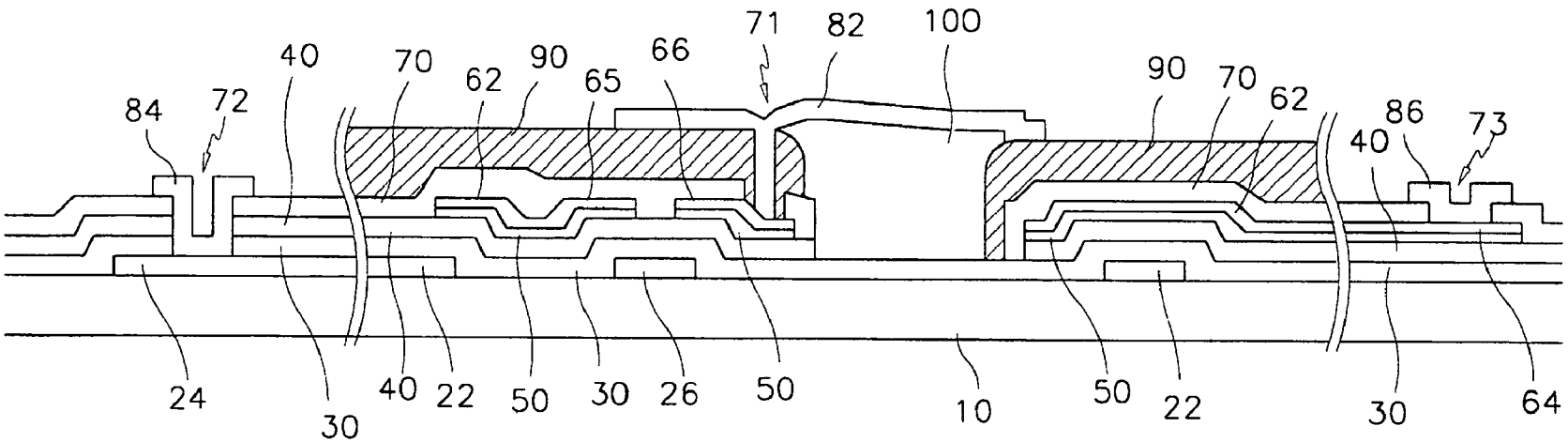
FIG. 40 is a cross sectional view of the TFT array substrate taken along the II-II' line of FIG. 38A illustrating the step of forming a pixel electrode.

Finally, as shown in FIG. 40, an ITO film having a thickness of 400-500 Å is deposited onto the substrate 10, and etched through a fifth or eighth mask. Consequently, a pixel electrode 82, a supplemental gate pad 84, and a supplemental data pad 86 are completed.

In the resulting TFT array substrate, the black matrix 90 formed at the display area is to prevent light leakage due to the electric field present at the periphery of the pixel electrode 82. The portion of the black matrix 90 over the gate line 22 may be removed. The black matrix 90 has a narrow contact window for exposing the drain electrode 66 that is positioned at the center of the contact window 71 passing through the passivation layer 70.

The color filter 100 formed on the gate insulating layer 30 between the neighboring data lines 62 is alternated with the colors of red, green and blue. Such a color filter may be formed per one pixel area or per one longitudinal area defined by the neighboring data lines 62. The color filter 100 may be extended over the contact window 71. In this case, the color filter 100 should also have a separate contact window for interconnecting the drain electrode 66 and the pixel electrode 82. Such a contact window for the color filter 100 should have a size of at least 4 μ×4 μ because the color filter 100 is usually formed by using a large size aligner-based light exposure.

The above-mentioned structure can simplify the steps of fabricating the TFT array substrate. Furthermore, the black matrix 90 and the color filter 100 formed on the TFT array substrate, the marginal error when combining the TFT array substrate and the color filter substrate need not be considered, and can improve the opening ratio of the device.

Sixth Preferred Embodiment

Figure 41A:
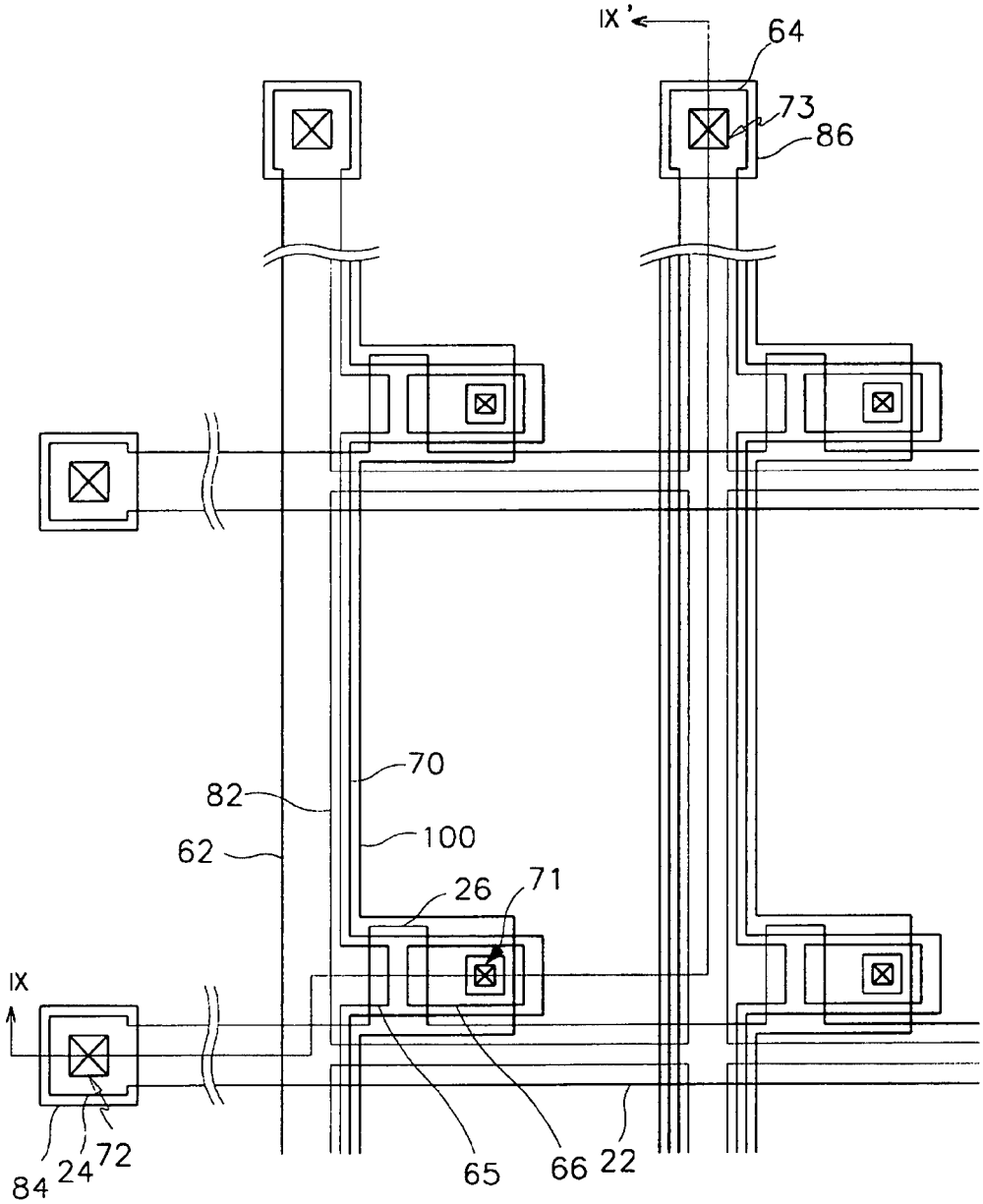
FIG. 41A is a plan view of a TFT array substrate according to a sixth preferred embodiment of the present invention.
Figure 41B:
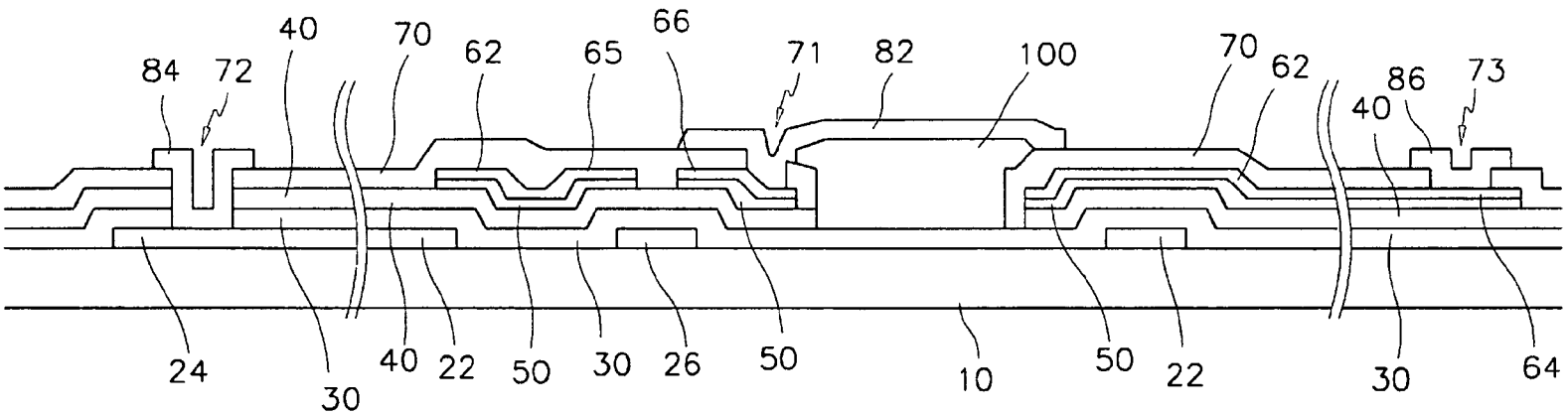
FIG. 41B is a cross sectional view of the TFT array substrate taken along the IX-IX' line of FIG. 41A.

FIGS. 41A and 41B illustrate the structure of a TFT array substrate according to a sixth preferred embodiment of the present invention. In this preferred embodiment, other components and structures of the TFT array substrate are similar to those related to the fifth preferred embodiment except that the black matrix 90 is absent. That is, among the processing steps for fabricating the TFT array substrate, the step of forming a black matrix pattern 90 is eliminated.

In the above structure, the opening ratio of the device is reduced compared to that related to the fifth preferred embodiment, but the black matrix to be formed with a common electrode at the opposite substrate can reduce the resistance of the common electrode.

Seventh Preferred Embodiment

FIGS. 42A to 45 illustrate the steps of fabricating a TFT array substrate according to a seventh preferred embodiment of the present invention. In this preferred embodiment, other components and structures of the TFT array substrate are the similar to those related to the sixth preferred embodiment except that the passivation layer 70 has a new structure. For such a purpose, the passivation layer 70 is formed after the formation of the semiconductor pattern.

Figure 42A:
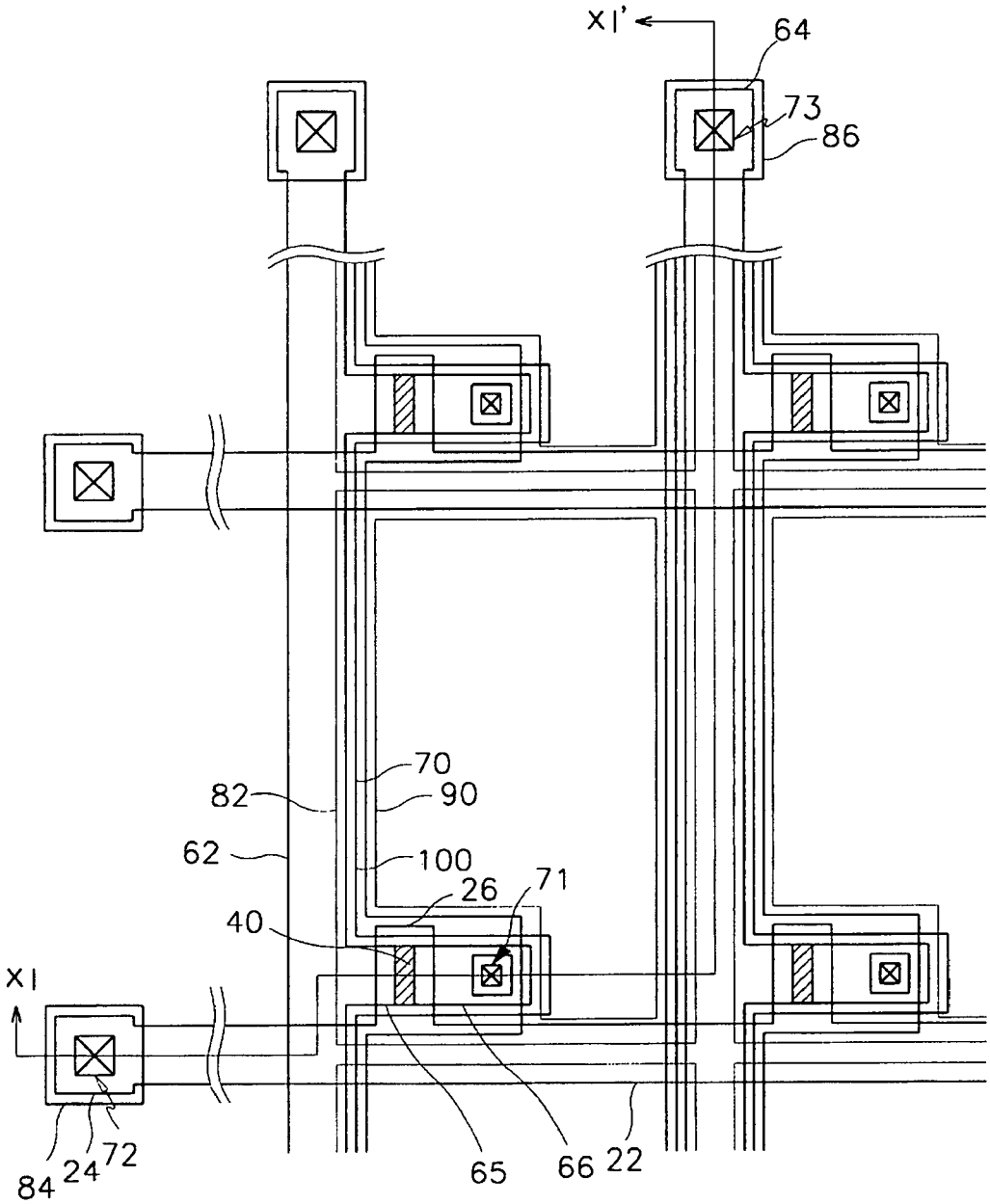
FIG. 42A is a plan view of a TFT array substrate according to a seventh preferred embodiment of the present invention.
Figure 42B:
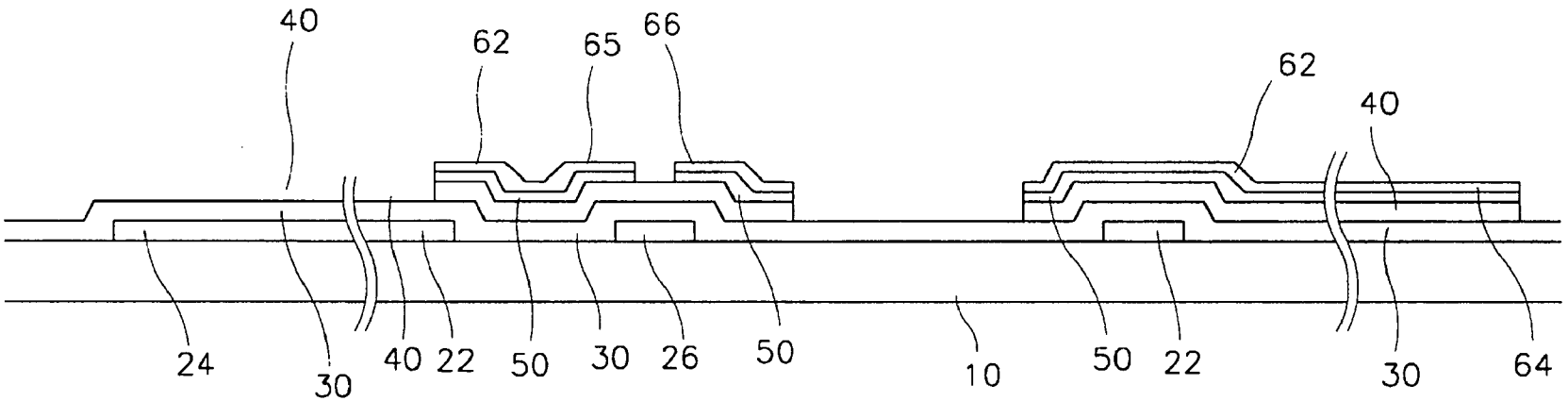
FIG. 42B is a cross sectional view of the TFT array substrate taken along the XI-XI' line of FIG. 42A illustrating the step of forming a semiconductor pattern.

As shown in FIG. 42B, a gate line assembly 22, 24 and 26 is first formed at the substrate 10 by using a first mask. A gate insulating layer, a semiconductor layer, an ohmic contact layer, and a metal data line layer are then sequentially deposited onto the substrate 10. The metal data line layer, the ohmic contact layer and the semiconductor layer are etched through a second mask to form the desired patterns. The semiconductor pattern 40, the ohmic contact pattern 50, and the data line assemblies 62 to 66 have similar shapes except that the semiconductor pattern 40 is present at the channel region between the source and drain electrodes 65 and 66.

Figure 43:
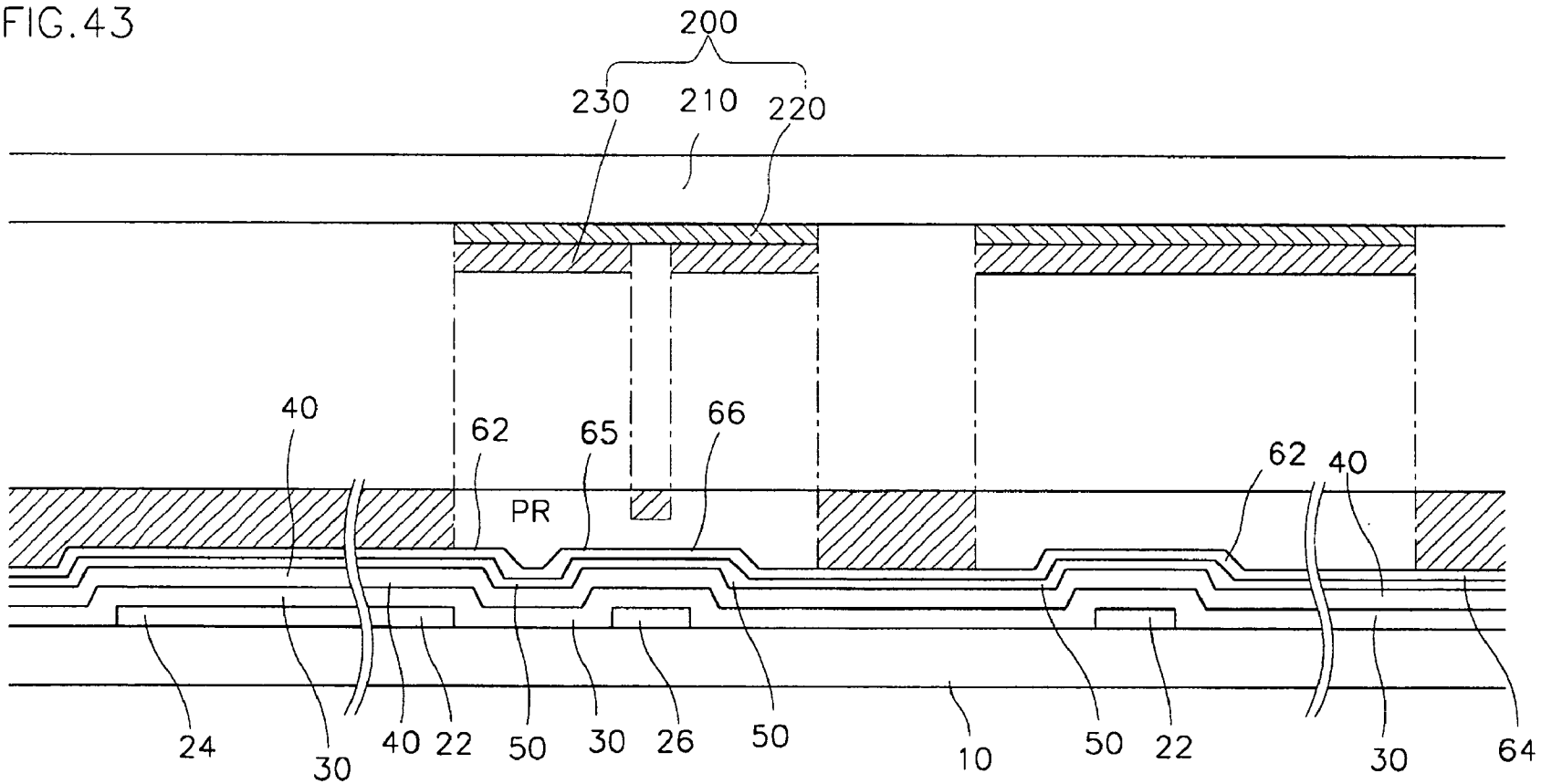
FIG. 43 is a cross sectional view of the TFT array substrate taken along the XI-XI' line of FIG. 42A specifically illustrating the step of forming the semiconductor pattern.

A single mask 2011 is used for the second mask. The mask 200 has a transparent substrate 210 overlaid with a light transmission control film 220 and an opaque film 230. As shown in FIG. 43, the portion of the mask corresponding to the data line assemblies 62 to 66 is provided with the light transmission control film 220 and the opaque film 230, and the light transmissivity thereof is set to be 3% or less. The portion of the mask corresponding to the semiconductor pattern 40 between the source and drain electrodes 65 and 66 is provided with the light transmission control film 220, and the light transmissivity thereof is established to be 20 to 40%. The remaining portion of the mask is provided only with the transparent substrate 210, and the light transmissivity thereof is established to be 90% or more.

In the above etching process using the second mask, a photoresist film PR is first coated onto the substrate 10, and exposed to light through the second mask. The photoresist film is then developed to thereby form a photoresist pattern.

Thereafter, the metal data line layer exposed through the photoresist pattern is etched while exposing the underlying ohmic contact layer. In this process, either a wet-etching technique or a dry-etching technique can be used, preferably under the condition that only the metal data line layer is etched while leaving the photoresist pattern. However, in the case of the dry etching, since it is difficult to make such a condition, the photoresist pattern may be allowed to be etched altogether.

When the metal data line layer is formed of Cr, wet etching is preferably used, with a solution of $CeNHO_3$. When the metal data line layer is formed of Mo or MoW, dry etching is preferably used, with a mixture of $CF_4$ and HCl or $CF_4$ and $O_2$.

As a result, the patterns 62 to 66 of the data line assembly are formed while exposing the underlying ohmic contact layer, except that the source and drain electrodes 65 and 66 are not yet separated from each other.

Thereafter, the exposed ohmic contact layer and the underlying semiconductor layer are removed through dry etching. Then, the photoresist film remaining over the channel portion of the metal data line layer between the source and drain electrode portions is removed.

The channel portion of the metal data line layer and the underlying ohmic contact layer are removed through etching. At this time, both the metal data line layer and the ohmic contact layer may be dry etched. Alternatively, dry etching the ohmic contact layer is dry etched and the metal data line layer is wet etched. In the former case, the etching is preferably performed under the condition that the etching selection ratio with respect to the metal layer and the contact layer is high. The reason is that when the etching selection ratio is low, it becomes difficult to find the final etching point and the thickness of the semiconductor pattern to be left at the channel region cannot be controlled in an appropriate manner. In the latter case, the side portions of the metal layer being etched with the wet etching method are etched while leaving those portions of the contact layer being etched by the dry etching, rendering stepped portions. The mixture of $CF_4$ and $O_2$ is preferably used to form the semiconductor pattern 40 with a uniform thickness.

In this way, the source electrode 65 and the drain electrode 66 are separated from each other, completing the patterns 62 to 66 of the data line assembly and the underlying ohmic contact pattern 50.

Thereafter, the photoresist film remaining over the data line assembly is removed.

Figure 44:
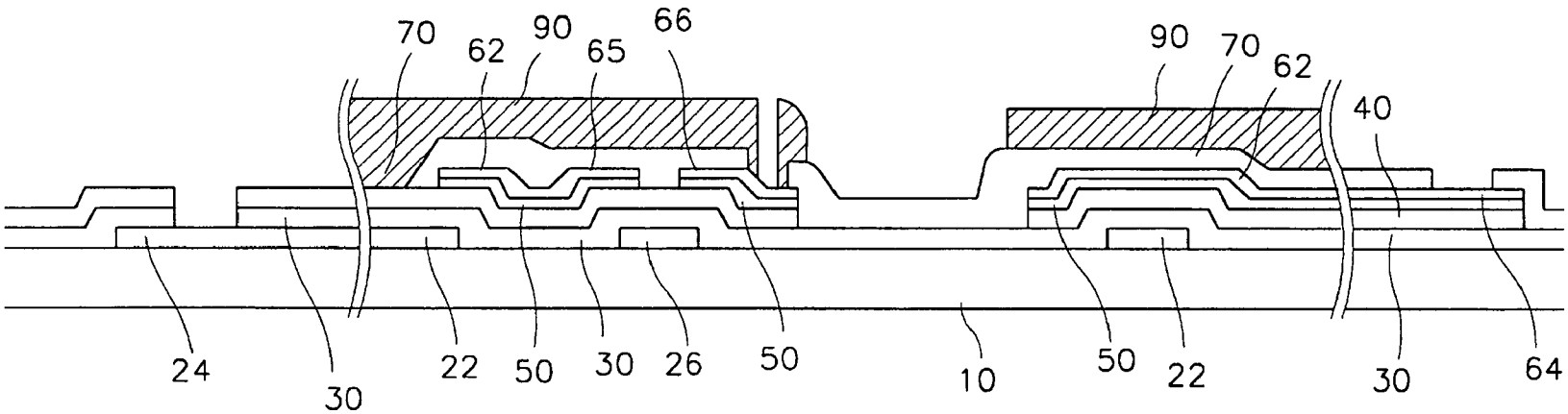
FIG. 44 is a cross sectional view of the TFT array substrate taken along the XI-XI' line of FIG. 42A illustrating the step of forming a black matrix pattern.

As shown in FIG. 44, a passivation layer 70 is deposited onto the substrate 10 with the data line assembly, and etched through a third mask to form contact windows 71 to 73. An organic black matrix layer is then deposited onto the substrate 10, and etched through a fourth mask to form a black matrix pattern 90.

Figure 45:
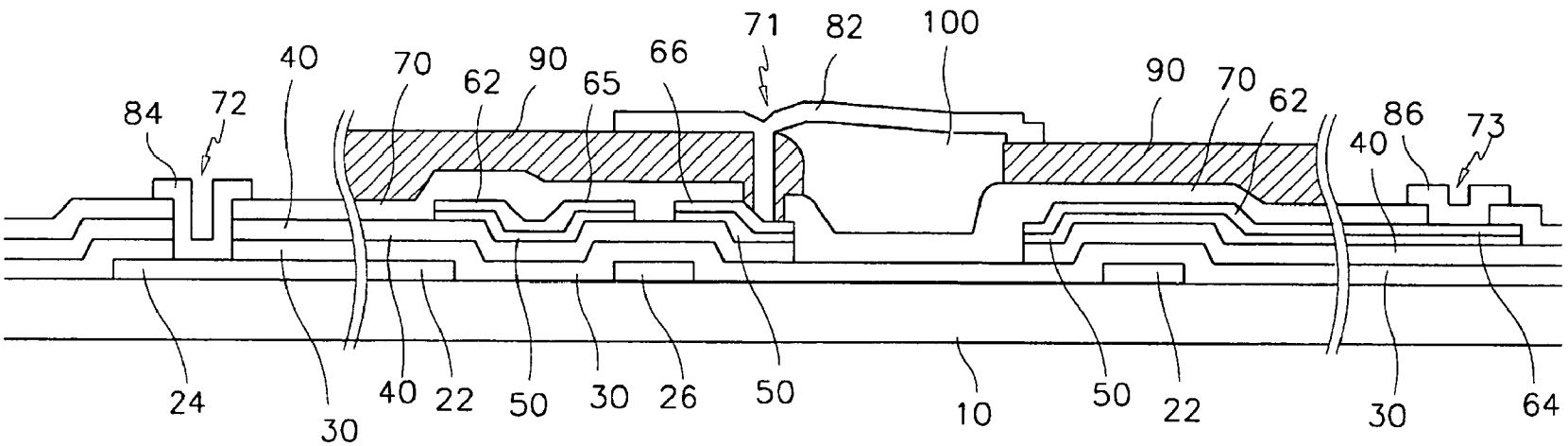
FIG. 45 is a cross sectional view of the TFT array substrate taken along the XI-XI' line of FIG. 42A illustrating the step of forming a color filter and a pixel electrode.

Finally, as shown in FIG. 45, a color filter 100 as well as a pixel electrode 82, a subsidiary gate pad 84 and a subsidiary data pad 86 are formed at the substrate 10 in the similar way as in the sixth preferred embodiment.

As is in the previous preferred embodiment, the above structure or technique can reduce the number of the processing steps, and enhance the opening ratio of the device.

Eighth Preferred Embodiment

Figure 46A:
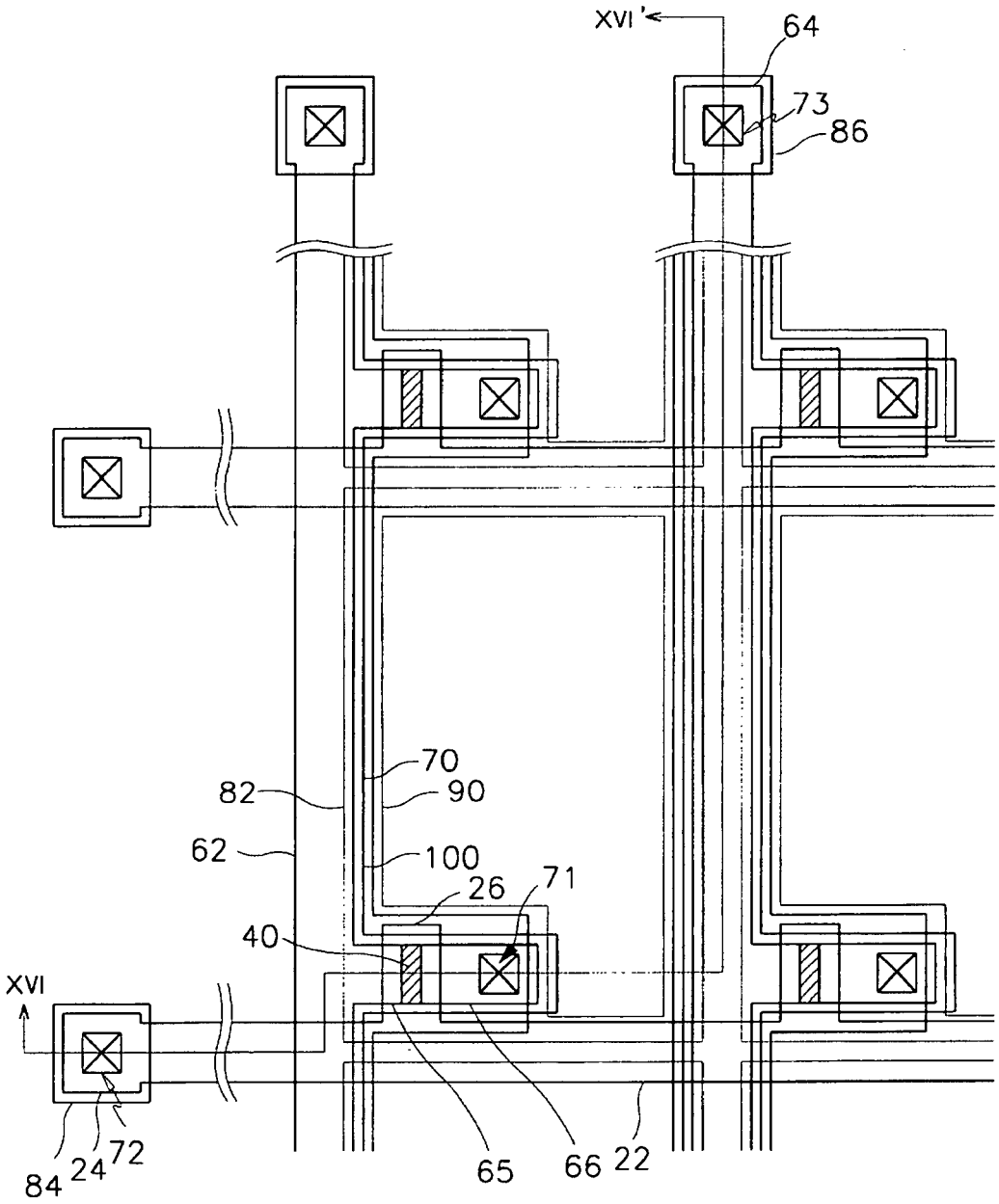
FIG. 46A is a plan view of a TFT array substrate according to an eighth preferred embodiment of the present invention.
Figure 46B:
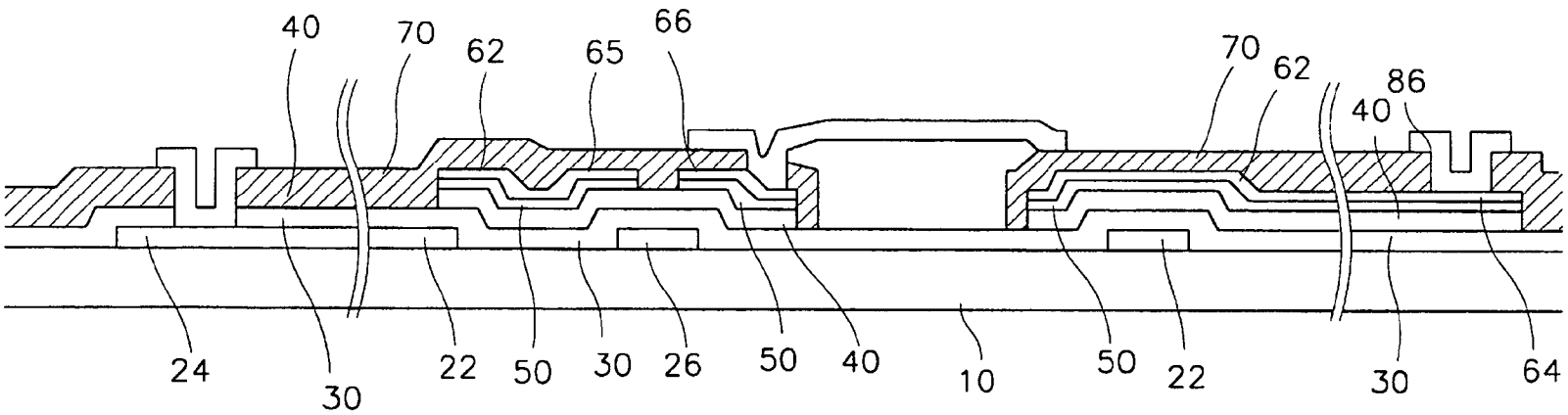
FIG. 46B is a cross sectional view of the TFT array substrate taken along the XVI-XVI' line of FIG. 46A.

FIGS. 46A and 46B illustrate the structure of a TFT array substrate according to an eighth preferred embodiment of the present invention. In this preferred embodiment, other components and structures of the TFT array substrate are the same as those related to the seventh preferred embodiment except that the passivation layer 70 is absent. The black matrix pattern 90 also serves the function of the passivation layer 70. The black matrix pattern 90 is extended over the peripheral portion P. As the extension of the black matrix pattern 99 over the peripheral portion P may be realized also in the seventh preferred embodiment, only the step of processing the passivation layer 70 is skipped in this preferred embodiment. In this way, the number of processing steps can be reduced.

Ninth Preferred Embodiment

Figure 47A:
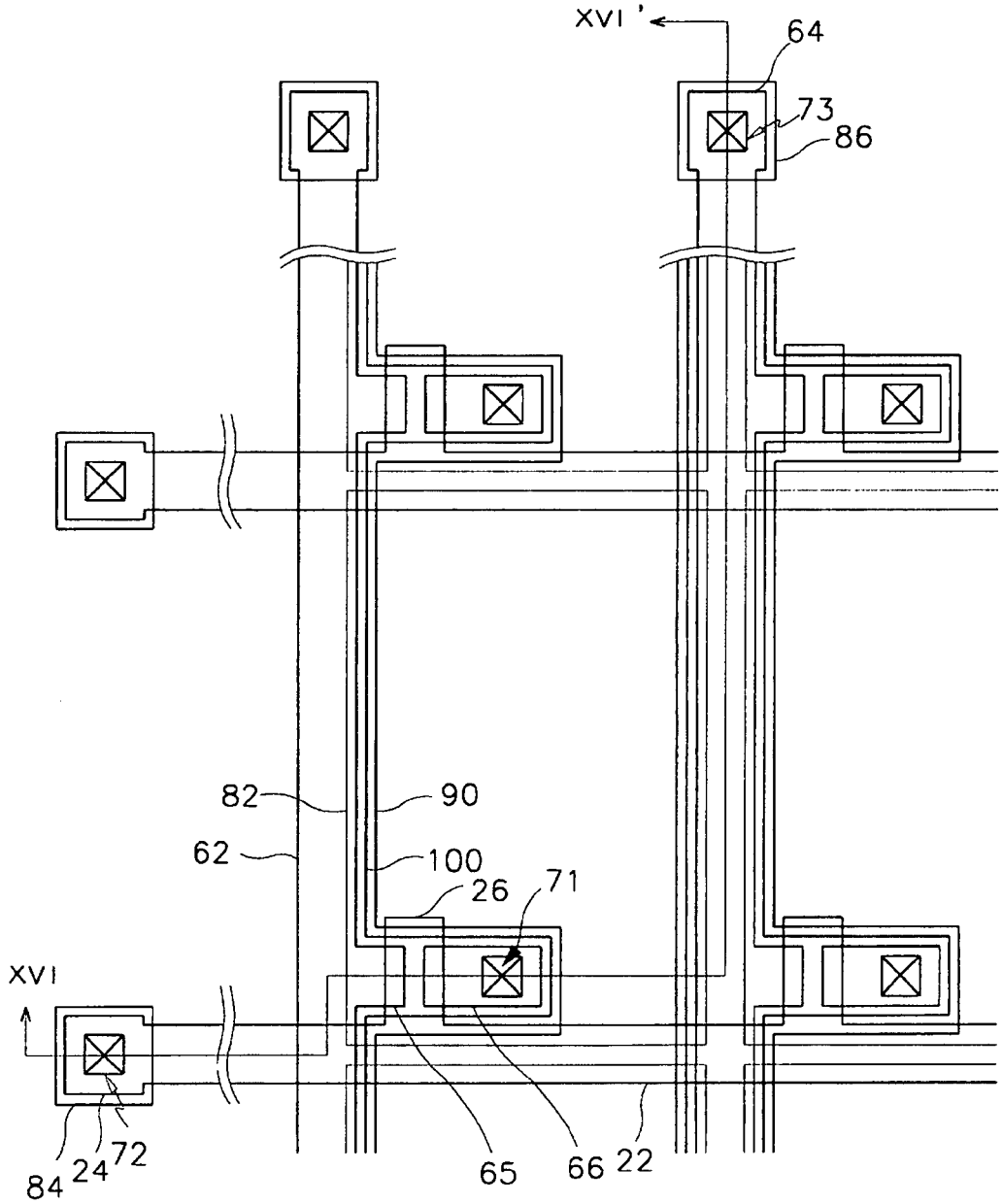
FIG. 47A is a plan view of a TFT array substrate according to a ninth preferred embodiment of the present invention.
Figure 47B:
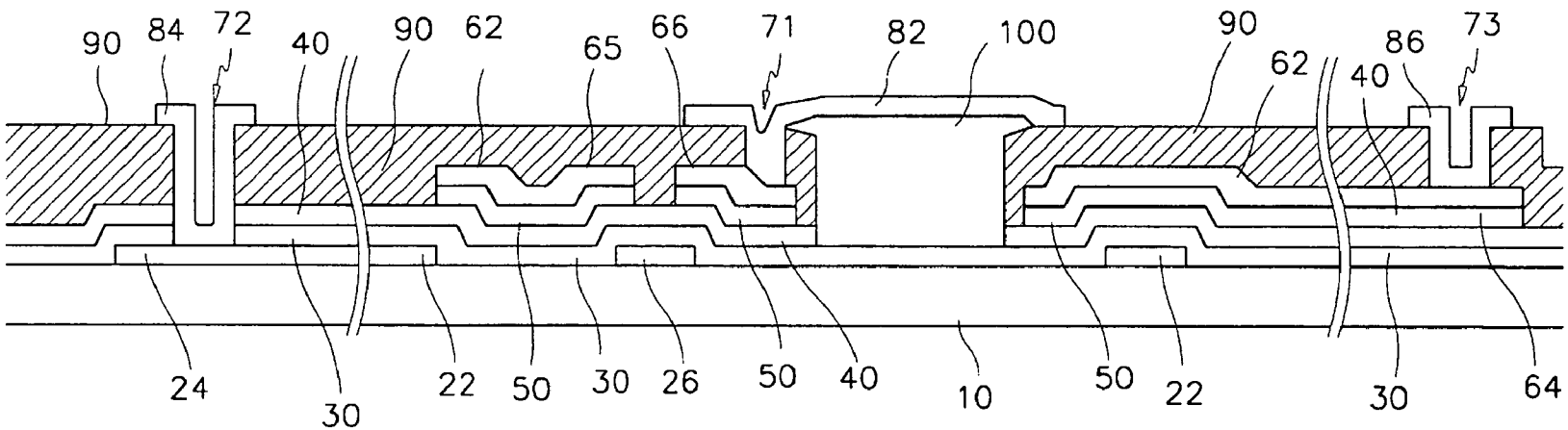
FIG. 47B is a cross sectional view of the TFT array substrate taken along the XVI-XVI' line of FIG. 47A.

FIGS. 47A and 47B illustrate the structure of a TFT array substrate according to a ninth preferred embodiment of the present invention. In this preferred embodiment, other components and structures of the TFT array substrate are similar to those related to the fifth preferred embodiment except that the passivation layer 70 is absent, and the black matrix 90 serves the function of the passivation layer 70. Therefore, the separate step of forming the passivation layer 70 is eliminated in this preferred embodiment.

The black matrix 90 is formed with a photosensitive material containing black pigments. In the etching process based on the third mask, the photosensitive matrix layer is itself exposed to light through the third mask without forming the photosensitive film PR, and developed to thereby form the black matrix pattern 90. In the subsequent processing steps, the black matrix pattern 90 serves the function of the photoresist pattern PR.

In the above structure, the number of the processing steps can be reduced.

Tenth Preferred Embodiment

Figure 48A:
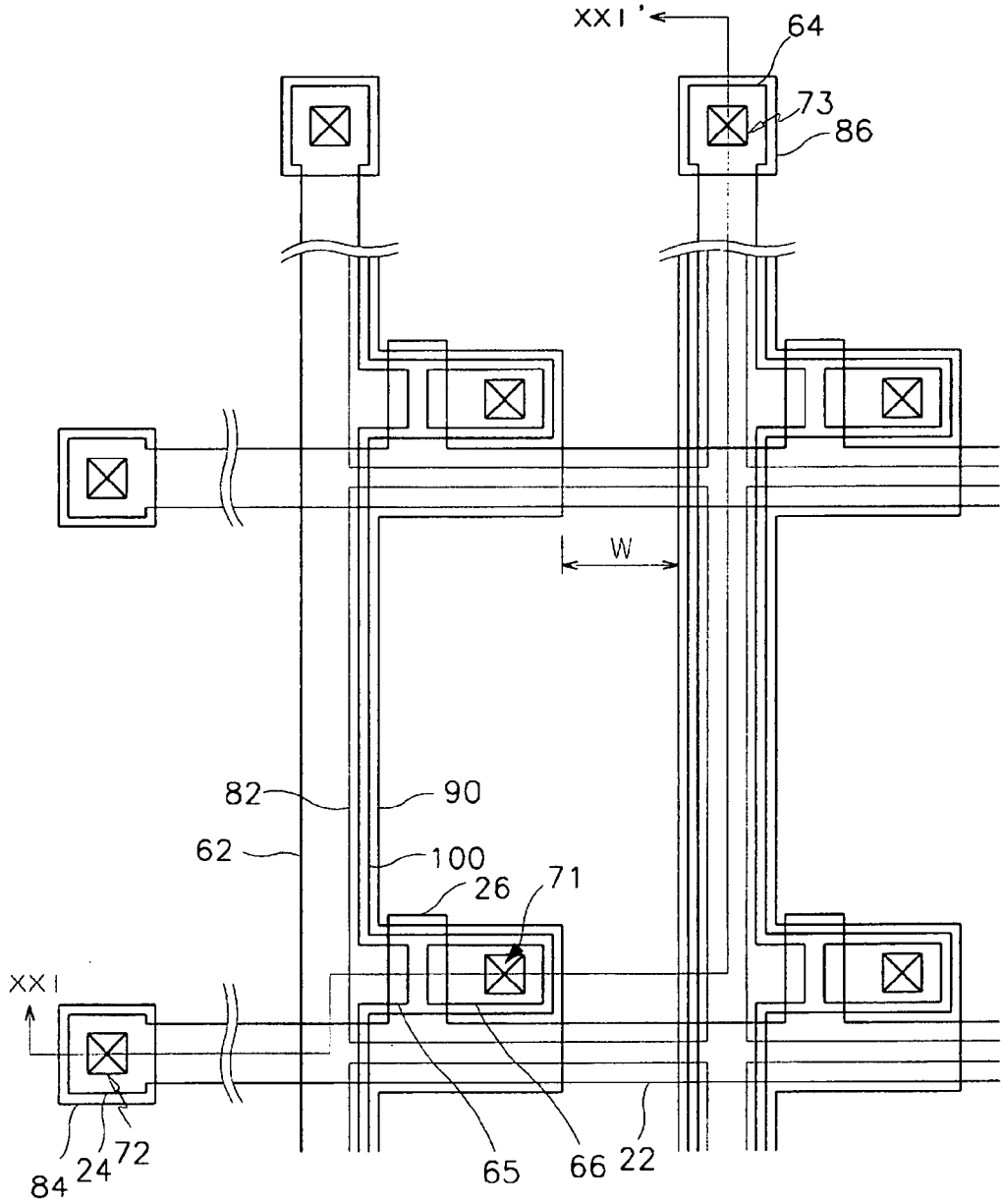
FIG. 48A is a plan view of a TFT array substrate according to a tenth preferred embodiment of the present invention.
Figure 48B:
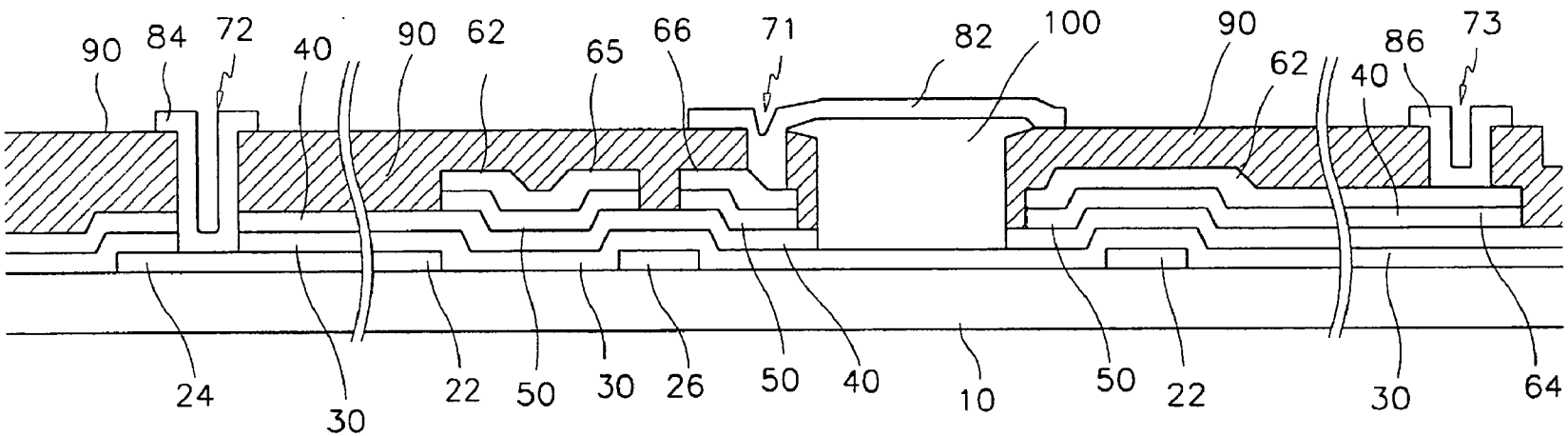
FIG. 48B is a cross sectional view of the TFT array substrate taken along the XXI-XXI' line of FIG. 48A.

FIGS. 48A and 48B illustrate the structure of a TFT array substrate according to a tenth preferred embodiment of the present invention. In this preferred embodiment, other components and structures of the TFT array substrate are similar to those related to the ninth preferred embodiment except that the gate insulating layer 30 has a different pattern. That is, the portion of the gate insulating layer at the pixel area between the neighboring data lines is removed such that it has the same shape as that of the semiconductor pattern 40. Therefore, the color filter 100 is positioned directly over the substrate 10 and the gate line 22. The width of the removed portion of the gate insulating layer at the pixel area should be 1 μ or more. That is, the opening width of the semiconductor layer 40 should reach 1 μ or more. The opening prevents the currents from leaking between the neighboring data lines 62 via the semiconductor layer 40.

In the method of fabricating the TFT array substrate according to the tenth preferred embodiment, the processing steps are similar to those related to the ninth preferred embodiment except that a usual mask with only a transparent portion and an opaque portion is used for the third mask. That is, the transparent portion of the mask corresponds to the portion of the target film to be removed, while the opaque portion corresponds to the portion of the target film to remain.

When the photosensitive black matrix pattern 90 is formed by using the usual mask, and the underlying semiconductor layer and gate insulating layer are etched by using the photosensitive black matrix pattern 90 as a photoresist pattern PR, exposing the portions of the substrate 10 and the gate line 21 between the neighboring data lines 62 to the outside, and the contact windows 71 to 73 are also formed.

Thereafter, a color filter 100 as well as a pixel electrode 82, a supplemental gate pad 84 and a supplemental data pad 86 are formed in the similar way as in the ninth preferred embodiment. The color filter 100 completely covers the exposed portion of the gate line 22 to insulate the gate line 22 from the pixel electrode 82.

The above mentioned structure can reduce, the number of processing steps even with the usual mask having only transparent and opaque portions.

As described above, the TFT array substrate of the present invention can be fabricated with simplified processing steps while achieving good performance characteristics.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

[1. A thin film transistor array substrate for a liquid crystal display, comprising:

an insulating substrate;

a gate line assembly formed on the substrate, the gate line assembly having a plurality of gate lines proceeding in the horizontal direction, gate electrodes branched from the gate lines, and gate pads connected to end portions of the gate lines;

a gate insulating layer formed on the gate line assembly, the gate insulating layer having a first contact window exposing the gate pad, and an opening portion partially exposing the insulating substrate;

a semiconductor pattern formed on the gate insulating layer;

a contact pattern formed on the semiconductor pattern;

a data line assembly formed on the contact pattern with substantially the same outline as the contact pattern, the data line assembly having data lines proceeding in the vertical direction, source electrodes branched from the data lines, data pads connected to end portions of the data lines, and drain electrodes positioned opposite to the source electrodes with respect to the gate electrode while being separated from the source electrodes;

a passivation layer formed on the data line assembly with the same outline as the semiconductor pattern except at portions of a second contact window exposing the data pad and a third contact window exposing the drain electrode;

a pixel electrode formed at a pixel area defined by the neighboring gate and data lines, the pixel electrode being electrically connected to the drain electrode through the third contact window while partially contacting the gate insulating layer; and subsidiary gate and data pads contacting the gate and data pads, respectively.]

[2. The thin film transistor array substrate of claim 1 wherein the opening portion exposes the substrate between the pixel electrode and the neighboring data line.]

[3. The thin film transistor array substrate of claim 1 wherein the third contact window exposing the drain electrode is extended such that the borderline of the drain electrode is exposed to the outside.]

[4. A thin film transistor array substrate for a liquid crystal display comprising:

an insulating substrate;

a gate line assembly formed on the substrate, the gate line assembly having a plurality of gate lines proceeding in the horizontal direction, gate electrodes branched from the gate lines, and gate pads connected to end portions of the gate lines;

a first insulating layer formed on the gate line assembly, the first insulating layer having a first contact window exposing the gate pad;

a semiconductor pattern longitudinally formed on the first insulating layer in the vertical direction;

a data line assembly formed on the semiconductor pattern, the data line assembly having data lines proceeding in the vertical direction, source electrodes branched from the data lines, data pads connected to end portions of the data lines, and drain electrodes positioned opposite to the source electrodes with respect to the gate electrodes while being separated from the source electrodes;

a second insulating layer formed on the data line assembly with the same outline as the semiconductor pattern, the second insulating layer having a second contact window exposing the gate pad through the first contact window, a third contact window exposing the data pad, and a fourth contact window exposing the drain electrode;

a color filter formed at a pixel area defined by the neighboring gate and data lines; and a pixel electrode formed on the color filter, the pixel electrode being connected to the drain electrode through the fourth contact window.]

[5. The thin film transistor array substrate of claim 4 further comprising a contact layer formed between the semiconductor pattern and the data line assembly with the same outline as the data line assembly.]

[6. The thin film transistor array substrate of claim 4 further comprising supplemental gate pads and supplemental data pads covering the gate pad and the data pad, respectively.]

[7. The thin film transistor array substrate of claim 4 further comprising a photo-interceptive organic pattern formed between the data line assembly and the overlying passivation layer.]

[8. The thin film transistor array substrate of claim 7 wherein the photo-interceptive pattern is provided with a fifth contact window exposing the drain electrode through the fourth contact window, the fifth contact window being narrower than the fourth contact window.]

[9. The thin film transistor array substrate of claim 4 wherein the second insulating layer is formed of a photo-interceptive organic layer.]

[10. The thin film transistor array substrate of claim 9 wherein the first insulating layer has the same outline as the semiconductor pattern.]

[11. The thin film transistor array substrate of claim 10 wherein the opening width of the semiconductor pattern between the neighboring data lines is 1 μ or more.]

[12. A thin film transistor array substrate for a liquid crystal display, comprising:

an insulating substrate;

a gate line assembly formed on the substrate, the gate line assembly having a plurality of gate lines proceeding in the horizontal direction, gate electrodes branched from the gate lines, and gate pads connected to end portions of the gate lines;

a first insulating layer formed on the gate line assembly, the first insulating layer having a first contact window exposing the gate pad;

a semiconductor pattern longitudinally formed on the first insulating layer in the vertical direction;

a data line assembly formed on the semiconductor pattern, the data line assembly having data lines proceeding in the vertical direction, source electrodes branched from the data lines, data pads connected to end portions of the data lines, and drain electrodes positioned opposite to the source electrodes with respect to the gate electrodes while being separated from the source electrodes, the data line assembly substantially having the same outline as the semiconductor pattern except the portion placed between the source electrode and the drain electrode;

a second insulating layer formed on the data line assembly, the second insulating layer having a second contact window exposing the first contact window, a third contact window exposing the data pad, and a fourth contact window exposing the drain electrode;

a color filter formed on the passivation layer at a pixel area defined by the neighboring gate and data lines; and a pixel electrode formed on the color filter, the pixel electrode being connected to the drain electrode through the fourth contact window.]

[13. The thin film transistor array substrate of claim 12 further comprising a contact layer formed between the semiconductor pattern and the data line assembly substantially with the same outline as the data line assembly.]

[14. The thin film transistor array substrate of claim 12 further comprising supplemental gate pads and supplemental data pads covering the gate pads and the data pads, respectively.]

[15. The thin film transistor array substrate of claim 12 further comprising a photo-interceptive organic pattern formed on the passivation layer over the data line assembly and the gate line assembly.]

[16. The thin film transistor array substrate of claim 15 wherein the photo-interceptive organic pattern is provided with a fifth contact window exposing the drain electrode through the fourth contact window, the fifth contact window being narrower than the fourth contact window.]

[17. The thin film transistor array substrate of claim 12 wherein the second insulating layer is formed with a photo-interceptive organic layer.]

*18. A thin film transistor array substrate for a liquid crystal display comprising:*

*an insulating substrate;*

*a gate line assembly formed on the substrate, the gate line assembly having a plurality of gate lines proceeding in the horizontal direction, gate electrodes connected to the gate lines, and gate pads connected to end portions of the gate lines;*

*a first insulating layer formed on the gate line assembly, the first insulating layer having a first contact window exposing the gate pad, and an opening portion partially exposing the insulating substrate;*

*a semiconductor pattern formed on the first insulating layer;*

*a contact pattern formed on the semiconductor pattern;*

*a data line assembly formed on the contact pattern with substantially the same outline as the contact pattern, the data line assembly having data lines proceeding in the vertical direction, source electrodes connected to the data lines, data pads connected to end portions of the data lines, and drain electrodes positioned opposite to the source electrodes with respect to the gate electrode while being separated from the source electrodes;*

*a second insulating layer formed on the data line assembly with the same outline as the semiconductor pattern except at portions of a second contact window exposing the data pad and a third contact window exposing the drain electrode;*

*a pixel electrode formed at a pixel area defined by the neighboring gate and data lines, the pixel electrode being electrically connected to the drain electrode through the third contact window while partially contacting the first insulating layer; and*

*subsidiary gate and data pads contacting the gate and data pads, respectively.*

*19. The thin film transistor array substrate of claim 18, wherein the third contact window exposing the drain electrode is extended such that the borderline of the drain electrode is exposed to the outside.*

*20. The thin film transistor array substrate of claim 18, wherein the second insulating layer is the photo-interceptive layer.*

*21. The thin film transistor array substrate of claim 18, wherein the data line assembly has a double layered structure comprising a first metallic layer and a second metallic layer, and*

*the first metallic layer is formed of at least one of a material such as Cr, Mo or Mo alloy, and the second metallic layer is formed of at least one of a material such as Al or Al alloy, and*

*the pixel electrode is electrically connected to the first metallic layer.*

* * * * *